(12) United States Patent
Francis et al.

(10) Patent No.: US 10,124,312 B2
(45) Date of Patent: Nov. 13, 2018

(54) METHOD FOR DIRECT PHOTOPATTERNING OF MOLECULES ON SURFACES

(71) Applicant: The Regents of the University of California, Oakland, CA (US)

(72) Inventors: Matthew B. B. Francis, Berkeley, CA (US); Amy A. Twite, Berkeley, CA (US); Kareem El Muslemany, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 423 days.

(21) Appl. No.: 14/729,976

(22) Filed: Jun. 3, 2015

(65) Prior Publication Data
US 2015/0343413 A1 Dec. 3, 2015

Related U.S. Application Data

(60) Provisional application No. 62/007,229, filed on Jun. 3, 2014.

(51) Int. Cl.
G03F 7/008 (2006.01)
B01J 19/12 (2006.01)
G03F 7/012 (2006.01)
G03F 7/075 (2006.01)

(52) U.S. Cl.
CPC ............ B01J 19/123 (2013.01); G03F 7/008 (2013.01); G03F 7/0125 (2013.01); G03F 7/0755 (2013.01); *B01J 2219/0881* (2013.01); *B01J 2219/1203* (2013.01)

(58) Field of Classification Search
CPC ................ G03C 1/52; G03C 1/94; G03F 7/30
USPC ....... 430/155, 272, 159, 539, 303, 531, 954, 430/961, 286, 287
See application file for complete search history.

(56) References Cited

PUBLICATIONS

Behrens et al., Rapid Chemoselective Bioconjugation through Oxidative Coupling of Anilines and Aminophenols, 2011, Journal of the American Chemistry Society, pp. 16938-16401.*
Choi, et al., "Micropatterning of biomolecules on glass surfaces modified with various functional groups using photoactivatable biotin," *Anal. Biochem.* 347, pp. 60-66 (2005).
Wang, et al., "Gradient lithography of engineered proteins to fabricate 2D and 3D cell culture microenvironments," *Biomed. Microdevices*, 11, pp. 1127-1134 (2009).
Liu, et al., "Photopatterning of Antibodies on Biosensors," *Bioconjugate Chem.*, 11 pp. 755-761 (2000).
Carrico, et al., "Lithographic Patterning of Photoreactive Cell-Adhesive Proteins," *Am. Chem. Soc.* 129, pp. 4874-4875 (2007).
Ganesan, et al., "Simple micropatterning of biomolecules on a diazoketo-functionalized photoresist," *J. Mater. Chem.* 18, pp. 703-709 (2008).
Gu, et al., "Enzyme-assisted photolithography for spatial functionalization of hydrogels," *Lab Chip* 10, pp. 1946-1951 (2010).
(Continued)

*Primary Examiner* — Dah-Wei D. Yuan
*Assistant Examiner* — Andrew J Bowman
(74) *Attorney, Agent, or Firm* — Mintz, Levin, Cohn, Ferris, Glovsky and Popeo, P.C.

(57) ABSTRACT

The disclosure relates to methods of photopatterning molecules directly on a surface by photochemical means.

19 Claims, 32 Drawing Sheets

Specification includes a Sequence Listing.

(56) References Cited

PUBLICATIONS

Lafleur, et al., "Rapid photochemical surface patterning of proteins in thiol-ene based microfluidic devices," *Analyst* 138, pp. 845-849 (2013).

Jonkheijm, et al., "Photochemical Surface Patterning by the Thiol-Ene Reaction," *Angew. Chem., Int. Ed. Engl.* 47, pp. 4421-4424 (2008).

Orski, et al., "High Density Orthogonal Surface Immobilization via Photoactivated Copper-Free Click Chemistry," *J. Am. Chem. Soc.* 132, pp. 11024-11026 (2010).

Arumugam, et al., "Patterned Surface Derivatization Using Diels—Alder Photoclick Reaction," *J. Am. Chem. Soc.* 133, pp. 15730-15736 (2011).

Arumugam, et al., "Photoreactive Polymer Brushes for High-Density Patterned Surface Derivatization Using a Diels—Alder Photoclick Reaction," *J. Am. Chem. Soc.* 134, pp. 179-182 (2012).

Pauloehrl, et al., "Spatially controlled surface immobilization of nucleophiles via trapping of photo-generated thioaldehydes," *Chem. Sci.*, 4, pp. 3503-3507.

Glassner, et al., "Polymer surface patterning via Diels-Alder trapping of photo-generated thioaldehydes," *Chem. Commun.*, 49, pp. 633-635 (2013).

Hooker, et al., "Modification of Aniline Containing Proteins Using an Oxidative Coupling Strategy," *J. Am. Chem. Soc.* 128, pp. 15558-15559 (2006).

Carrico, et al., "Oxidative coupling of peptides to a virus capsid containing unnatural amino acids," *Chem. Commun.* 1205, pp. 1205-1207 (2008).

Behrens, et al., "Rapid Chemoselective Bioconjugation through Oxidative Coupling of Anilines and Aminophenols," *J. Am. Chem. Soc.* 133, pp. 16398-16401 (2011).

Obermeyer, et al., "Mild Bioconjugation Through the Oxidative Coupling of ortho-Aminophenols and Anilines with Ferricyanide," *Angew. Chem., Int. Ed. Engl.* 4, pp. 1057-1061 (2014).

Obermeyer, et al., "N-Terminal Modification of Proteins with o-Aminophenols," *J. Am. Chem. Soc.* 136, pp. 9572-9579 (2014).

Capehart, et al., "Controlled Integration of Gold Nanoparticles and Organic Fluorophores Using Synthetically Modified MS2 Viral Capsids," *J. Am. Chem. Soc.* 135, pp. 3011-3016 (2013).

Farkas, et al., "PET Imaging and Biodistribution of Chemically Modified Bacteriophage MS2," *Mol. Pharmaceuticals* 10, pp. 69-76 (2013).

Netirojjanakul, et al., "Synthetically modified Fc domains as building blocks for immunotherapy applications," *Chem. Sci.* 4, pp. 266-272 (2013).

Morawietz, et al., "Matrix Isolation of o-Quinoid Compounds—6-Imino-2,4-cyclohexadien-1-one and 1,2-Diimino-3,5-cyclohexadiene," *Liebigs Ann.* 1996, pp. 2029-2037 (1996).

Tomioka, et al., "Photochemistry of Phenyl Azides Bearing 2-Hydroxy and 2-Amino Groups Studied by Matrix-Isolation Spectroscopy: Generation and Characterization of Reactive o-Quinoid Compounds," *Liebigs Ann.* 1996, pp. 1971-1980 (1996).

Karyakina, et al., "Photolysis of ortho-Azidophenol in Various Solvents," *High Energy Chem.* 41, pp. 109-113 (2007).

Bayley, H., "Inhibitors of Photosynthetic Electron Transport. The Properties of Diazidodialkylbenzoquinones," *Z. Naturforsch.* 34, pp. 490-492 (1979).

Thygesen, et al., "Nucleophilic Catalysis of Carbohydrate Oxime Formation by Anilines," *J. Org. Chem.* 75, pp. 1752-1755 (2010).

Lempens, et al., "Efficient and Chemoselective Surface Immobilization of Proteins by Using Aniline-Catalyzed Oxime Chemistry," *ChemBioChem* 10, pp. 658-662 (2009).

\* cited by examiner

Figure 2C

| 7a (mM) | Toxudine (mM) | Yield (by HPLC, %) |
|---|---|---|
| 1.5 | 0.5 | 55 |
| 3.3 | 0.1 | 55 |
| 3.5 | 0.1 | 74 |
| 1.5 | 0.1 | 95 |

Figure 10A
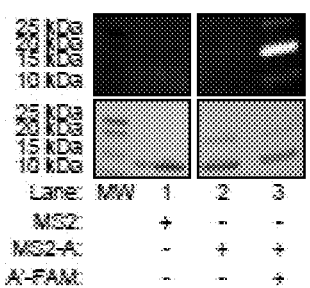
Figure 10B
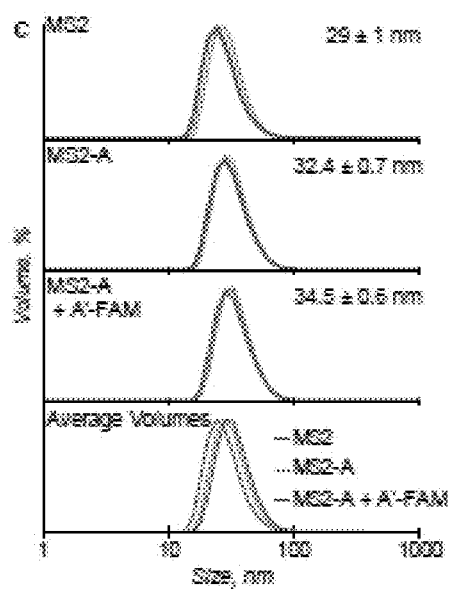
Figure 10C

Figure 11E

| ssDNA in solution | Melting temperature (°C) |
|---|---|
| A+A', no irradiation | 74.7 ± 0.3 |
| A (UVB) +A' | 74.2 ± 0.3 |
| A (UVC) +A' | 74.3 ± 0.3 |
| B+B', no irradiation | 70.2 ± 0.6 |
| B (UVB) +B' | 71.0 ± 0.0 |
| B (UVC) +B' | 71.0 ± 0.0 |
| B+A', no irradiation | N/A |

METHOD FOR DIRECT PHOTOPATTERNING OF MOLECULES ON SURFACES

CROSS-REFERENCES TO RELATED APPLICATIONS

This application claims priority to U.S. Provisional Application No. 62/007,229, filed Jun. 3, 2014, which is incorporated in its entirety herein for all purposes.

STATEMENT AS TO RIGHTS TO INVENTIONS MADE UNDER FEDERALLY SPONSORED RESEARCH AND DEVELOPMENT

This invention was made with Government support under Grant No. DGE 1106400 from the National Science Foundation. The Government has certain rights in this invention.

FIELD OF THE INVENTION

This disclosure relates to novels methods of photopatterning of molecules (e.g., biomolecules such as DNA or protein, synthetic polymers, or small molecules) on a surface using ultraviolet radiation and 4-substituted azidophenols as coupling agents. The disclosure also relates to solution-phase photochemical reactions of 4-substituted azidophenols with biomolecules.

BACKGROUND OF THE INVENTION

The ability to attach living cells to surfaces has enabled the study of many key behaviors in biology, including immune synapse formation, stem cell differentiation, cancer cell motility, and drug response. In most of these studies, cells of interest are exposed to surfaces, such as slides or supported lipid bilayers, that have been patterned with biomolecules that engage cellular receptors in a well-defined way. Outside these experiments, immobilized biomolecule arrays have also shown promise in fundamental studies of biofuel production, the investigation of antibody-antigen interactions, and the construction of biofuel cells based on enzymes.

Although most of these studies have capitalized on interactions between the surface integrins of adherent mammalian cells with proteins bearing "RGD" peptide motifs, there is a need to develop an alternative strategy in which synthetic DNA strands introduced on the cell surfaces bind to sequence complements displayed on the binding surface. Demonstrated advantages of this approach include its generality for all biological cell types, exceptionally high efficiency, and ability to generate complex multicellular patterns through the use of multiple capture sequences. In addition, the DNA-based adhesion event has been shown to exhibit minimal changes in cellular behavior because it does not involve native cell receptors. In previous studies, this strategy was used to measure the metabolism of single cells, conduct single-cell RT-PCR analysis, study the diffusion of paracrine signaling molecules, and connect cells directly to AFM tips. The technique has also been applied to the formation of three-dimensional cell clusters in suspension.

This conjugation method, like most other approaches to cell capture, benefits greatly from the development of streamlined techniques that can generate small and elaborate patterns of DNA with high precision and high throughput. This is typically done through the use of traditional photolithography, soft lithography, Dip-Pen nanolithography, inkjet printing, and electron beam lithography. Although these methods have yielded impressive advances in the types of arrays that can be generated, few if any can successfully combine the ability to generate sub-micron feature sizes with biomolecular compatibility and high patterning speed. This latter feature is highly important for the future commercialization of these platforms for diagnostic use, for example.

Accordingly, a new strategy for the generation of complex patterns of DNA molecules on surfaces is needed.

BRIEF SUMMARY OF THE INVENTION

In one embodiments, the present invention provides a method of photopatterning a surface by exposing a modified surface to ultraviolet radiation to produce a covalent linked structure of Formula II:

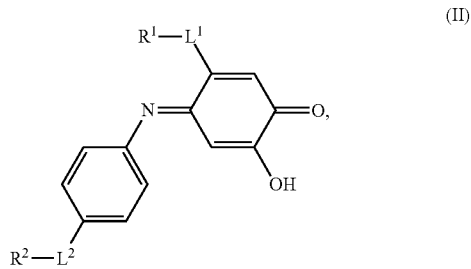

wherein the modified surface comprises a reactive component on top of a functionalized surface, wherein the reactive component and functionalized surface are each independently selected from the group consisting of:

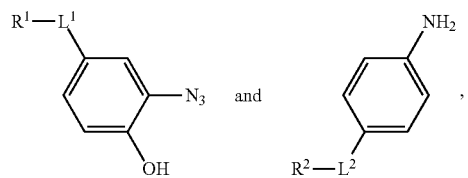

and
wherein $R^1$ and $R^2$ are each independently selected from the group consisting of the surface, a polypeptide, a protein, an oligonucleotide, an antibody, a capsid, or a combination thereof, wherein one of $R^1$ and $R^2$ is the surface, and wherein one of $R^1$ and $R^2$ is selected from the group consisting of the polypeptide, the protein, the oligonucleotide, the antibody, the capsid, or a combination thereof, and $L^1$ and $L^2$ are each independently linking groups, thereby photopatterning the surface.

In another embodiment, the present invention provides a method for photopatterning a surface, comprises a) contacting the surface with a functionalizing agent under conditions sufficient to form the functionalized surface; b) depositing a layer comprising the reactive component on top of the functionalized surface to provide the modified surface, wherein the reactive component comprises the structure of Formula I,

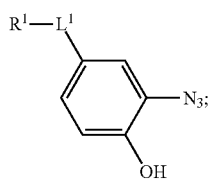

(Formula I)

and c) exposing the modified surface to ultraviolet radiation to produce a covalently linked structure of Formula II

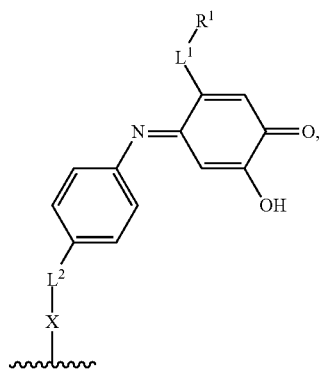

(Formula II)

thereby photopatterning the surface, wherein X is a binding group attached directly to the surface; $R^1$ comprises the polypeptide, the protein, the oligonucleotide, the antibody, the capsid, or a combination thereof; and $L^1$ and $L^2$ are each independently linking groups comprising from one to fifteen carbon atoms, and optionally substituted with one to three heteroatoms selected from the group consisting of oxygen, nitrogen, and sulfur.

In another embodiment, the present invention provides a method of photochemical coupling comprising shining ultraviolet radiation on a mixture comprising a compound of Formula I

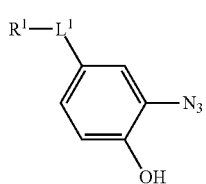

(Formula I)

and at least one compound having the structure

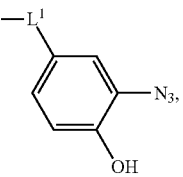

under conditions suitable to produce a compound of Formula II,

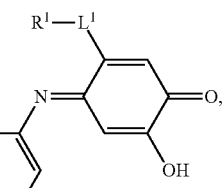

(Formula II)

wherein $R^1$ and $R^2$ are each independently selected from the group consisting of H, a polypeptide, a protein, an oligonucleotide, an antibody, a capsid, or a combination thereof, wherein at least one of $R^1$ and $R^2$ is selected from the group consisting of a polypeptide, a protein, an oligonucleotide, an antibody and a capsid; and $L^1$ and $L^2$ are each independently absent or a group having from one to fifteen carbon atoms, and optionally substituted with one to three heteroatoms selected from the group consisting of oxygen, nitrogen, and sulfur.

In another embodiment, the present invention provides a kit for photopatterning a surface, comprising a surface, a functionalizing agent capable of reacting with the surface, a source of ultraviolet radiation, and a compound having the structure:

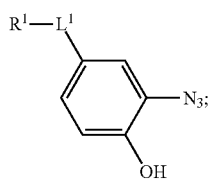

wherein $R^1$ is selected from the group consisting of a polypeptide, a protein, an oligonucleotide, an antibody, or a combination thereof, and $L^1$ and is a linking group independently comprising from one to fifteen carbon atoms, and optionally substituted with one to three hetero atoms selected from the group consisting of oxygen, nitrogen, and sulfur.

BRIEF DESCRIPTION OF THE DRAWINGS

FIGS. 2A, 2B and 2C shows reaction characterization and quantification for small molecules. (a) The product of the reaction (6a) was independently synthesized and used to develop an HPLC calibration curve. The product was quantified at 260 nm. p-toluenesulfonic acid (p-tosl, 1 mM) was used as an internal standard and quantified at 230 nm. (b) The reaction and all of its individual components were analyzed by HPLC using absorbance monitoring at 260 nm. The reaction mixture was also analyzed by ESI-MS, and it was determined that $[11+H]^+=244.0967$, or $C_{14}H_{14}O_3N^+$. $[6a+H]^+=228.1019$, or $C_{14}H_{14}O_2N^+$ (c) The reaction was run at a variety of different ratios of toluidine to 7a, and the corresponding yields were determined by HPLC.

FIGS. 10A, 10B and 10C shows characterization of DNA strands coupled to T19pAF MS2 capsids using the photoactivated bioconjugation strategy. (a) The DNA sequence attached to the capsids is shown. A' (SEQ ID NO:5), the complementary strand to A, was covalently labeled with a 5'-fluorescein amidite (FAM). (b) A 0.25 mM solution of DNA azidophenol 7e with "sequence A (SEQ ID NO:1)" was irradiated for 5 min in the presence of 50 μM (in monomer) T19pAF MS2 in 10 mM bis-tris buffer at pH 6. The constructs were analyzed by SDS-PAGE under reducing conditions in the presence and absence of added A'-FAM and imaged using both fluorescence (for A'-FAM visualization) and Coommassie protein staining. (c) The construct was also characterized by dynamic light scattering before reaction with azidophenol A (MS2), after reaction (MS2-A), and after hybridization to complementary strand A'-FAM (MS2-A+A'-FAM).

FIGS. 11A, 11B, 11C, 11D and 11E shows effects of irradiation on DNA melting temperature. DNA with sequences A (a, b) and B (c, d) at 1 mM concentrations were irradiated with light for 10 min in 10 mM bis-tris buffer at pH 7 and 150 mM sodium chloride. The complementary strand was then added, and the solutions were diluted to 1 nM with equivalent buffer conditions and 1×SYBR Green I, which selectively fluoresces when intercalating double-stranded DNA. Fluorescence was monitored over different temperatures from 20-90° C. The fluorescence intensity (a, c) and change in fluorescence over temperature (b, d) are both shown, with the melting temperatures derived from the first derivative plots (e). The samples were run in triplicate, and the melting temperatures determined (p>0.05).

DETAILED DESCRIPTION OF THE INVENTION

I. Definitions

Figure 1:
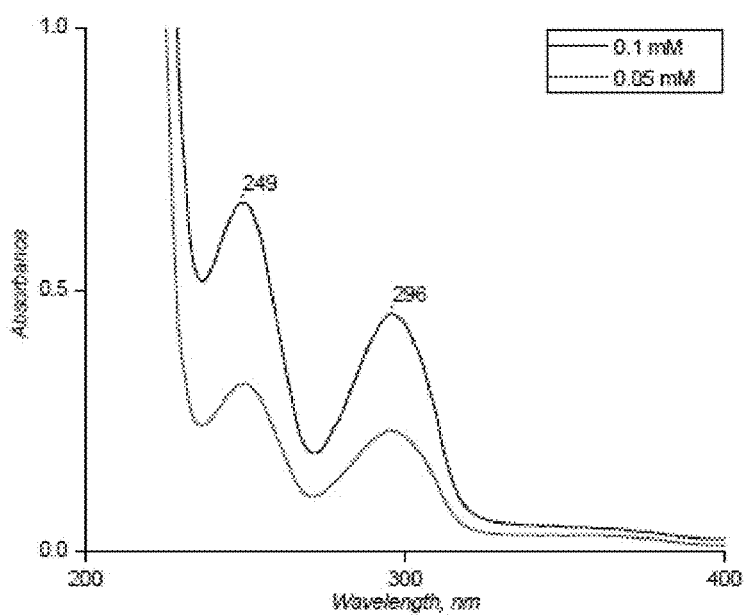
FIG. 1 shows UV-visible absorption spectrum for azidophenol 7a. UV-visible absorption spectrum for azidophenol 7a. Azidophenol 7a was dissolved in water and diluted to the listed concentration. Absorption maxima were found at 249 nm and 296 nm.

As used herein, the term "contacting" refers to the process of bringing into contact at least two distinct species such that they can react. It should be appreciated, however, the resulting reaction product can be produced directly from a reaction between the added reagents or from an intermediate from one or more of the added reagents which can be produced in the reaction mixture.

As used herein, the phrase "functionalizing agent" refers to one or more compounds that can react with a surface to form covalent bonds between the atoms in the compound and the surface itself. The functionalizing agent may contain a mixture of compounds and can include components that do not react with the surface, e.g. solvent, buffers, etc.

As used herein, the phrase "functionalized surface" refers to a material that has reacted with the functionalizing agent. The material may be any material capable of forming covalent bonds with the functionalizing agent.

As used herein, the phrase "reactive component" refers to one or more compounds that can react with the functionalizing agent via a photochemical reaction. The reaction between the functionalizing agent and the reactive component can take place both when the functionalizing agent is in solution and when the functionalizing agent is covalently bonded to a material.

As used herein, the phrase "ultraviolet radiation" refers to monochromatic or polychromatic radiation with wavelengths between about 280 and 400 nm.

As used herein, the term "polypeptide" refers to a sequence of one or more naturally occurring amino acids, as well as chemically modified derivatives thereof.

As used herein, the phrase "protein" refers to a polypeptide, as defined above, capable of having tertiary structure.

As used herein, the term "oligonucleotide" refers to a single-stranded sequence of one or more nucleotide residues. The oligonucleotide can be DNA or RNA. The nucleotide residues can be those that occur naturally in DNA or RNA, or nucleotides that are chemically modified and not naturally occurring. Exemplary oligonucleotides include, but are not limited to, those that contain or are composed of deoxy-ribonucleic acid (DNA), ribonucleic acid (RNA), peptide nucleic acid (PNA), Morpholino and locked nucleic acid (LNA), glycol nucleic acid (GNA), threose nucleic acid (TNA), single-stranded DNA (ssDNA), 2'-fluorodeoxy ribonucleic acid, aptamer, and others. The oligonucleotides can contain reactive moieties for modification and/or surface immobilization, including but not limited to one or more amine, thiol, hydrazide, carboxylate, or aldehyde moieties, and the like. The reactive moieties can be at the 5' end, the 3' end, between the 5' and 3' ends of the oligonucleotide, or a combination thereof.

As used herein, the term "small molecule" refers to a drug or non-drug small molecule. The small molecule can have a molecular weight of less than 1,500 daltons; less than 1,000 daltons; or less than 500 daltons.

As used herein, the phrase "thin film" refers to a layer of material with a thickness ranging from 1 nm to 500 micrometers. The thin film can be a monolayer.

As used herein, the phrase "spin coating" refers to a procedure to deposit a thin film on a substrate whereby a measured amount of reactive component (or other material) is placed on or near the center of the substrate, and the substrate is subsequently rotated at high speed to spread the reactive component.

As used herein, the term "distributing" refers to a process of spreading a substance on a surface to produce a uniform layer of the substance. The spreading may be accomplished by any means, including, without limitation, mechanical force, electromagnetic deposition, gravity, centrifugal force, etc.

As used herein, the term the term "substituted" refers to the replacement of an atom or a group of atoms of a compound with another atom or group of atoms.

As used herein, the phrase "binding group" refers to a portion of the molecule connecting the molecule to the surface As used herein, the phrase "linking group" refers to a portion of the molecule connecting two molecular fragments, for example, and without limitation, a linking group can connect a reactive group containing an azidophenol and a protein or DNA sequence. The carbon atoms in the linking group can be connected by any combination of single, double, or triple bonds. The nitrogen, oxygen, and sulfur atoms in the linking group can be present in the carbon chain, substituted on the carbon chain, or any combination of the foregoing. Valences on the carbon atoms not occupied by carbon, nitrogen, oxygen, or sulfur are connected to hydrogen or deuterium atoms.

As used herein, "antibody" includes reference to an immunoglobulin molecule immunologically reactive with a particular antigen, and includes both polyclonal and monoclonal antibodies. The term also includes genetically engineered forms such as chimeric antibodies (e.g., humanized murine antibodies) and heteroconjugate antibodies (e.g., bispecific antibodies). The term "antibody" also includes antigen binding forms of antibodies, including fragments with antigen-binding capability (e.g., Fab', F(ab')$_2$, Fab, Fv and rIgG. See also, Pierce Catalog and Handbook, 1994-1995 (Pierce Chemical Co., Rockford, Ill.). See also, e.g., Kuby, J., *Immunology*, 3$^{rd}$ Ed., W.H. Freeman & Co., New York (1998). The term also refers to recombinant single chain Fv fragments (scFv). The term antibody also includes bivalent or bispecific molecules, diabodies, triabodies, and tetrabodies. Bivalent and bispecific molecules are described in, e.g., Kostelny et al. (1992) *J Immunol* 148:1547, Pack and Pluckthun (1992) *Biochemistry* 31:1579, Hollinger et al., 1993, supra, Gruber et al. (1994) *J Immunol:* 5368, Zhu et al. (1997) *Protein Sci* 6:781, Hu et al. (1996) *Cancer Res.* 56:3055, Adams et al. (1993) *Cancer Res.* 53:4026, and McCartney, et al. (1995) *Protein Eng.* 8:301.

"Polypeptide," "peptide," and "protein" are used interchangeably herein to refer to a polymer of amino acid residues. All three terms apply to amino acid polymers in which one or more amino acid residue is an artificial chemical mimetic of a corresponding naturally occurring amino acid, as well as to naturally occurring amino acid polymers and non-naturally occurring amino acid polymers. As used herein, the terms encompass amino acid chains of any length, including full-length proteins, wherein the amino acid residues are linked by covalent peptide bonds.

"Alkyl" refers to a straight or branched, saturated, aliphatic radical having the number of carbon atoms indicated.

Alkyl can include any number of carbons, such as $C_{1-2}$, $C_{1-3}$, $C_{1-4}$, $C_{1-5}$, $C_{1-6}$, $C_{1-7}$, $C_{1-8}$, $C_{1-9}$, $C_{1-10}$, $C_{2-3}$, $C_{2-4}$, $C_{2-5}$, $C_{2-6}$, $C_{3-4}$, $C_{3-5}$, $C_{4-5}$, $C_{4-6}$ and $C_{5-6}$. For example, $C_{1-6}$ alkyl includes, but is not limited to, methyl, ethyl, propyl, isopropyl, butyl, isobutyl, sec-butyl, tert-butyl, pentyl, isopentyl, hexyl, etc. Alkyl can also refer to alkyl groups having up to 20 carbons atoms, such as, but not limited to heptyl, octyl, nonyl, decyl, etc. Alkyl groups can be substituted or unsubstituted.

"Heteroalkyl" refers to an alkyl group of any suitable length and having from 1 to 3 heteroatoms such as N, O and S. Additional heteroatoms can also be useful, including, but not limited to, B, Al, Si and P. The heteroatoms can also be oxidized, such as, but not limited to, —S(O)— and —S(O)$_2$—. For example, heteroalkyl can include ethers, thioethers and alkyl-amines. The heteroatom portion of the heteroalkyl can replace a hydrogen of the alkyl group to form a hydroxy, thio or amino group. Alternatively, the heteroartom portion can be the connecting atom, or be inserted between two carbon atoms.

"Cycloalkyl" refers to a saturated or partially unsaturated, monocyclic, fused bicyclic or bridged polycyclic ring assembly containing from 3 to 12 ring atoms, or the number of atoms indicated. Cycloalkyl can include any number of carbons, such as $C_{3-6}$, $C_{4-6}$, $C_{5-6}$, $C_{3-8}$, $C_{4-8}$, $C_{5-8}$, $C_{6-8}$, $C_{3-9}$, $C_{3-10}$, $C_{3-11}$, and $C_{3-12}$. Saturated monocyclic cycloalkyl rings include, for example, cyclopropyl, cyclobutyl, cyclopentyl, cyclohexyl, and cyclooctyl. Saturated bicyclic and polycyclic cycloalkyl rings include, for example, norbornane, [2.2.2] bicyclooctane, decahydronaphthalene and adamantane. Cycloalkyl groups can also be partially unsaturated, having one or more double or triple bonds in the ring. Representative cycloalkyl groups that are partially unsaturated include, but are not limited to, cyclobutene, cyclopentene, cyclohexene, cyclohexadiene (1,3- and 1,4-isomers), cycloheptene, cycloheptadiene, cyclooctene, cyclooctadiene (1,3-, 1,4- and 1,5-isomers), norbornene, and norbornadiene. When cycloalkyl is a saturated monocyclic $C_{3-8}$ cycloalkyl, exemplary groups include, but are not limited to cyclopropyl, cyclobutyl, cyclopentyl, cyclohexyl, cycloheptyl and cyclooctyl. When cycloalkyl is a saturated monocyclic $C_{3-6}$ cycloalkyl, exemplary groups include, but are not limited to cyclopropyl, cyclobutyl, cyclopentyl, and cyclohexyl. Cycloalkyl groups can be substituted or unsubstituted.

"Heterocycloalkyl" refers to a saturated ring system having from 3 to 12 ring members and from 1 to 4 heteroatoms of N, O and S. Additional heteroatoms can also be useful, including, but not limited to, B, Al, Si and P. The heteroatoms can also be oxidized, such as, but not limited to, —S(O)— and —S(O)$_2$—. Heterocycloalkyl groups can include any number of ring atoms, such as, 3 to 6, 4 to 6, 5 to 6, 3 to 8, 4 to 8, 5 to 8, 6 to 8, 3 to 9, 3 to 10, 3 to 11, or 3 to 12 ring members. Any suitable number of heteroatoms can be included in the heterocycloalkyl groups, such as 1, 2, 3, or 4, or 1 to 2, 1 to 3, 1 to 4, 2 to 3, 2 to 4, or 3 to 4. The heterocycloalkyl group can include groups such as aziridine, azetidine, pyrrolidine, piperidine, azepane, azocane, quinuclidine, pyrazolidine, imidazolidine, piperazine (1,2-, 1,3- and 1,4-isomers), oxirane, oxetane, tetrahydrofuran, oxane (tetrahydropyran), oxepane, thiirane, thietane, thiolane (tetrahydrothiophene), thiane (tetrahydrothiopyran), oxazolidine, isoxazolidine, thiazolidine, isothiazolidine, dioxolane, dithiolane, morpholine, thiomorpholine, dioxane, or dithiane. The heterocycloalkyl groups can also be fused to aromatic or non-aromatic ring systems to form members including, but not limited to, indoline. Heterocycloalkyl groups can be unsubstituted or substituted. For example, heterocycloalkyl groups can be substituted with $C_{1-6}$ alkyl or oxo (=O), among many others.

"Aryl" refers to an aromatic ring system having any suitable number of ring atoms and any suitable number of rings. Aryl groups can include any suitable number of ring atoms, such as, 6, 7, 8, 9, 10, 11, 12, 13, 14, 15 or 16 ring atoms, as well as from 6 to 10, 6 to 12, or 6 to 14 ring members. Aryl groups can be monocyclic, fused to form bicyclic or tricyclic groups, or linked by a bond to form a biaryl group. Representative aryl groups include phenyl, naphthyl and biphenyl. Other aryl groups include benzyl, having a methylene linking group. Some aryl groups have from 6 to 12 ring members, such as phenyl, naphthyl or biphenyl. Other aryl groups have from 6 to 10 ring members, such as phenyl or naphthyl. Some other aryl groups have 6 ring members, such as phenyl. Aryl groups can be substituted or unsubstituted.

"Heteroaryl" refers to a monocyclic or fused bicyclic or tricyclic aromatic ring assembly containing 5 to 16 ring atoms, where from 1 to 5 of the ring atoms are a heteroatom such as N, O or S. Additional heteroatoms can also be useful, including, but not limited to, B, Al, Si and P. The heteroatoms can also be oxidized, such as, but not limited to, —S(O)— and —(S)$_2$—. Heteroaryl groups can include any number of ring atoms, such as, 3 to 6, 4 to 6, 5 to 6, 3 to 8, 4 to 8, 5 to 8, 6 to 8, 3 to 9, 3 to 10, 3 to 11, or 3 to 12 ring members. Any suitable number of heteroatoms can be included in the heteroaryl groups, such as 1, 2, 3, 4, or 5, or 1 to 2, 1 to 3, 1 to 4, 1 to 5, 2 to 3, 2 to 4, 2 to 5, 3 to 4, or 3 to 5. Heteroaryl groups can have from 5 to 8 ring members and from 1 to 4 heteroatoms, or from 5 to 8 ring members and from 1 to 3 heteroatoms, or from 5 to 6 ring members and from 1 to 4 heteroatoms, or from 5 to 6 ring members and from 1 to 3 heteroatoms. The heteroaryl group can include groups such as pyrrole, pyridine, imidazole, pyrazole, triazole, tetrazole, pyrazine, pyrimidine, pyridazine, triazine (1,2,3-, 1,2,4- and 1,3,5-isomers), thiophene, furan, thiazole, isothiazole, oxazole, and isoxazole. The heteroaryl groups can also be fused to aromatic ring systems, such as a phenyl ring, to form members including, but not limited to, benzopyrroles such as indole and isoindole, benzopyridines such as quinoline and isoquinoline, benzopyrazine (quinoxaline), benzopyrimidine (quinazoline), benzopyridazines such as phthalazine and cinnoline, benzothiophene, and benzofuran. Other heteroaryl groups include heteroaryl rings linked by a bond, such as bipyridine. Heteroaryl groups can be substituted or unsubstituted.

The heteroaryl groups can be linked via any position on the ring. For example, pyrrole includes 1-, 2- and 3-pyrrole, pyridine includes 2-, 3- and 4-pyridine, imidazole includes 1-, 2-, 4- and 5-imidazole, pyrazole includes 1-, 3-, 4- and 5-pyrazole, triazole includes 1-, 4- and 5-triazole, tetrazole includes 1- and 5-tetrazole, pyrimidine includes 2-, 4-, 5- and 6-pyrimidine, pyridazine includes 3- and 4-pyridazine, 1,2,3-triazine includes 4- and 5-triazine, 1,2,4-triazine includes 3-, 5- and 6-triazine, 1,3,5-triazine includes 2-triazine, thiophene includes 2- and 3-thiophene, furan includes 2- and 3-furan, thiazole includes 2-, 4- and 5-thiazole, isothiazole includes 3-, 4- and 5-isothiazole, oxazole includes 2-, 4- and 5-oxazole, isoxazole includes 3-, 4- and 5-isoxazole, indole includes 1-, 2- and 3-indole, isoindole includes 1- and 2-isoindole, quinoline includes 2-, 3- and 4-quinoline, isoquinoline includes 1-, 3- and 4-isoquinoline, quinazoline includes 2- and 4-quinoazoline, cinnoline includes 3- and 4-cinnoline, benzothiophene includes 2- and 3-benzothiophene, and benzofuran includes 2- and 3-benzofuran.

Some heteroaryl groups include those having from 5 to 10 ring members and from 1 to 3 ring atoms including N, O or S, such as pyrrole, pyridine, imidazole, pyrazole, triazole, pyrazine, pyrimidine, pyridazine, triazine (1,2,3-, 1,2,4- and 1,3,5-isomers), thiophene, furan, thiazole, isothiazole, oxazole, isoxazole, indole, isoindole, quinoline, isoquinoline, quinoxaline, quinazoline, phthalazine, cinnoline, benzothiophene, and benzofuran. Other heteroaryl groups include those having from 5 to 8 ring members and from 1 to 3 heteroatoms, such as pyrrole, pyridine, imidazole, pyrazole, triazole, pyrazine, pyrimidine, pyridazine, triazine (1,2,3-, 1,2,4- and 1,3,5-isomers), thiophene, furan, thiazole, isothiazole, oxazole, and isoxazole. Some other heteroaryl groups include those having from 9 to 12 ring members and from 1 to 3 heteroatoms, such as indole, isoindole, quinoline, isoquinoline, quinoxaline, quinazoline, phthalazine, cinnoline, benzothiophene, benzofuran and bipyridine. Still other heteroaryl groups include those having from 5 to 6 ring members and from 1 to 2 ring atoms including N, O or S, such as pyrrole, pyridine, imidazole, pyrazole, pyrazine, pyrimidine, pyridazine, thiophene, furan, thiazole, isothiazole, oxazole, and isoxazole.

Some heteroaryl groups include from 5 to 10 ring members and only nitrogen heteroatoms, such as pyrrole, pyridine, imidazole, pyrazole, triazole, pyrazine, pyrimidine, pyridazine, triazine (1,2,3-, 1,2,4- and 1,3,5-isomers), indole, isoindole, quinoline, isoquinoline, quinoxaline, quinazoline, phthalazine, and cinnoline. Other heteroaryl groups include from 5 to 10 ring members and only oxygen heteroatoms, such as furan and benzofuran. Some other heteroaryl groups include from 5 to 10 ring members and only sulfur heteroatoms, such as thiophene and benzothiophene. Still other heteroaryl groups include from 5 to 10 ring members and at least two heteroatoms, such as imidazole, pyrazole, triazole, pyrazine, pyrimidine, pyridazine, triazine (1,2,3-, 1,2,4- and 1,3,5-isomers), thiazole, isothiazole, oxazole, isoxazole, quinoxaline, quinazoline, phthalazine, and cinnoline.

II. General

An easily accessible and operationally simple photoinitiated reaction that can achieve patterned bioconjugation in a highly chemoselective manner is disclosed. The reaction involves the photolysis of 2-azidophenols to generate iminoquinone intermediates that couple rapidly to aniline groups. The reaction has broad functional group compatibility for the modification of proteins, polymers, oligonucleotides, peptides, and small molecules. As a specific application, the reaction was adapted for the photolithographic patterning (photopatterning) of azidophenol DNA on aniline glass substrates. The presence of the DNA was confirmed by the ability of the surface to capture living cells bearing the sequence complement on their cell walls or cytoplasmic membranes. Compared to other light-based DNA patterning methods, this reaction offers higher speed and does not require the use of a photoresist or other blocking material.

III. Photopatterning a Surface with DNA

The use of photoinitiated coupling reactions offers significant promise for surface patterning, as they can harness the inherent spatial precision and parallelization of photolithography without the need for photoresists. This feature serves to increase biocompatibility and obviate the need for multiple etching and washing steps. In this approach, the species of interest is first placed on a photoreactive surface, after which irradiation initiates the reaction to immobilize the molecule through a covalent linkage. This process has already been demonstrated with reactions that display low chemoselectivity, relying on highly reactive radical intermediates generated from reagents like aryl azide and benzophenone precursors.

These intermediates insert into C—H, O—H, or N—H bonds found in the biomolecular targets. While these reactions have enabled the coupling of photoreactive biomolecules, surfaces, and caged species, the low reaction specificity limits their applicability. Photoinitiated orthogonal bioconjugation reactions have also found use in this space, primarily through the use of thiol-ene, cyclopropenone-azide, quinone methide, and thioaldehyde reactions. However, few of these reactions have been evaluated using thin films that are compatible with photomasking techniques, and many require additional steps for biomolecule attachment or precursors that are synthetically difficult to access.

Figure 25A:
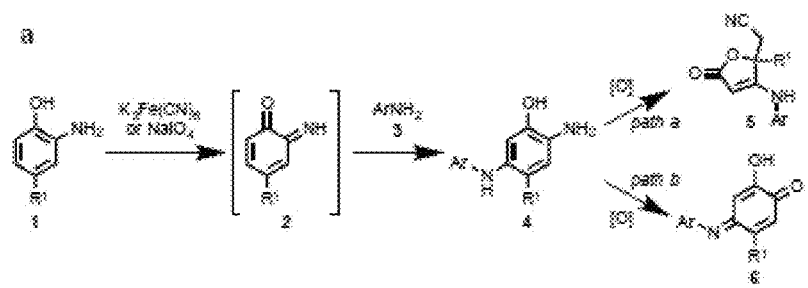
FIGS. 25A, 25B and 25C show rapid and efficient oxidative coupling reactions involving anilines and iminoquinone intermediates (2). (a) Previously reported reactions with aminophenol precursors require periodate or ferricyanide as oxidants. The major product with $NaIO_4$ is 5, while $K_3Fe(CN)_6$ yields only product 6. (b) The reaction of azidophenol 7 is initiated by UV light and requires no additional oxidant for aniline coupling to occur. This reaction presumably involves nitrene 8, which rapidly rearranges to iminoquinone 2. (c) In the absence of added oxidant, the oxidation of initial adduct 4 can occur with $O_2$ or through the redox transfer pathway shown.

The present approach to this problem was predicated on the development of an oxidant-free, photoinitiated equivalent of a series of oxidative coupling methods recently reported by our group. These reactions proceed via the coupling of aminophenols and anilines (FIG. 25a), presumably involving iminoquinone intermediate 2. When sodium periodate is used as the terminal oxidant, a ring contraction occurs to yield butenolide 5 as the major product (path a). Alternatively, the use of ferricyanide affords p-iminoquinone 6 as a single, stable product (path b) Both of these reactions proceed very rapidly (typically <2 min using periodate and <15 min using ferricyanide), and can therefore be used to modify biomolecules at low-micromolar concentrations. In previous work, these strategies have been used to couple oligonucleotides, polymers, and chromophores to aniline groups introduced on the surface of genome-free viral capsids and at the N-termini of antibody Fc domains.

Figure 25B:
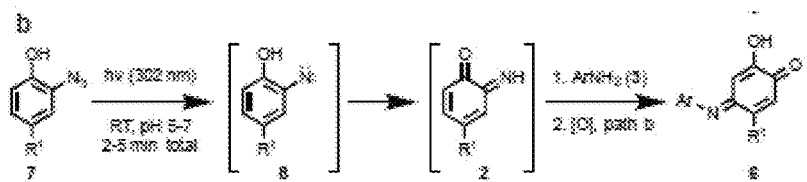

The success of these reactions is based on the generation of the key iminoquinone intermediate (2). While this is easily done through the oxidation of o-aminophenol precursors, a photochemical alternative could be envisioned by modifying the amine to include a leaving group that would be lost upon irradiation. Literature precedent suggested that, in fact, azidophenols had the potential to undergo such a transformation. In particular, early studies by Sander and Koseki demonstrated that irradiation of o-azidophenol (7, R1=H) in an argon matrix liberates nitrogen gas to give the corresponding nitrene (8). These intermediates rapidly rearrange to form iminoquinone 2, providing a precedent that azidophenols could indeed serve as photolabile iminoquinone precursors (FIG. 25b). In other early work, Bayley has used a related pathway for the photogeneration of inhibitors of photosynthetic electron transport. Extensive studies involving 4-alkyl-substituted versions of these intermediates suggested that chemoselective bioconjugation would be possible once these groups had been generated.

Figure 2A:
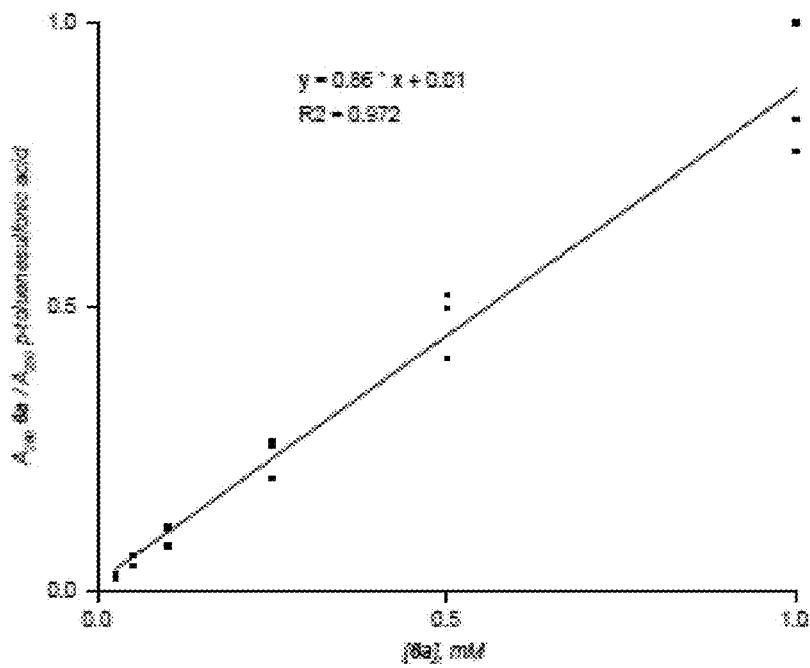
Figure 2B:
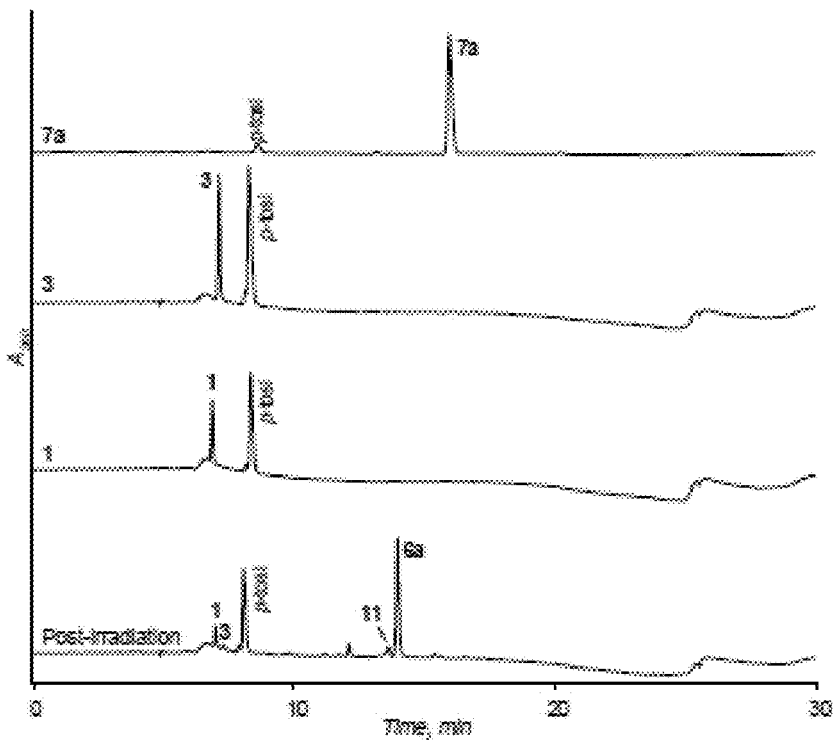

With this concept in mind, initial reaction studies involved the irradiation of 4-methyl-2-azidophenol (7a, $R^1$=CH$_3$) in the presence of toluidine (3, Ar=4-CH$_3$C$_6$H$_4$) as an aniline coupling partner at the absorbance maxima of 7a (FIG. 1). These reactants were exposed to 302 nm light for 5 min using a 6 W handheld lamp in bis-tris buffer at pH 6. The sole toluidine-containing product was identified as 6a (R1=CH3), as characterized using reversed phase HPLC and NMR (FIG. 2). The success of the reaction was found to be dependent on the ratio of the reacting species, with up to 95% HPLC yield being obtained with 1.5 mM 7a and 100 µM 3 (FIG. 2).

Figure 25C:
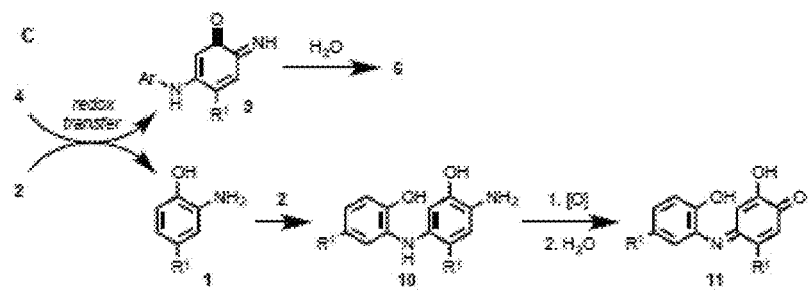

Although the reaction did not require an additional oxidant, the p-iminoquinone species was nonetheless obtained. This could occur from the aerobic oxidation of initial adduct 4, or from an intermolecular redox exchange with an additional iminoquinone molecule (2), FIG. 25c. While the latter pathway yields a stable adduct involving the aniline group, it also produces an aminophenol byproduct that can couple competitively with an additional equivalent of 2 (albeit apparently more slowly). In support of this pathway, small amounts of dimeric species were isolated that were consistent in mass with compound 11.

The exact structure of this species is still under investigation, as only minimal amounts are available and it has limited solution stability. In any case, this secondary reaction potentially limits the efficiency of this coupling strategy, relative to our previous methods that involve an excess of additional oxidants. Additional experiments to date involving the addition of oxidants to the photochemical version of the coupling reaction have produced complex product mixtures, likely arising from the photochemical degradation of the oxidants themselves.

Figure 3:
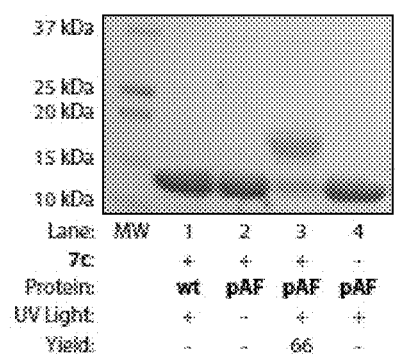
FIG. 3 shows reactivity controls for MS2 capsids. Azidophenol PEG derivative 7c at 1 mM was irradiated for 5 min in the presence of either wild type (wt) or T19pAF MS2 at 50 μM (in monomer) in a pH 6 bis-tris buffer. Azidophenol 2k-PEG 7c only reacts in the presence of aniline with UV irradiation. Conversion was quantified by optical densitometry after Coomassie staining.
Figure 4:
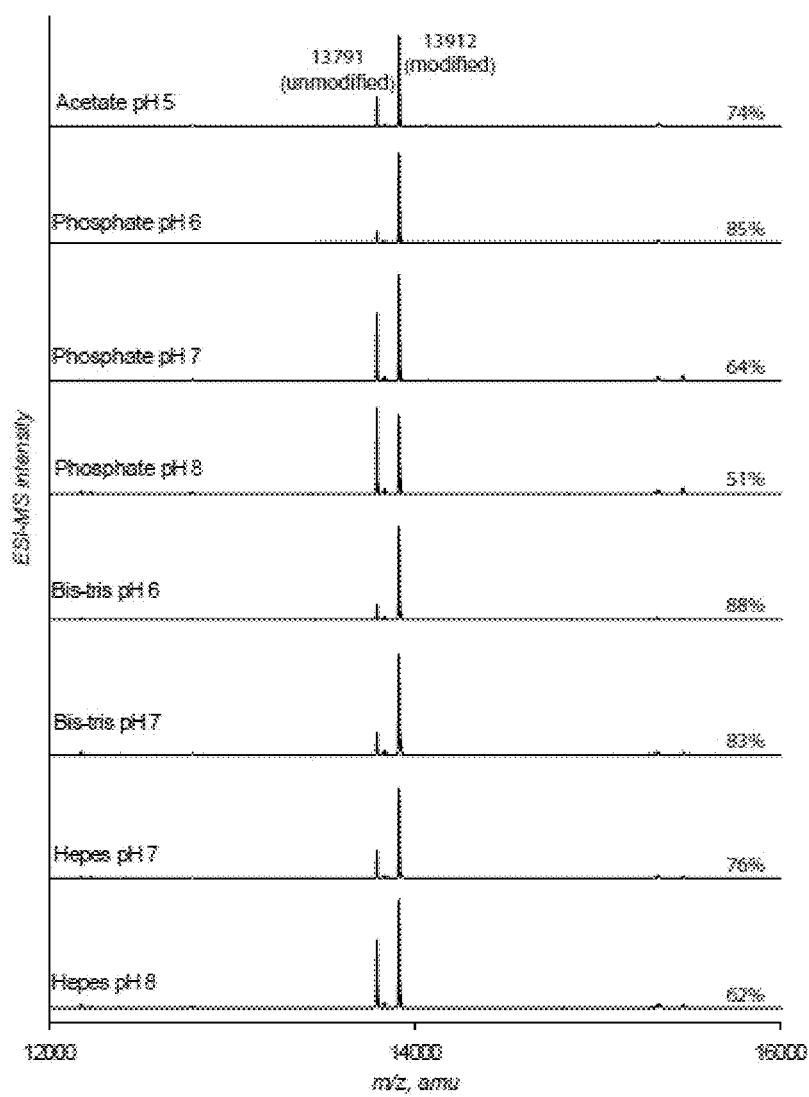
FIG. 4 shows effects of buffer and pH on reaction yield. A 1 mM solution of azidophenol derivative 7a was irradiated for 5 min in the presence of 50 μM (in monomer) T19pAF MS2 in a variety of buffers from pH 5 to 8. Each buffering salt was 10 mM. Yields were calculated from the peak heights revealed by ESI-MS analysis. Unmodified MS2 capsid monomers had an expected mass of 13790, and modified MS2 had an expected mass of 13911.
Figure 5:
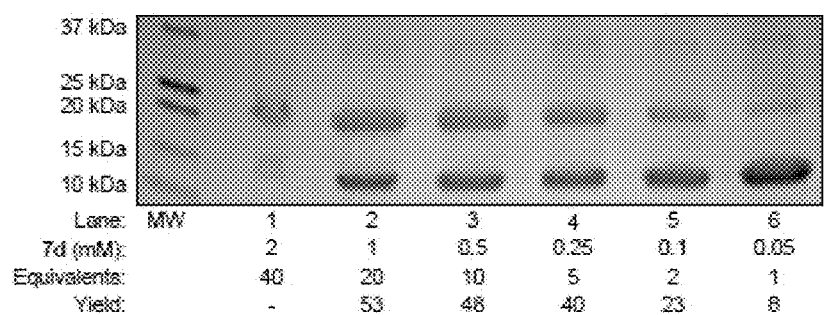
FIG. 5 shows effects of concentration on reactivity. A variety of concentrations of azidophenol 5k-PEG derivative 7d, from 2 mM to 0.05 mM, were irradiated in the presence of 50 μM (in monomer) T19pAF MS2 in 10 mM bis-tris buffered at pH 6. The reactions were irradiated for 5 min and then quenched with TCEP. Conversion was quantified by optical densitometry after Coomassie staining.
Figure 6A:
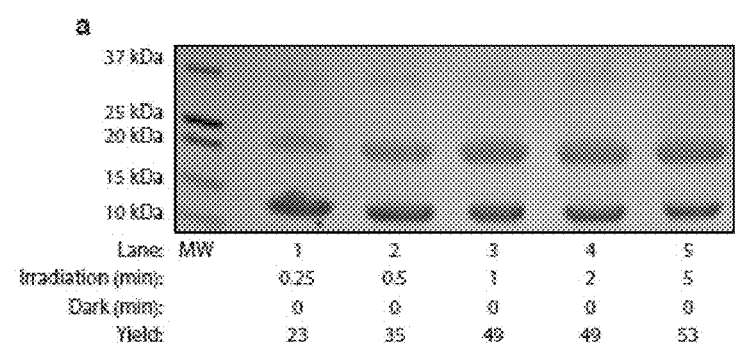
FIGS. 6A and 6B shows effects of irradiation time on UV initiated oxidative coupling. Solutions of 1 mM azidophenol 5k-PEG derivative 7d were irradiated in the presence of 50 μM (in monomer) T19pAF MS2 capsids in 10 mM bis-tris buffer at pH 6. The reactions were irradiated for varying amounts of time and (a) quenched immediately with TCEP or (b) quenched with TCEP after 5 min of additional reaction time in the dark. TCEP quenching showed negligible effects on the reaction conversion efficiency. Conversion was quantified by optical densitometry after Coomassie staining.
Figure 6B:
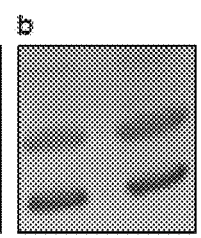
Figure 22A:
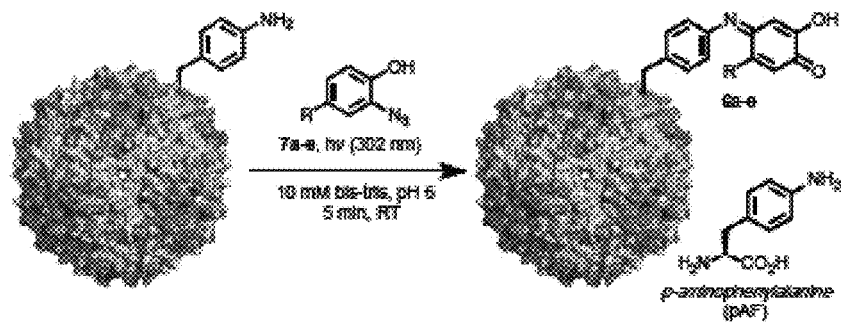
FIGS. 22A, 22B and 22C shows modification of aniline-containing MS2 viral capsids with azidophenols under photochemical conditions. (a) Each of the 180 capsid proteins contained one aniline group in position 19. The intact structure (50 μm in aniline concentration) was irradiated in the presence of azidophenols. ESI-MS yielded the reconstructed mass spectra for reaction with (b) 7a and (c) 7b (structure in FIG. 3). A negative control irradiating 7a with wild type T19 MS2 showed no reaction. Expected mass for the product with 7a: m/z=13911; expected mass for the product with 7b: m/z=14554.
Figure 22B:
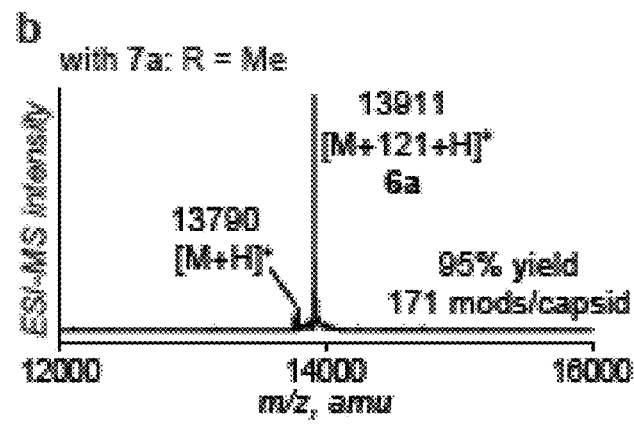
Figure 22C:
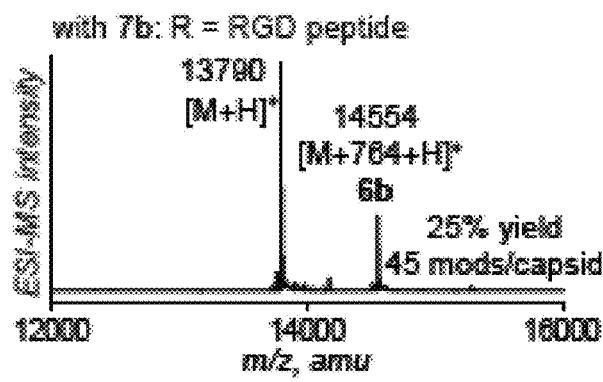

With the basic reactivity pattern in place, the biocompatibility of the reaction was next tested in the context of protein bioconjugation. The first of these experiments involved genome-free MS2 viral capsids (277 nM, 50 µM in capsid monomer) that possessed a p-aminophenylalanine (pAF) residue in position 19 of each monomer, FIG. 22a. This residue was introduced using the amber codon suppression techniques developed by the Schultz lab, providing 180 aniline groups on the external surface of each 27 nm protein shell. These capsids were combined with compound 7a (R=$CH_3$, 1 mM) in bis-tris buffer at pH 6. Following irradiation at 302 nm with a hand-held lamp for 5 min, excellent conversion was observed to the expected product, FIG. 22b. In contrast, no coupling was observed in the absence of irradiation, or for irradiated capsids that lacked the pAF residues (see FIG. 3). The reaction reached complete conversion after 5 min of irradiation, with an optimal pH range of 5-7 (FIGS. 4-6).

Figure 7:
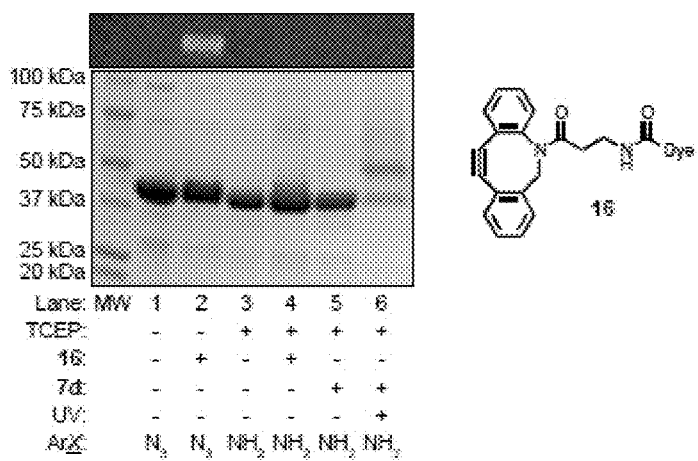
FIG. 7 shows modification of an endogluconase from *P. horikoshii* (EGPh) using the photochemical coupling reaction. An azidophenylalanine-containing endocellulase (20 μM) was first reduced with TCEP to provide the aniline, purified, then irradiated in the presence of 7d. The conversion was measured at 59% by gel densitometry (lane 6) after Coomassie staining. A fluorescent cyclooctyne (shown at right) was used to confirm that the azide group had been reduced during the TCEP step (lanes 2 and 4).

To access more complex substrates, o-azidophenol NHS ester 12 was prepared and coupled to a cyclic RGD peptide (yielding 7b), PEG polymer chains (7c,d), and the 5'-terminus of a 20 nt DNA strand (7e). All of these reagents could be prepared on the benchtop under normal conditions, and were stable for months when stored at −20° C. in the dark. A 5 min exposure of pAF-containing MS2 capsids to 7b (1 mM) in the presence of 302 nm light led to the formation of the expected product in about 25% yield, FIG. 2c. The coupling of pAF-MS2 to PEG substrates 7c and 7d under similar conditions was monitored using SDS-PAGE, followed by staining with Coomassie blue (FIG. 3a). Densitometry analysis indicated that 56% of the monomers had been modified using the 2 kDa polymer, and that 39% were modified using the 5 kDa polymer. These yields are lower than those achieved using aminophenols and external oxidants (perhaps due to the competing coupling pathway described above), but the results nonetheless confirm that useful levels of site-selective modification can be achieved under photochemical control. As a second substrate, an endocellulase from *Pyrococcus horikoshii* (EGPh) bearing a p-aminophenylalanine residue in position 2 was also modified with 7d in 60% yield (FIG. 7).

Figure 8A:
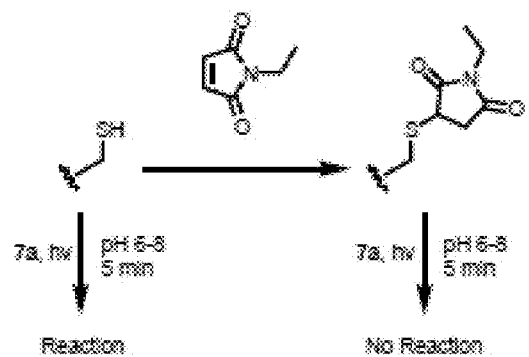
FIGS. 8A and 8B shows cross-reactivity of azidophenols with free cysteine residues. (a) A portion of N87C MS2 was exposed to N-ethylmaleimide (NEM) to cap the cysteine residues. Following this, both the capped and the unmodified N87C MS2 samples (50 μM each) were exposed to 7a and light for 5 min. (b) Spectra for each sample were obtained using ESI-TOF MS.
Figure 8B:
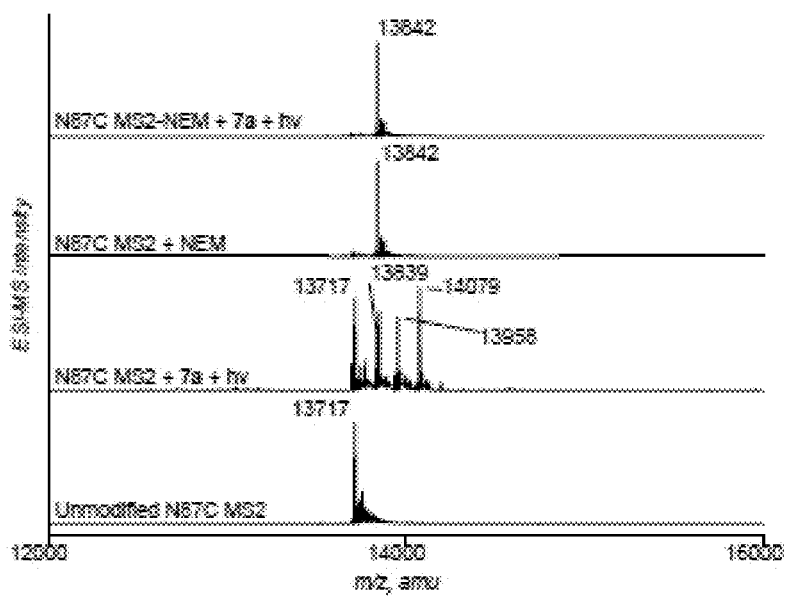
Figure 9A:
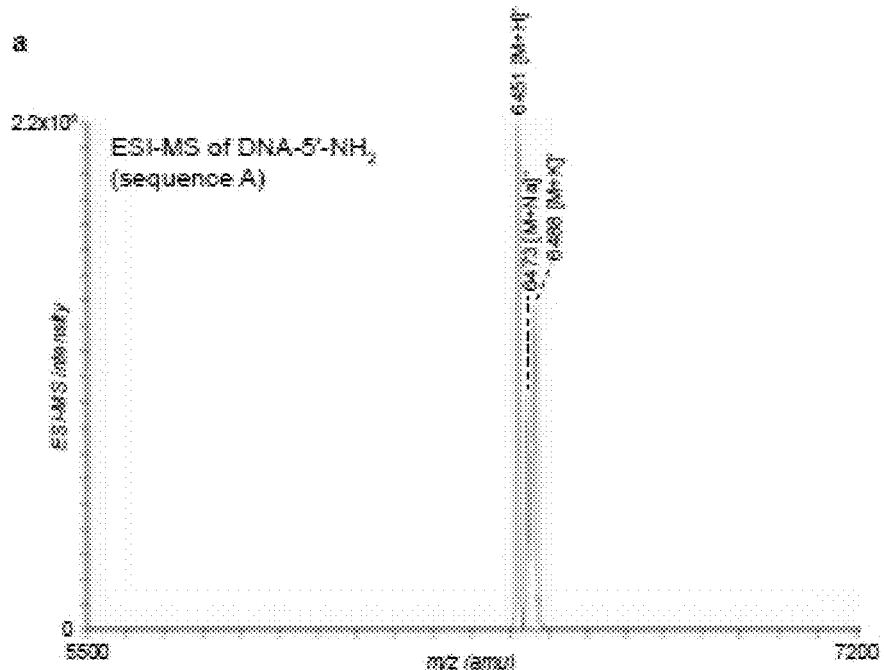
FIGS. 9A and 9B shows characterization of modification of DNA-azidophenol 7d (sequence A). The 5' amine-modified ssDNA sequence A (a) was modified with azidophenol 12 (b), and the extent of modification was measured by ESI-mass spectrometry. Expected m/z for: strand A=6451; 7e-N$_2$=6612.
Figure 9B:
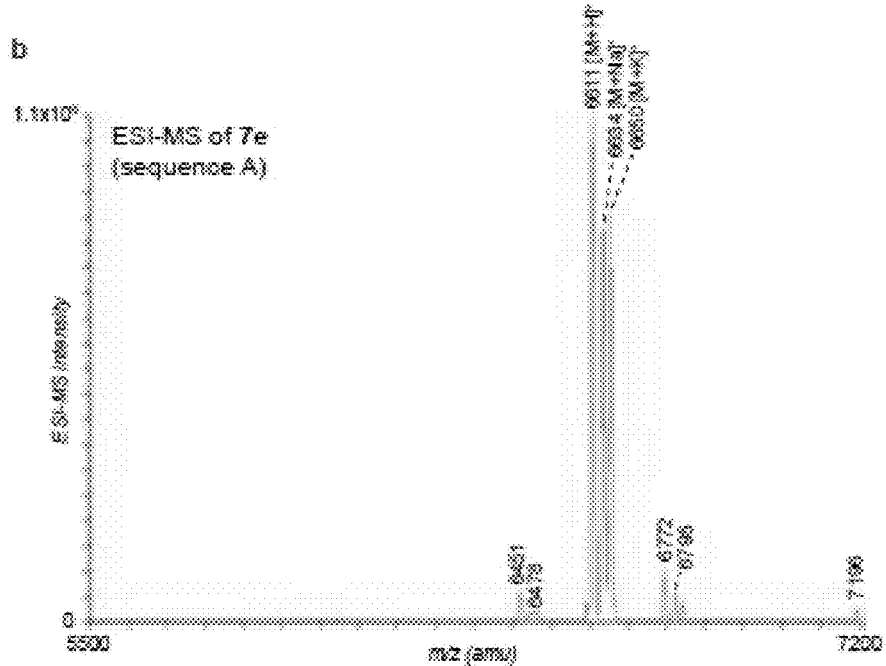
Figure 11A:
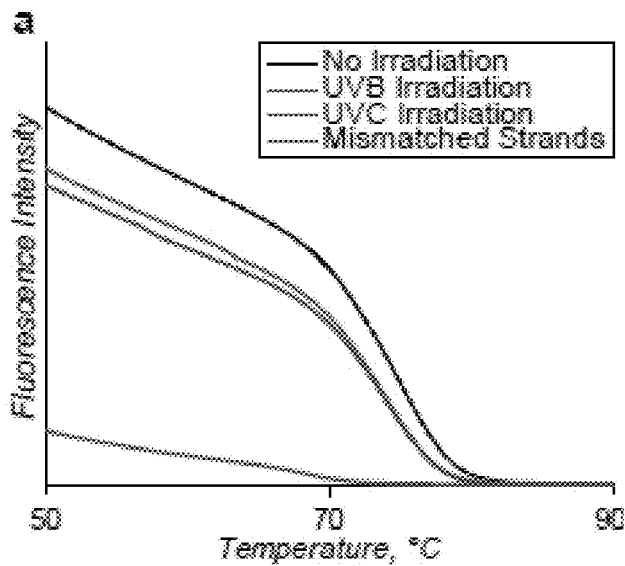
Figure 11B:
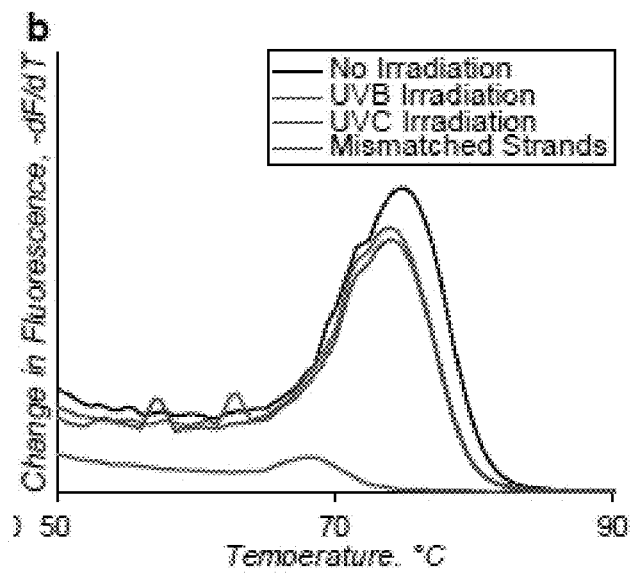
Figure 11C:
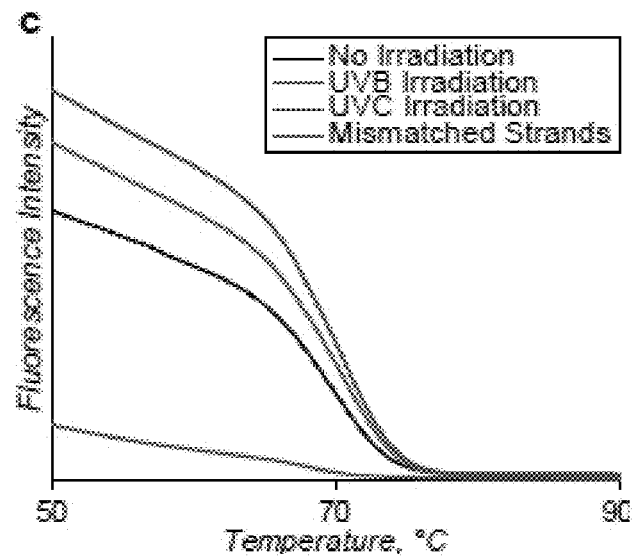
Figure 11D:
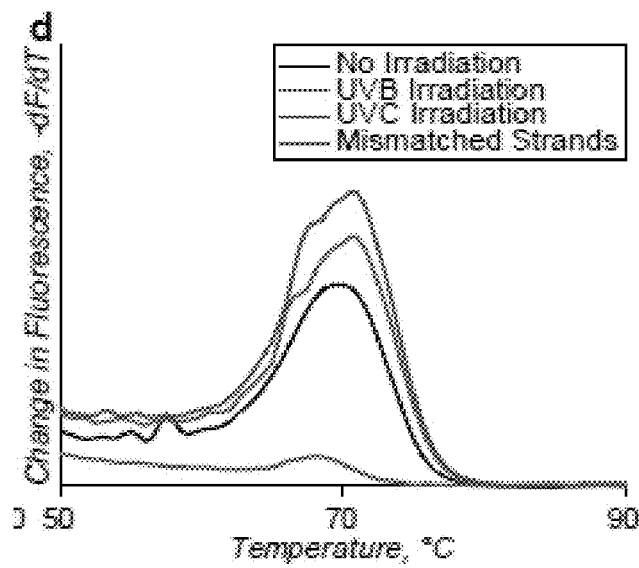
Figure 12A:
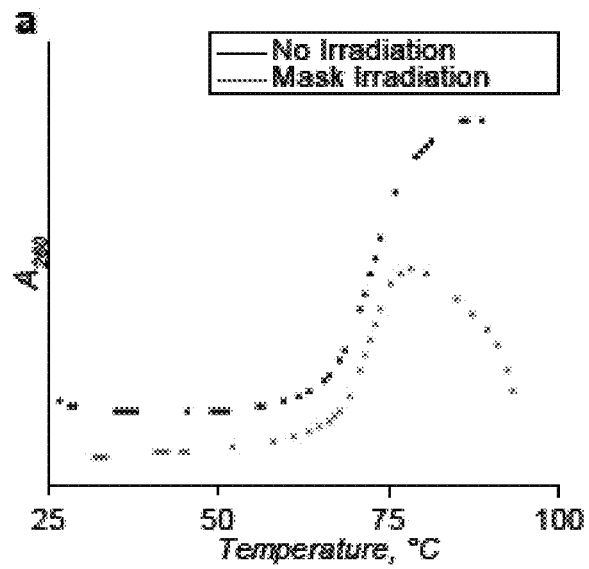
FIGS. 12A, 12B, 12C and 12D shows effects of mask aligner UV irradiation on DNA melting temperature. DNA with sequences A (a, b) and B (c, d) at 4 μM concentrations were irradiated with light from a mask aligner for 70 s in 10 mM bis-tris buffer at pH 7 and 150 mM sodium chloride. The complementary strand in equimolar quantity was then added. The absorbance at 260 nm was monitored over different temperatures from 25-93° C. The absorbance intensity (a, c) and change in absorbance over temperature (b, d) are both shown.
Figure 12B:
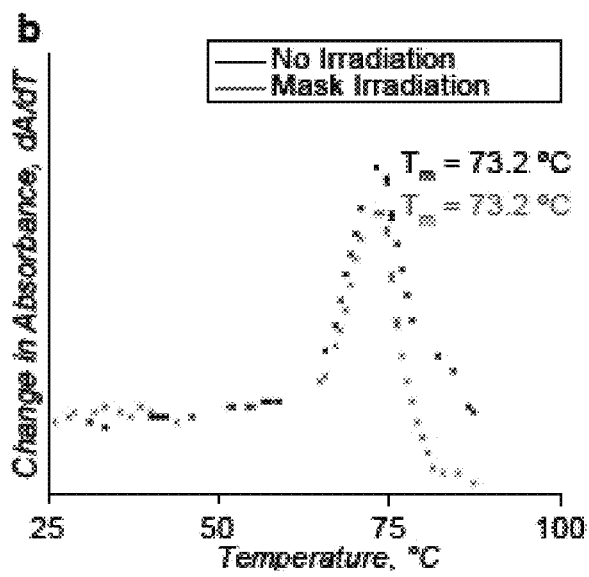
Figure 12C:
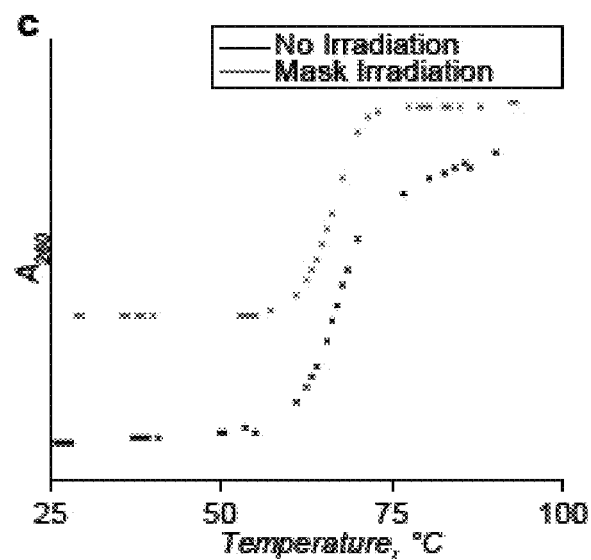
Figure 12D:
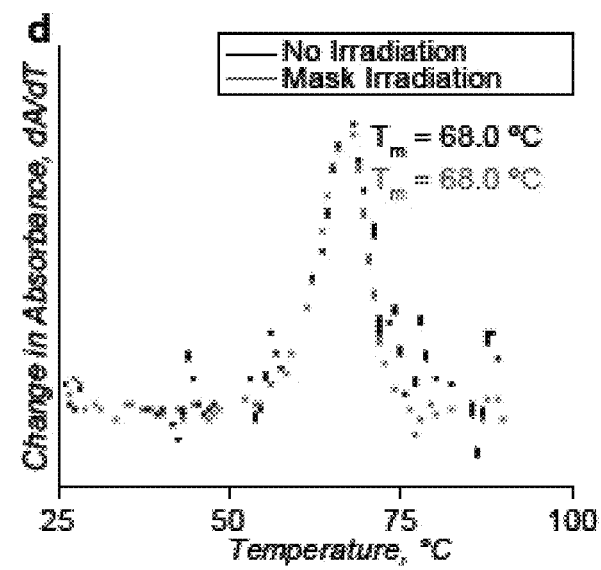

While the experiments above confirm that the reaction is compatible with peptides and proteins containing most amino acids, it was found to be incompatible with free cysteine sulfhydryl groups, as multiple addition products were observed (FIG. 8). However, free cysteines can be capped with maleimides prior to irradiation, preventing further reactivity.

Figure 23A:
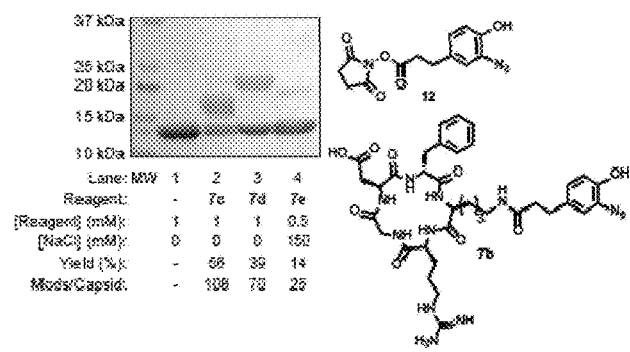
FIGS. 23A, 23B and 23C show modification of anilines with PEG polymers and DNA strands bearing 2-azidophenols. (a) pAF19 MS2 (50 μM in aniline groups) was buffered with pH 6 bis-tris (10 mM) and irradiated for 5 min with 302 nm light in the presence of 7c-7e. (c) Oligonucleotide 7e (sequence B, 500 μM) was irradiated at 302 nm for 5 min with 2.5 mM toluidine. In parallel, unmodified sequence B was subjected to the same conditions but with no aniline, and the reactions were analyzed by MALDI-TOF MS. The peak assignments are: (i) m/z=6602: the expected coupling product of 7e with toluidine; (ii) m/z=6496: 7e after azide photolysis (loss of N2); (iii) m/z=6333-6336: amine-modified sequence B; (iv) m/z=6464 and (v) 6370: abasic analogs of 6e and photolyzed 7e that are typically seen upon MALDI-TOF MS ionization.
Figure 23B:
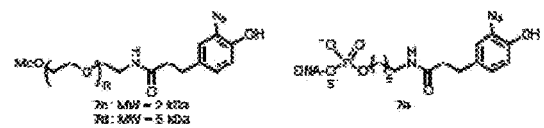
Figure 23C:
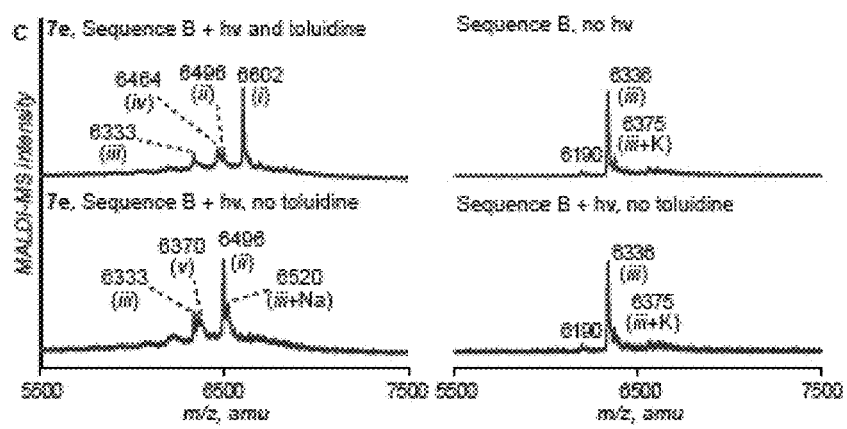

These protein-based experiments demonstrate that the aniline coupling reaction can be photoinitiated and still retain much of the high chemoselectivity, speed, and conversion levels that are characteristic of the parent strategy. To test its compatibility with the DNA strands required for surface patterning, 20 nt ssDNA 7e was first coupled to toluidine. After 5 min of irradiation at 302 nm using a hand-held lamp, MALDI-TOF MS analysis indicated clean conversion to the expected product, FIG. 3c (species i). In the absence of the aniline coupling partner, no reaction was observed other than the loss of nitrogen from the azide group (species ii). The parent DNA strand showed no change in mass upon irradiation under these conditions. Strand 7e was also coupled successfully to MS2 capsids containing pAF groups, as confirmed using an SDS-PAGE gel shift assay (FIG. 23a, lane 4). Densitometry analysis indicated that about 14% of the monomers had participated in the reaction, corresponding to 18 DNA strands on each capsid.

While DNA has successfully been used with primarily long-wave UV light in other applications, the resulting bioconjugates were analyzed carefully as the exposure of oligonucleotides to UV light is known to result in thymine cyclobutane dimers and Dewar valence isomers. Using a combination of dynamic light scattering measurements and SDS-PAGE gel shift assays, it was demonstrated that the DNA-MS2 construct was able to undergo successful hybridization after the photochemical bioconjugation step (FIG. 10). To demonstrate that ability further, the melting temperature of irradiated ssDNA and their complements was shown to be unaltered by the irradiation step (FIGS. 11-12). While particularly problematic sequences, such as poly(T) motifs, may still be incompatible with this technique, these results suggest that a very large number of capture sequences can be used.

Figure 13A:
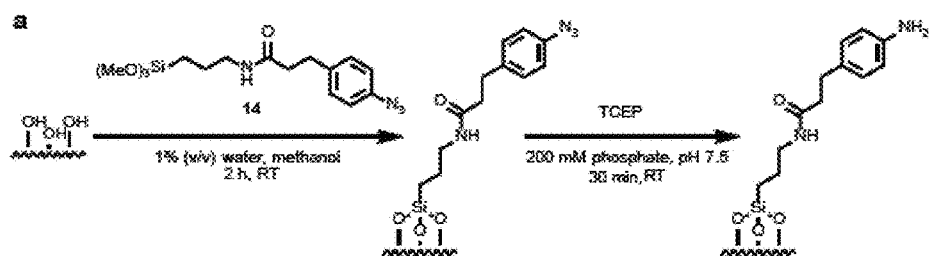
FIGS. 13A and 13B shows aniline-silane patterning with control experiments. (a) A reactive aniline glass surface was generated from the TCEP reduction of glass silanized with 14. Irradiation of the aniline surface spotted with azidophenol DNA 7e resulted in covalent modification of the glass surface with DNA. (b) Three different surfaces were generated in which (i) a film of B-7e was irradiated on the glass, (ii) a film of B-7e was deposited, but not irradiated, and (iii) a film of mismatch sequence A-7e was irradiated. Each surface was then incubated with *S. cerevisiae* modified with sequence B'. All scale bars represent 500 μm.
Figure 24A:
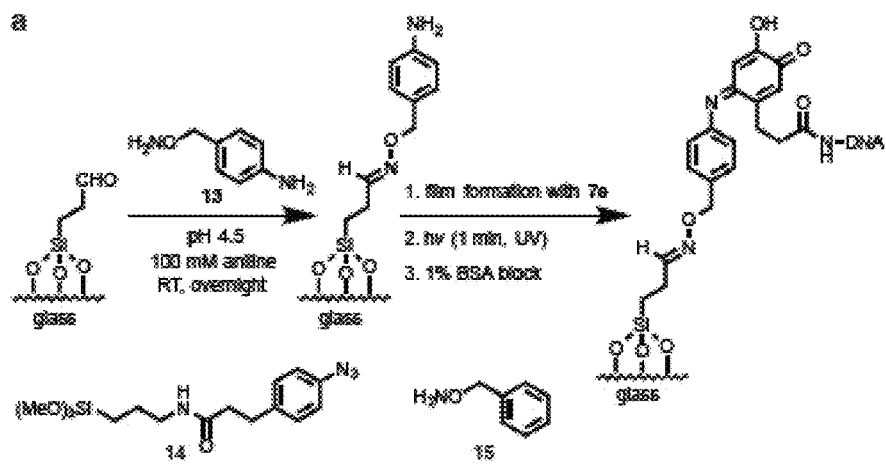
FIGS. 24A, 24B, 24C, 24D, 24E and 24F show cell immobilization via DNA hybridization on glass slides. (a) Aniline-coated glass surfaces were generated starting from aldehyde glass or through treatment with silane 14 followed by a TCEP wash. UV irradiation of the aniline surfaces coated with a thin film of azidophenol DNA sequences yielded covalent modification of the glass surface. (b) After photopatterning, S. cerevisiae modified with a complementary DNA sequence was then exposed to the surface strands to allow hybridization to occur. (c) DNA-labeled S. cerevisiae was exposed to slide surfaces treated with (from left to right) (i) matched sequence 7e and irradiation (positive experiment), (ii) matched sequence 7e without irradiation, (iii) mismatched sequence 7e and irradiation, and (iv) O-benzylhydroxylamine, followed by matched sequence 7e and irradiation. Scale bars represent 500 μm. (d) UV irradiation of dehydrated azidophenol DNA films on aniline glass through a transparent pattern of the Earth, followed by addition of S. cerevisiae and gentle rinsing, resulted in the pattern shown. The dashed line delineates the pattern's edge. (e) An expanded area of a smaller pattern is also shown. (f) The same process was repeated for aniline-glass synthesized via silane 14.
Figure 24B:
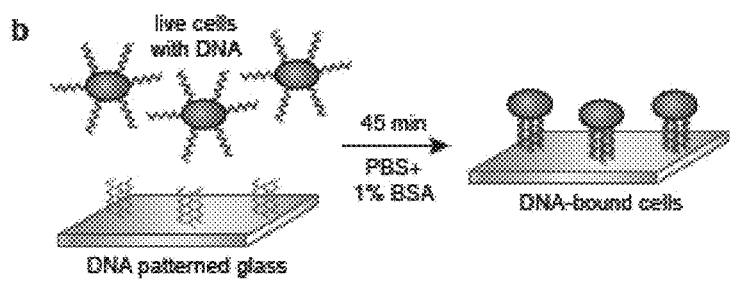
Figure 24C:
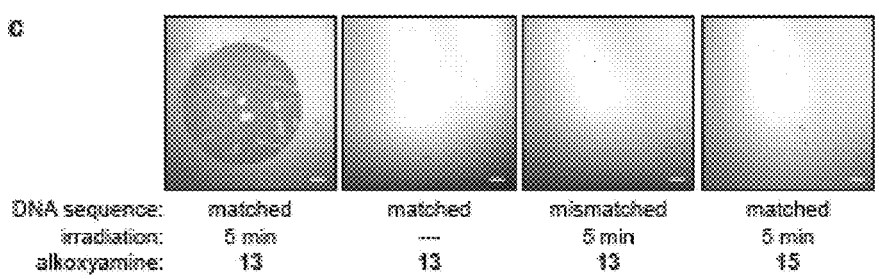

The adaptation of this reaction strategy for the covalent attachment of DNA to surfaces required the development and optimization of four independent steps: 1) the generation of an aniline-functionalized surface, 2) the deposition of a thin film of DNA conjugate 7e, 3) the exposure of selected regions of the surface to light to initiate the reaction, and 4) the development of a rinsing protocol to remove unreacted DNA strands. The requisite aniline functionality was introduced onto glass surfaces using two methods. In the first, aldehyde-silanized glass was exposed to alkoxyamine reagent 13 in the presence of additional aniline (FIG. 24a). In the second approach, freshly plasma-cleaned glass slides were exposed to a solution of phenylazide silane 14 in acidic methanol (FIG. 13A). In the latter case, the azide groups were subsequently reduced using TCEP before use. The final contact angles of the modified surfaces were estimated as 40° in both cases, suggesting the successful formation of the organic monolayer.

Following surface derivatization, a thin film of DNA was then deposited on the surface using a solution of 7e in a 1:1 mixture of water and methanol. The solution was distributed with a 1 cm-thick rectangular piece of polydimethylsiloxane as a spreader, and evaporated to leave a thin layer of DNA. Covalent surface modification was then initiated by ultraviolet irradiation with a mercury arc lamp through a mask with an aligner for 1 min, resulting in DNA patterning only in regions corresponding to transparent regions of the mask. The DNA species that did not react with the surface were then removed by rinsing with a 0.4% aqueous solution of sodium docecyl sulfate, followed by deionized water. The DNA-modified surface was then blocked for 30 min with a 1% solution of bovine serum albumin in Dulbecco's phosphate buffered saline (DPBS) to minimize nonspecific interactions. Subsequent introduction of *Saccharomyces cerevisiae* modified to display the complementary DNA strand 23 allowed for efficient and rapid patterning of cells only on the regions of the slide that were exposed to the light source, as shown in FIG. 24.

Figure 13B:
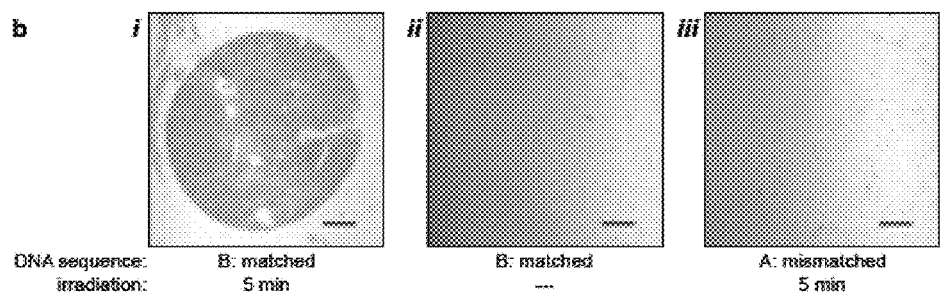
Figure 14:
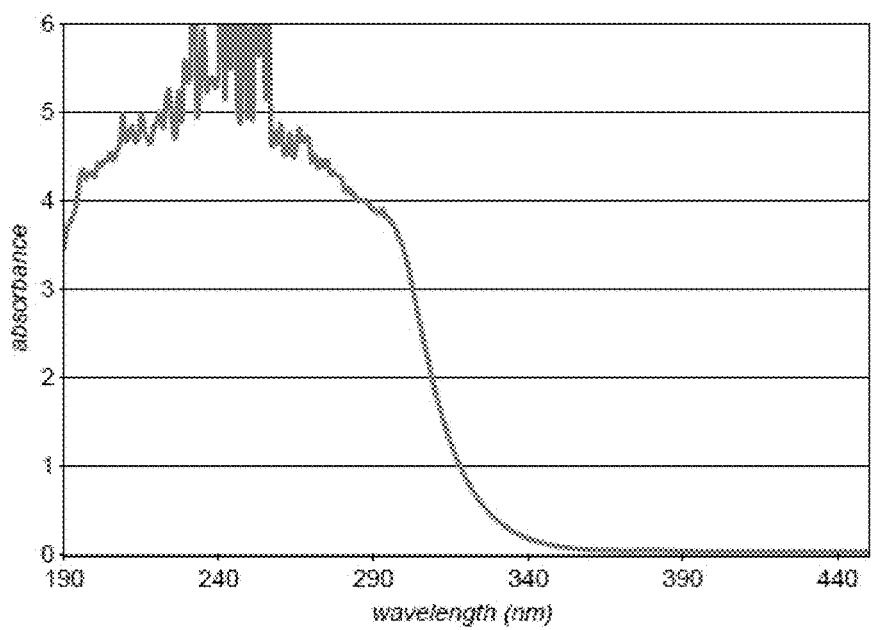
FIG. 14 shows absorbance spectrum of the transparent regions of the patterning masks used in these experiments.

A number of control experiments were performed to confirm the DNA-dependent nature of the patterning (FIG. 24c) Inherent in the experiment described above, no DNA was deposited in the non-illuminated areas, and the unreacted aniline groups did not bind the DNA-coated cells (especially after DPBS blocking). In addition, no patterning was observed after irradiation in the presence of non-complementary strand 7e ("mismatched"), or after the irradiation of glass modified with non-reactive benzylalkoxyamine 15 in place of aniline alkoxyamine 13. Analogous control experiments for glass modified with silane 14 yielded similar results (FIG. 13B).

Figure 24D:
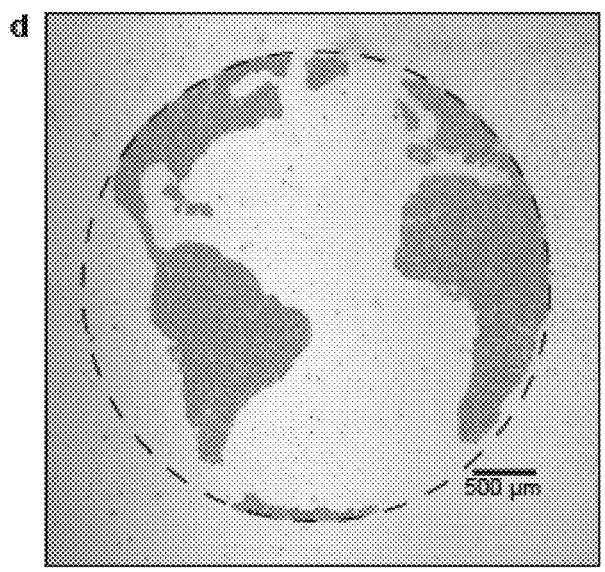
Figure 24E:
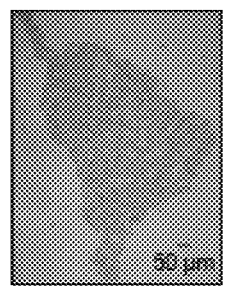
Figure 24F:
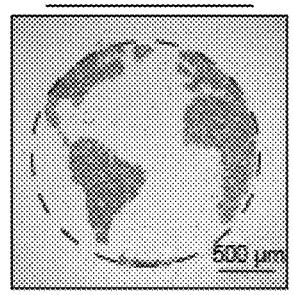

A significant advantage of this approach is the ability to photopattern complex features quickly, as demonstrated by the photopatterning of a map image using a photomask during the irradiation step described above. Importantly, minimal levels of background binding were observed (FIG. 24d). The small feature sizes (<50 μm) and fine details demonstrate the high precision possible with this technique (FIG. 24e). Aniline glass prepared from silane 14 could also be patterned equivalently (FIG. 24f).

The described technique allows for the precise patterning of DNA in less than an hour using a standard mask aligner or UV hand lamp. The simplicity of the technique and synthetic accessibility of the reagents make it a good candidate for widespread adoption and application. The demonstrated use of this method in combination with DNA-mediated cell patterning allows for significantly faster and more precise immobilization of cells with respect to the current state of the art. This UV-initiated reaction provides a robust solution to patterning that is not easily achieved using current techniques, and has great potential for simple and rapid fabrication of spatially resolved, multi-functional surfaces.

In another embodiment, the present invention provides a method for photopatterning a surface, comprises a) contacting the surface with a functionalizing agent under conditions sufficient to form the functionalized surface; b) depositing a layer comprising the reactive component on top of the functionalized surface to provide the modified surface, wherein the reactive component comprises the structure of Formula I,

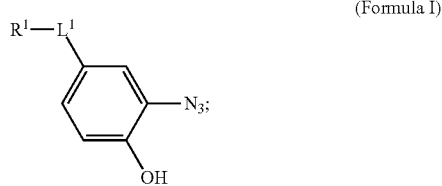
(Formula I)

and
c) exposing the modified surface to ultraviolet radiation to produce a covalently linked structure of Formula II

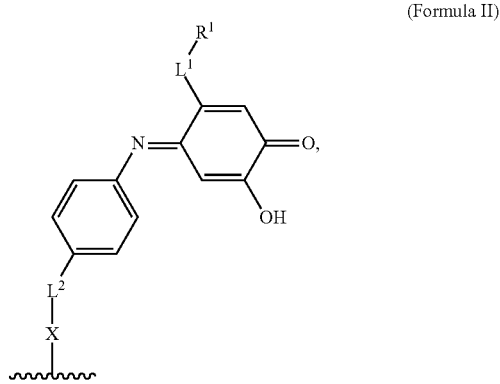
(Formula II)

thereby photopatterning the surface, wherein X is a binding group attached directly to the surface; $R^1$ comprises the polypeptide, the protein, the oligonucleotide, the antibody, the capsid, or a combination thereof; and $L^1$ and $L^2$ are each independently linking groups comprising from one to fifteen carbon atoms, and optionally substituted with one to three heteroatoms selected from the group consisting of oxygen, nitrogen, and sulfur.

In another embodiment, the present invention provides a method of photochemical coupling comprising shining ultraviolet radiation on a mixture comprising a compound of Formula I:

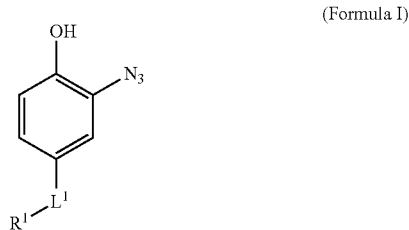
(Formula I)

and at least one compound having the structure

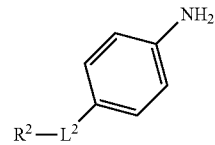

under conditions suitable to produce a compound of Formula IIA,

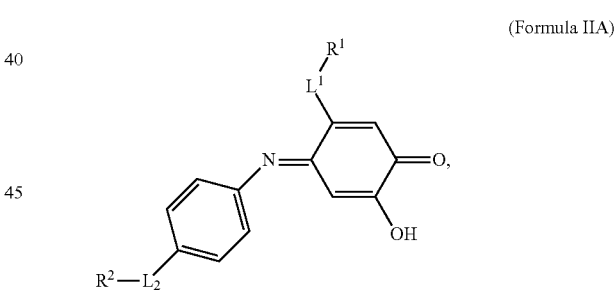
(Formula IIA)

wherein $R^1$ and $R^2$ each independently comprises H, a polypeptide, a protein, an oligonucleotide, an antibody, a capsid, or a combination thereof, wherein at least one of $R^1$ and $R^2$ is selected from the group consisting of a polypeptide, a protein, an oligonucleotide, an antibody and a capsid; and $L^1$ and $L^2$ each independently comprise H or a group having from one to fifteen carbon atoms, and optionally substituted with one to three heteroatoms selected from the group consisting of oxygen, nitrogen, and sulfur.

The surface can be any suitable surface. Representative surfaces include, but are not limited to, glass, plastic, metal, semiconductors, polymers, and combinations thereof. For example, a glass surface can be glass prepared from silicon dioxide and include any additional elements. Semiconductors useful in the methods of the present invention include, but are not limited to, silicon, germanium, and combinations thereof. Other surfaces can include indium-tin-oxide (ITO).

In some embodiments, the surface can be a glass surface. The surface can have the bare native oxide surface, such as Si—OH groups for glass and silicon semiconductors surfaces. Or the native oxide surfaces can be functionalized with suitable groups. Again, Si—OH groups of glass and silicon semiconductor surfaces can be modified with any suitable trichloro-, trimethoxy- or triethoxy-silane (see Gelest chemical catalog). The modifications to the surface can enable reaction between the surface and the functionalizing agent. Alternatively, the functionalizing agent, as discussed below, can include the suitable trichloro-, trimethoxy- or triethoxy-silane group for anchoring to the surface.

Any suitable functionalizing agent is useful in the present invention, where the functionalizing agent is capable of linking to the surface. In some embodiments, the functionalizing agent can have the following formula:

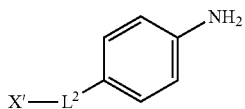

where X' can be absent or an activated binding group. For example, the activated binding group can include a trichlorosilane or trialkoxysilane such as trimethoxysilane or triethoxysilane The binding group can include any suitable group, such as a trichloro-, trimethoxy- or triethoxy-silane, as described above. In some embodiments, X' can be absent and the X'-L$^2$- group can be —CH$_2$ONH$_2$. In some embodiments, X' can be present and the X'-L$^2$- group can be —CH$_2$CH$_2$C(O)NH—(CH$_2$)$_{3-6}$—Si(OMe)$_3$. The linking group L$^2$ can be a C$_1$-C$_{15}$ alkyl, C$_1$-C$_{15}$ heteroalkyl, C$_3$-C$_{15}$ cycloalkyl, C$_3$-C$_{15}$ heterocycloalkyl, C$_6$-C$_{15}$ aryl, or C$_5$-C$_{15}$ heteroaryl.

Accordingly, the functionalized surface can have the structure:

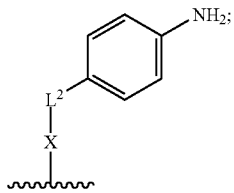

wherein X is a binding group attached directly to the surface; and L$^2$ is a linking group of from one to fifteen carbon atoms, and optionally substituted with one to three heteroatoms of N, O or S. The binding group X is a group capable of anchoring the functionalizing group to the surface. For example, when the surface is glass or a silicon semiconductor, the binding group X can be a siloxane. In some embodiments, the linking group L$^2$ can be a C$_1$-C$_{15}$ alkyl, C$_1$-C$_{15}$ heteroalkyl, C$_3$-C$_{15}$ cycloalkyl, C$_3$-C$_{15}$ heterocycloalkyl, C$_6$-C$_{15}$ aryl, or C$_5$-C$_{15}$ heteroaryl.

In some embodiments, the functionalizing agent comprises the structure

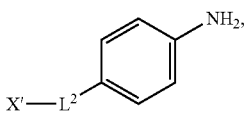

and the functionalized surface comprises the structure:

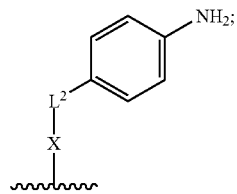

wherein X' is absent or an activated binding group.

Binding group X can be any suitable group for binding to the surface of the present invention. For example, when the surface is glass or a silicon semiconductor, the binding group can include any suitable silane containing group, such as a trichloro-, trimethoxy- or triethoxy-silane. In some embodiments, binding group X comprises a compound having a silane functional group. When bound to the surface and the L$^2$ linking group, the binding group X can have the following structure:

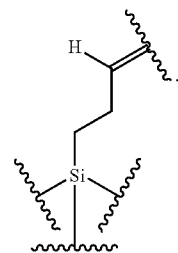 [SMILES: *[Si](*)(*)CCC=*]

In some embodiments, the functionalizing agent can have the structure:

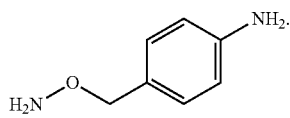

The process of linking the functionalizing agent to the surface can be accomplished under any suitable reaction conditions. For example, the functionalizing agent can be in a mixture having organic solvent, base, buffer, or combinations thereof. Organic solvents useful in the methods of the present invention include, but are not limited to, ethanol, methanol, toluene, ethyl acetate, tetrahydrofuran (THF), chloroform, etc. Bases useful in the methods of the present invention include, but are not limited to, triethylamine, di-isopropyl ethylamine, pyridine, aniline, etc. Buffers useful in the methods of the present invention include, but are not limited to, aqueous acetate buffer. In some embodiments, the functionalizing agent is present in a mixture comprising ethanol, aniline, and aqueous acetate buffer. In some embodiments, the functionalizing agent is present in a mixture comprising ethanol, and aqueous acetate buffer.

The conditions for linking the functionalizing agent to the surface can include any suitable temperature. Suitable temperatures include room temperature.

In some embodiments, the functionalizing agent comprises the structure

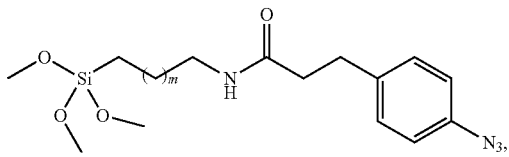

and the functionalized surface comprises the structure

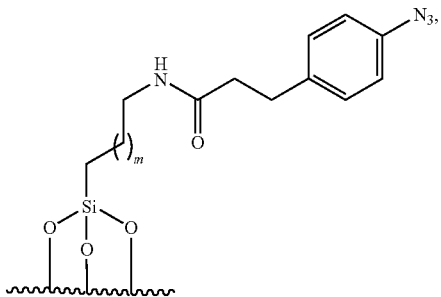

wherein m is an integer from 1 to 3.

In some embodiments, the functionalizing agent comprises the structure

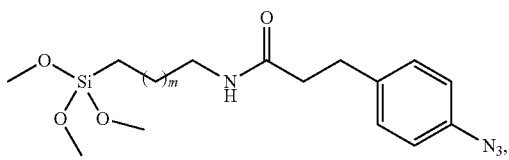

and the functionalized surface comprises the structure

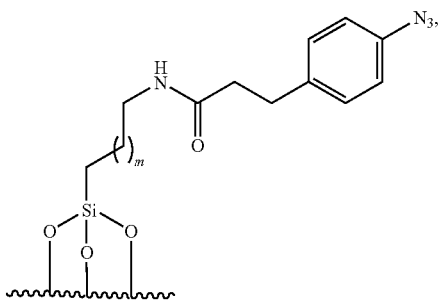

wherein m is an integer from 1 to 3.

The functionalized surface can be further modified prior to depositing the layer of the reactive component. For example, when the functionalized surface has the structure

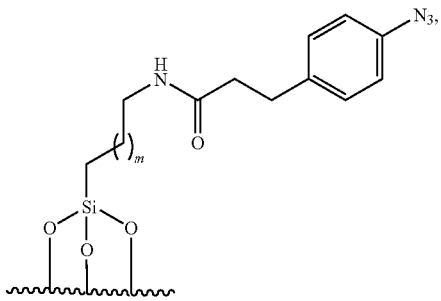

the functionalized surface can be treated with any suitable agent to reduce the azide to an amine. Representative reducing agents include tris-(2-carboxyethyl)phosphine (TCEP). When the above functionalized surface is treated with a reducing agent, the functionalized surface can have the structure:

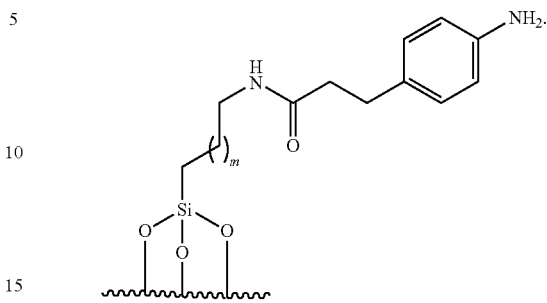

In some embodiments, the functionalized surface is further treated with an aqueous solution comprising tris-(2-carboxyethyl)phosphine (TCEP) prior to depositing a layer of the reactive component, to form the functionalized surface:

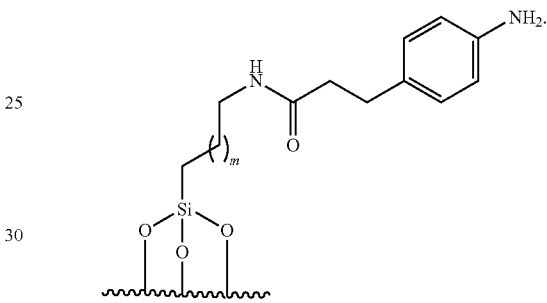

The layer can be deposited by any suitable method such as spin coating, and other methods. The deposition of the layer can form a thin film. In some embodiments, the layer can be a thin film.

The reactive component used in the method of the present invention can have a structure of Formula I:

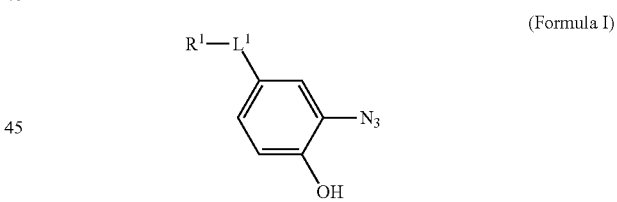

(Formula I)

wherein $R^1$ comprises a polypeptide, a protein, an oligonucleotide, an antibody, or a combination thereof, and $L^1$ is a linking group comprising from one to fifteen carbon atoms, and optionally substituted with one to three hetero atoms selected from the group consisting of oxygen, nitrogen, and sulfur. In some embodiments, the linking group $L^1$ can be a $C_1$-$C_{15}$ alkyl, $C_1$-$C_{15}$ heteroalkyl, $C_3$-$C_{15}$ cycloalkyl, $C_3$-$C_{15}$ heterocycloalkyl, $C_6$-$C_{15}$ aryl, or $C_5$-$C_{15}$ heteroaryl. In some embodiments, $L^1$ can have the structure:

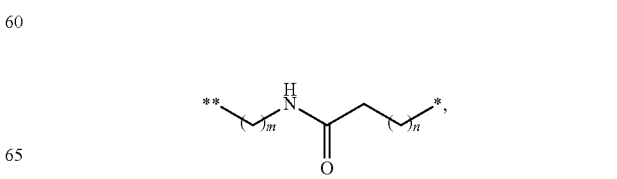

wherein n is an integer from 1 to 3, m is an integer from 5 to 8, wherein * represents the attachment point to

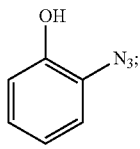

and
wherein ** represents the attachment point of $R^1$. In some embodiments, $L^1$ can have the structure:

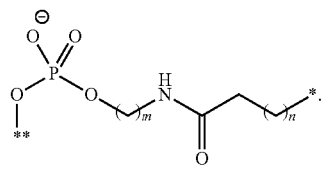

The reactive component can include any suitable biological component for binding to the surface. For example, the reactive component can be a polypeptide, a protein, an oligonucleotide, an antibody, or a combination thereof. In some embodiments, the reactive component can include an oligonucleotide. Any suitable oligonucleotide can be used in the methods of the present invention. For example, the oligonucleotide can include deoxyribonucleic acid (DNA), ribonucleic acids (RNA), or combinations thereof. The oligonucleotides can be single stranded oligonucleotides (ssDNA) or double stranded oligonucleotides. In some embodiments, the $R^1$ of the reactive component can be an oligonucleotide selected from the group consisting of DNA and RNA. In some embodiments, $R^1$ comprises ssDNA.

Other forms of oligonucleotides can also be used in the methods of the present invention. For example, use of CTMA-DNA or other counter ion-DNA complexes for creation of covalently attached DNA films for electronic applications. Cetyl trimethylammonium (CTMA)-DNA complexes and other counter ion-DNA complexes have been applied to form thin films, which are used extensively in the electrical engineering and semiconductor field for applications in electronics, organic electronic devices, optoelectronics/photonics, gel polymer electrolytes, sensing and detection, semiconductor formation etc. Use of the photopatterning technology will allow for covalent attachment of the surfactant-DNA molecules of interest preventing issues like film flaking and allowing enhanced electrical proprieties due to the covalent attachment to the underlying electrode material. It also will add a new level of tunability to the system and ability to easily fabricate incredibly thin and even mono-molecular films, saving material and enhancing device efficiency.

Counter ion content and doping has been seen to directly effect DNA electronic properties. Covalent DNA film formation will allow for ease of exploring the effects of doping in different counter ions in parallel by changing the ion of the covalent DNA film directly vs. formation of an entirely new film created using different counter ions. The photopatterning method can also be used to form films of double stranded, single stranded, or both species of DNA. This platform will also allow for exploration of complex DNA assemblies like those with graphine or other semiconducting molecules.

Use of CTMA-DNA or other surfactant-DNA complexes for patterned nanoparticle synthesis. DNA is used to nucleate the growth of a variety of nanocrystals in the presence of light. Using photopatterning to form the DNA pattern first allows for direct crystal growth on the substrate and ease of patterned nanoparticle formation without lengthy UV irradiation times. It also reduces overall process time, creates a potentially reusable platform, and can allow rapid screening of nanoparticle growth conditions in parallel on one substrate.

Surfactant-DNA complexes are being explored by companies such as Intel, for use in creation of sol-gel DNA blends and DNA-modified sol-gels with and without DNA-templated nanoparticles.

Use of Cetyl trimethylammonium-DNA or other surfactant-DNA complexes for organic synthesis and direct modification of DNA in solution. Chemical modification of DNA is typically performed in aqueous conditions due to the insolubility of DNA in traditional solvents. This limits the scope of reactions that can be applied to functionalize DNA for use in enumerable downstream applications. By creating DNA-CTMA or other surfactant-DNA complexes, an organic solvent-soluble DNA complex is formed resulting in a new method for synthetic modification of the DNA molecules directly in organic solvents like chloroform, THF, methanol, ethanol, methylene chloride, acetone, ethyl acetate. This increases the overall scope of DNA reactivity, product yield, reduces time, and enhances efficiency by eliminating the need for a solid phase synthesis material to introduce the DNA, which increases concentration and DNA solvation. It can be carried out in solution with reactants that are in solution or immobilized on the surface above the organic solvent-soluble DNA.

CTMA-DNA that is synthetically modified can be directly applied for film creation as described above immediately after purification, reducing the time and steps necessary for forming DNA films for electronic applications.

The reactive component can be deposited on the functionalized surface in any suitable mixture. For example, the mixture can include a variety of solvents such as water, methanol, ethanol, or combinations thereof. In some embodiments, the reactive component is present in a solution of water and methanol.

The method of the present invention can include additional steps, such as adding a solvent on the modified surface after depositing the reactive component but prior to the exposure step. Any suitable solvent can be used, such as water, methanol, ethanol, and combinations thereof. The solvent can be deposited on the modified surface by any suitable means, such as spin coating. In some embodiments, the method further comprises adding methanol on top of the modified surface prior to exposing the modified surface to ultraviolet radiation, and distributing the methanol on the surface. In some embodiments, the distributing can be performed by spin coating.

Following deposition of the reactive component, and any additional solvent, the modified surface can then be exposed to ultraviolet radiation to produce a covalently linked structure of Formula II:

(Formula II)

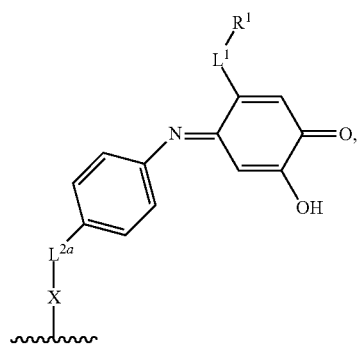

wherein X is a binding group attached directly to the surface; R¹ comprises a polypeptide, a protein, an oligonucleotide, an antibody, or a combination thereof; and L¹ and L² are linking groups as described above. Thus, the modified surface is photopatterned.

The ultraviolet radiation can be at any suitable wavelength in the ultraviolet spectrum, typically from about 100 nm to about 400 nm. Any suitable instrument can provide the necessary ultraviolet radiation, such as a lamp, light emitting diode, laser, and plasma and synchrotron sources.

The exposing step can expose the entire modified surface, or a mask can be used to selectively expose areas of the modified surface where the mask is opaque to ultraviolet radiation. In some embodiments, the method further comprises contacting the modified surface with a mask containing at least one region that is transparent to ultraviolet radiation.

Any other steps can be useful in the method of the present invention. For example, unreacted reactive component, such as when a mask is used, can be removed from the photopatterned surface. In some embodiments, the method further comprises removing unreacted reactive component from the photopatterned surface. The removing can be accomplished by any suitable means. In some embodiments, the removing comprises covering the modified surface with a buffer comprising sodium chloride and sodium citrate; submerging the modified surface in an aqueous solution of sodium dodecyl sulfate or other negatively charged surfactant; agitating the submerged modified surface; rinsing the modified surface with distilled water; and drying the modified surface.

In some embodiments, the method of the present invention comprises: a) contacting the surface with the functionalizing agent having the structure

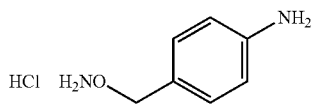

in a solution comprising ethanol and aqueous acetate buffer to provide the functionalized surface comprising the structure:

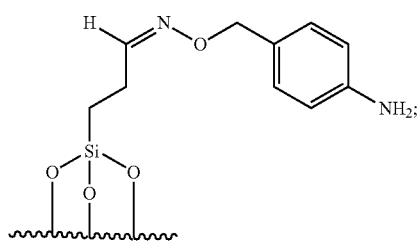

b) depositing the reactive component in a solution of water and methanol on top of the functionalized surface to provide a thin film of the modified surface, wherein the reactive component comprises a structure of Formula III,

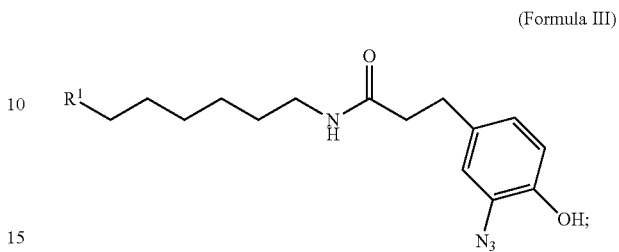

(Formula III)

and c) exposing the modified surface to ultraviolet radiation to produce a structure of Formula IV:

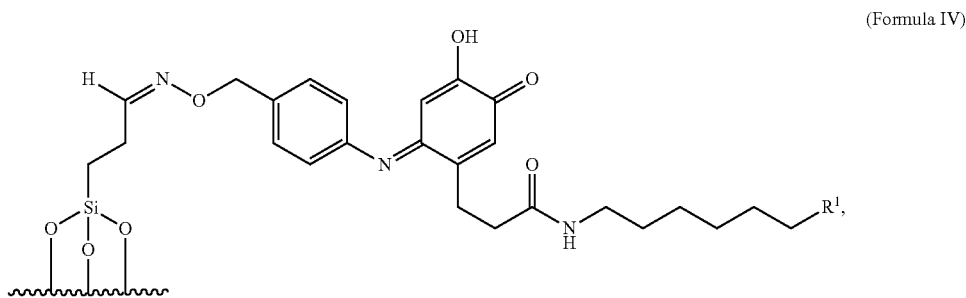

(Formula IV)

wherein R¹ is 5'-TGT GTG TGT GTG TGT GTG TG-3' (SEQ ID NO:1).

In some embodiments, the method of the present invention comprises: a) contacting the surface with a functionalizing agent having the structure

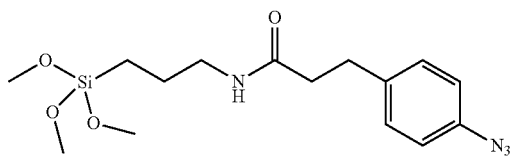 [SMILES: CO[Si](CCCNC(=O)CCc1ccc(N=[N+]=[N-])cc1)(OC)OC]

in a solution comprising ethanol, water, and acetic acid to provide the functionalized surface comprising the structure:

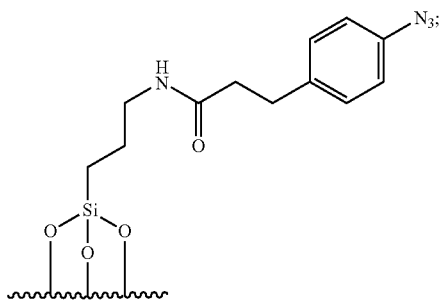

treating the functionalized surface with an aqueous solution comprising tris-(2-carboxyethyl)phosphine (TCEP) to provide the functionalized surface comprising the structure

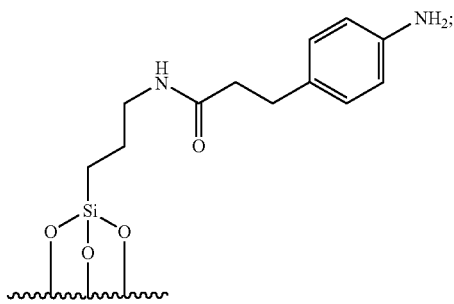

b) depositing the reactive component in a solution of water and methanol on top of the functionalized surface to provide a thin film of the modified surface, wherein the reactive component comprises a structure of Formula III, (Formula III)

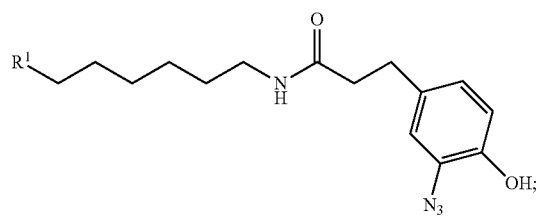

and
c) exposing the modified surface to ultraviolet radiation to produce a structure of Formula V

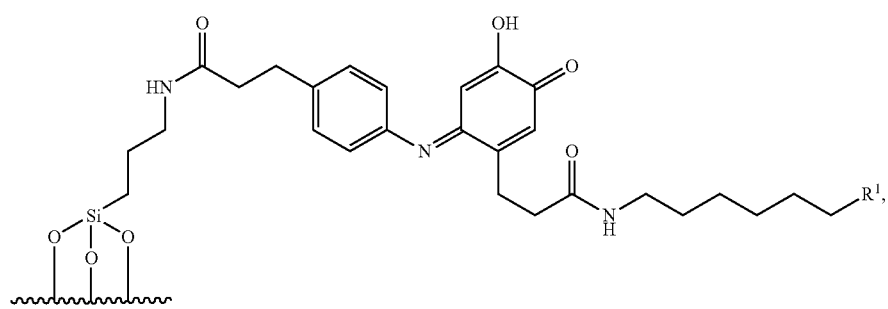

herein $R^1$ is 5'-TGT GTG TGT GTG TGT GTG TG-3'.

In some embodiments, the reactive component comprises a structure of Formula III, (Formula III)

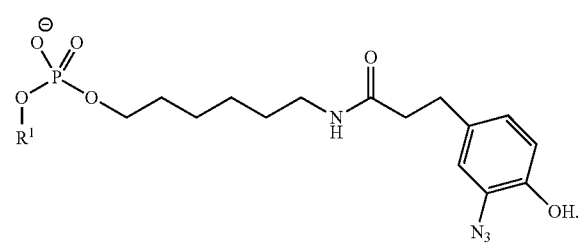

In some embodiments, the method includes exposing a modified surface to ultraviolet radiation to produce a covalent linked structure of Formula II:

(II)

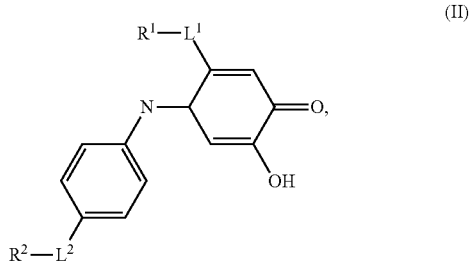

wherein the modified surface comprises a reactive component on top of a functionalized surface, wherein the reactive component has the structure:

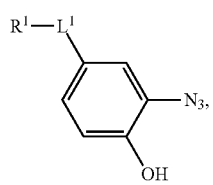

(Formula V)

and the functionalized surface has the structure:

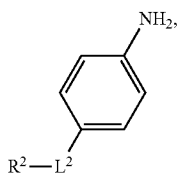

wherein $R^1$ is selected from the group consisting of the polypeptide, the protein, the oligonucleotide, the antibody, the capsid, or a combination thereof, and $R^2$ is the surface, and $L^1$ and $L^2$ are each independently linking groups, thereby photopatterning the surface.

In some embodiments, the method includes exposing a modified surface to ultraviolet radiation to produce a covalent linked structure of Formula II:

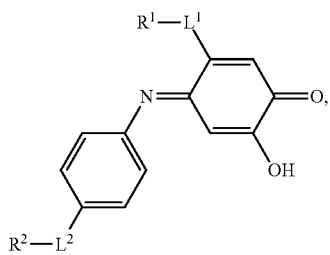
(II)

wherein the modified surface comprises a reactive component on top of a functionalized surface, wherein the reactive component has the structure:

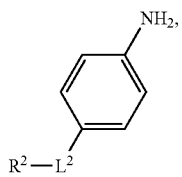

and the functionalized surface has the structure:

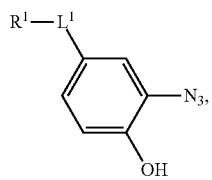

wherein $R^1$ is the surface, and $R^2$ is selected from the group consisting of the polypeptide, the protein, the oligonucleotide, the antibody, the capsid, or a combination thereof, and $L^1$ and $L^2$ are each independently linking groups, thereby photopatterning the surface.

IV. Photochemical Coupling

The present invention provides a method of photochemical coupling by exposing a mixture of a 2-azido-phenol and an aniline to ultraviolet radiation. In some embodiments, the present invention provides a method of photochemical coupling comprising shingin ultraviolet radiation on a mixture comprising a 2-azido-phenol and an aniline under conditions suitable to form a compound having the structure:

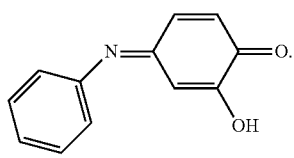 [SMILES: O=C1C=C/C(=N/c2ccccc2)C=C1O]

The 2-azido-phenol and the aniline can be substituted with any suitable substituents, such as, but not limited to, a polymer, a biopolymer, a synthetic polymer, a polypeptide, a protein, an oligonucleotide, an antibody, a capsid, a small molecule, or a combination thereof.

In some embodiments, the present invention provides a method of photochemical coupling comprising shining ultraviolet radiation on a mixture comprising a compound of Formula I:

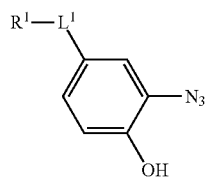
(Formula I)

and at least one compound having the structure

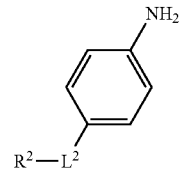

under conditions suitable to produce a compound of Formula II,

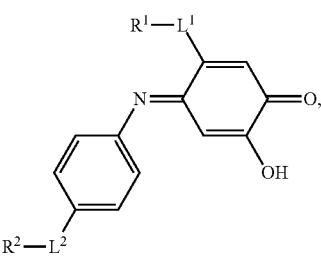
(Formula II)

wherein $R^1$ and $R^2$ are each independently selected from the group consisting of H, a polypeptide, a protein, an oligonucleotide, an antibody, a capsid, or a combination thereof, wherein at least one of $R^1$ and $R^2$ is selected from the group consisting of a polypeptide, a protein, an oligonucleotide, an antibody and a capsid; and $L^1$ and $L^2$ each independently comprise H or a group having from one to fifteen carbon atoms, and optionally substituted with one to three heteroatoms selected from the group consisting of oxygen, nitrogen, and sulfur.

Any suitable polypeptide, protein, oligonucleotide or antibody, as described above, can be used in the method of the present invention.

In some embodiments, $L^1$ comprises the structure

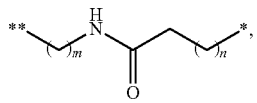

wherein n is an integer from 1 to 3; m is an integer from 5 to 8; wherein * represents the attachment point to

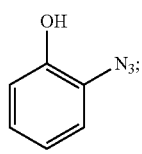

and
wherein ** represents the attachment point of R'. In some embodiments, $R^1$ is ssDNA.

V. Kits

The present invention also provides kits providing components for use in the methods of the present invention. In some embodiments, the present invention provides a kit for photopatterning a surface, comprising a surface; a functionalizing agent capable of reacting with the surface; a source of ultraviolet radiation; and a compound having the structure:

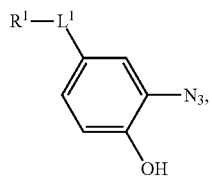

wherein $R^1$ is selected from the group consisting of a polypeptide, a protein, an oligonucleotide, an antibody, or a combination thereof; and $L^1$ and is a linking group independently comprising from one to fifteen carbon atoms, and optionally substituted with one to three hetero atoms selected from the group consisting of oxygen, nitrogen, and sulfur.

The present invention also provides kits providing components for use in the methods of the present invention. In some embodiments, the present invention provides a kit for photopatterning a surface, comprising a surface; a functionalizing agent capable of reacting with the surface; a source of ultraviolet radiation; and a compound having the structure:

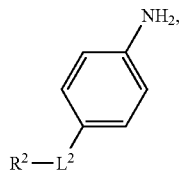

wherein $R^2$ is selected from the group consisting of a polypeptide, a protein, an oligonucleotide, an antibody, or a combination thereof; and $L^1$ and is a linking group independently comprising from one to fifteen carbon atoms, and optionally substituted with one to three hetero atoms selected from the group consisting of oxygen, nitrogen, and sulfur.

VI. Examples

General Methods

Unless otherwise noted, all chemicals were obtained from commercial sources and used without further purification. Oligonucleotides were purchased from IDT DNA (USA) with standard desalting and used without further purification. Analytical thin layer chromatography (TLC) was performed on TLC Silica gel 60 $F_{254}$ glass plates (Sigma Aldrich, USA) with visualization by ultraviolet irradiation at 254 nm. Purifications by flash chromatography were performed using 60 Å, 40-63 μm silica gel (Sorbent Technologies, USA). The eluting system for each purification was determined by TLC analysis. Chromatography solvents were used without distillation. All organic solvents were removed under reduced pressure using a rotary evaporator. Nanopure water used in biological procedures or as a reaction solvent was deionized using a Barnstead NANOpure™ Diamond water purification system (Thermo Scientific, USA). All photochemical reactions were performed in PosiClick™ 1.5 mL polypropylene centrifuge tubes (Denville, USA) and were irradiated using 6 W handheld 302 nm (UVB) UV lamps (UVP, USA) placed directly over the opening to the tube. Aldehyde glass (Thermo Scientific SuperChip aldehyde glass with enhanced surface) was obtained from Thermo Fisher Scientific (USA).

IR. Infrared spectra were recorded from thin film samples on a sodium chloride plate using a Nicolet Magna-IR 850 Spectrometer (Fischer Scientific, USA). Solid samples were acquired using an Alpha-P FTIR spectrometer (Bruker, USA).

NMR. $^1$H and $^{13}$C spectra were recorded on a Bruker DRX-500 (500 MHz, 125 MHz), a Bruker AV-500 (500 MHz, 125 MHz), or a Bruker AV-400 (400 MHz, 100 MHz) spectrometer, as noted. $^1$H NMR chemical shifts are reported as δ in units of parts per million (ppm) relative to $CDCl_3$ (δ 7.26, singlet), dimethylsulfoxide-$d_6$ (δ 2.50, quintet), methanol-$d_4$ (δ 3.31, quintet), or N,N-dimethyl-formamide-$d_7$ (δ 8.03, singlet). Multiplicities are reported as: s (singlet), d (doublet), t (triplet), q (quartet), dd (dou-blet of doublets), dt (doublet of triplets), br (broad) or m (multiplet). Coupling constants are reported as a J value in Hertz (Hz). The number of protons (n) for a given resonance is indicated as nH, and is based on spectral integration values. $^{13}$C NMR chemical shifts are reported as δ in units of parts per million (ppm) relative to $CDCl_3$ (δ 77.2, triplet), dimethylsulfoxide-$d_6$ (δ 39.5, septet), methanol-$d_4$ (δ 49.0, septet), or N,N-dimethyl-formamide-$d_7$ (δ 35.9, septet).

Mass spectrometry. High-resolution electron impact (EI), electrospray ionization (ESI), and liquid chromatography with mass spectrometry detection (LC/MS) were obtained at the UC Berkeley QB3/Chemistry Mass Spectrometry Facility. For protein samples requiring LC/MS analysis, a Phenomenex C18 Jupiter (Phenomenex, USA) with gradient flow was used. Samples were also run on an Agilent 6224 TOF LC/MS (Agilent Technologies, USA) with an Agilent 1260 Infinity Series HPLC system (Agilent Technologies, USA) and a Poroshell 300SB-C18 column (Agilent Technologies, USA). Protein mass reconstruction was performed on the charge ladder with Mass Hunter software (Agilent, USA). Small molecule LC/MS analysis was performed on a Phenomenex C18 Gemini (Phenomenex, USA) with a gradient flow. High-resolution mass spectrometry for small molecules was obtained on a Finnigan LTQ FT mass spectrometer (Thermo Electron Corporation, USA) with an ESI source. DNA analysis was prepared using the protocol of Shah et al. DNA analysis was performed by the QB3/Chemistry Mass Spectrometry facility on a Thermo LTQ orbitrap (Thermo Fisher Scientific, USA) equipped with an ESI source attached to an Agilent Series 1200 LC with a C8 column (100 mm×1.0 mm) from Restek (USA). Matrix assisted laser desorption ionization time of flight mass spectrometry (MALDI-TOF-MS) was performed on a Voyager-DE™ system (PerSeptive Biosystems, USA). Prior to MALDI-TOF-MS analysis, peptide solutions were co-crystallized with an α-cyano-4-hydroxycinnamic acid matrix solution [10 mg/mL solution in a 50:50 water/acetonitrile (MeCN) solution with 0.1% TFA], and dried in vacuo. Oligonucleotide samples were co-crystallized using 3-hydroxypicolinic acid:ammonium citrate solution (45 mg/mL:5 mg/mL in 4.5:5.5 MeCN:Nanopure H$_2$O.

High performance liquid chromatography. High performance liquid chromatography (HPLC) was performed on an Agilent 1100 Series HPLC system (Agilent Technologies, USA). Reversed phase chromatography for small molecules was performed on a Phenomenex C18 Gemini column (5 μm, 150×4.50 mm) (USA). Sample analysis for all HPLC experiments was achieved with an inline diode array detector (DAD) and an inline fluorescence detector (FLD). Monitored wavelengths were 230 nm, 260 nm, and 360 nm. A flow rate of 0.5 mL/min was used. The internal standard p-toluenesulfonic acid was also used. Small molecules were analyzed using the following HPLC method, in which solvent A was water with 0.1% trifluoroacetic acid (TFA) and 0.03% sodium azide, and solvent B was MeCN with 0.1% TFA:

| Time (min) | % Solvent B |
| --- | --- |
| 0 | 15 |
| 20 | 95 |
| 22.5 | 5 |
| 30 | 5 |

Gel analyses. Sodium dodecyl sulfate-poly(acrylamide) gel electrophoresis (SDS-PAGE) was accomplished on a Mini-Protean apparatus from Bio-Rad (USA) with 10-20% TGX polyacrylamide gels (BioRad, USA), following the protocol of Laemmli, et al. All electrophoresis protein samples were mixed with SDS loading buffer containing dithiothreitol and heated to 100° C. for 5 min to ensure reduction of disulfide bonds and complete denaturation unless otherwise noted. Commercially available molecular mass markers, including non-fluorescent Precision Plus Protein™ All Blue Standards (Bio-Rad, USA) or fluorescent Precision Plus Protein™ Kaleidoscope Standards (Bio-Rad, USA), were applied to at least one lane of each gel for calculation of the apparent molecular masses. For fluorescent protein conjugates, visualization was accomplished on a UV backlight. Coomassie staining was performed following the protocol of Studier, et al. Gel imaging was performed on an EpiChem3 Darkroom system (UVP, USA). Native agarose gel electrophoresis (2.5% agarose, 50% glycerol loading buffer, 0.5×TBE running buffer, pH 8.0, 2 h at 40 V, on ice) was also performed. Coomassie staining for native gel analysis was done at RT.

Dynamic Light Scattering (DLS). DLS measurements were obtained using a Malvern Instruments Zetasizer Nano ZS. Samples were filtered through a 0.22 μm centrifugal filter unit (Millipore Corporation, USA) prior to data collection. Data plots are shown as size distribution by volume.

DNA Immobilization on Glass Surfaces. Irradiation was done on an OAI Hybralign Series 200 mask aligner (OAI, USA) with a 350 W mercury arc light source at the Biomolecular Nanotechnology Center. At 365 nm power, lamp intensity varied from 35-40 mW/cm$^2$ with a cutoff below 320 nm.

Microscopy. Images were acquired using a Nikon Eclipse TE2000-U inverted microscope equipped with an Evolution QEi monochrome camera and Image-Pro Express software.

Synthesis of Small Molecules

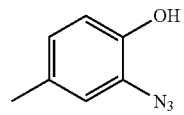
(7a)

2-Azido-p-cresol (7a). A solution of NaNO$_2$ (690 mg, 10.0 mmol) in 3 mL of water was added to a solution of 2-amino-p-cresol previously purified via sublimation (1.230 g, 10.0 mmol) in 50 mL of 2 M aqueous hydrochloric acid. Immediately after the addition of NaNO$_2$, the solution turned dark brown, but the color quickly dissipated to yield a reddish solution. The solution was stirred for 10 min at 0° C. A 1 M solution of sodium azide (11.0 mmol) in 11 mL of water was added dropwise to the flask, causing the solution to evolve gas. The solution was then removed from the ice bath and stirred for an additional hour. The compound was extracted into ethyl acetate, and the resulting organic layer was dried with Na$_2$SO$_4$, filtered, and concentrated to afford a black oil (1.330 g, 89%). IR (thin film): 2956, 2924, 2853, 2113, 1716, 1524 cm$^{-1}$. $^1$H NMR (500 MHz, CDCl$_3$): δ, 6.88 (s, 1H, J=1.2), 6.85 (dd, 1H, J=1.3, 8.3), 6.81 (d, 1H, J=8.2), 5.21 (s, 1H), 2.29 (s, 3H). $^{13}$C NMR (125 MHz, CDCl$_3$): δ, 145.14, 130.92, 126.72, 125.55, 118.78, 115.83, 20.77. HRMS (EI) calculated for C$_7$H$_7$ON$_3$ ([M]$^+$) 149.0589, found 149.0592.

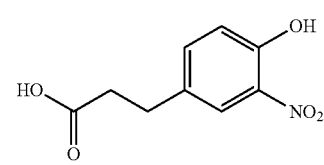
(S1)

3-(4-Hydroxy-3-nitrophenyl)propionic acid (S1). This compound was previously synthesized, and an adapted procedure was followed. A solution of 3-(4-hydroxyphenyl) propionic acid (19.940 g, 120 mmol) in 100 mL of acetic acid was first made. A solution of concentrated nitric acid (7.0 g, 110 mmol) diluted in 100 mL of acetic acid was added dropwise over a period of 10 min. The reaction was stirred for 3 h. To the reaction mixture was added 400 mL of ice water, causing an orange precipitate to form. The precipitate was filtered off and left to dry, yielding 11.463 g of a yellow-orange solid that was taken on without further purification (45%). IR (solid): 3211, 3101, 2977, 2948, 2916, 1709, 1629, 1578. $^1$H NMR (500 MHz, DMSO-d$_6$): δ, 11.18 (s, 1H), 10.15 (s, 1H), 7.74 (s, 1H), 7.41 (d, 1H, J=8.5), 7.04 (d, 1H, J=8.5), 2.78 (t, 1H, J=7.4), 2.52 (t, 1H, J=7.4). $^{13}$C NMR (125 MHz, DMSO-d$_6$): δ, 174.60, 151.43, 137.27, 136.54, 133.13, 125.25, 120.01, 35.92, 29.88. HRMS (ESI) calculated for C$_9$H$_8$O$_5$N$_1$ ([M−H]$^-$) 210.0408, found 210.0413.

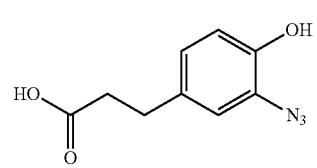
(S2)

3-(4-Hydroxy-3-azidophenyl)propionic acid (S2). To a suspension of palladium on carbon (10 wt % loading, 17.2 mg) in methanol (50 mL) was added S1 (1.046 g, 5.0 mmol). The container was evacuated and refilled with hydrogen gas five times, after which the reaction mixture was stirred under hydrogen at atmospheric pressure for 2 h at RT. The addition of 2 mL of concentrated hydrochloric acid caused the solution to turn blue momentarily, and the palladium on carbon was removed via filtration. A colorless solution resulted. The methanol was removed under reduced pressure, and the resulting reddish solid was redissolved in 75 mL of 2 M aqueous hydrochloric acid. The addition of $NaNO_2$ (385 mg, 5.5 mmol) caused the solution to turn dark immediately, after which the color lightened to a reddish solution. The reaction was stirred for 2 h. A 10 mL solution of 1 M sodium azide (10 mmol) was added dropwise, causing gas to evolve slowly. The reaction was stirred overnight at RT. The reaction mixture was then directly extracted with ethyl acetate. The ethyl acetate layer was washed an additional two times with dilute sodium bisulfite and once with brine. The ethyl acetate solution was dried over $Na_2SO_4$ and the solvent was removed under reduced pressure to afford 905 mg (87%) of a light brown solid that was carried on without further purification. IR (solid): 3418, 3339, 2938, 2874, 2686, 2555, 2109, 1736, 1705, 1681, 1596, 1511. $^1$H NMR (500 MHz, DMSO-$d_6$): δ, 12.10 (s, 1H), 9.86 (s, 1H), 6.84 (dd, 1H, J=2.0, 8.2), 6.79 (d, 1H, J=2.0), 2.77 (d, 1H, J=8.2), 2.68 (t, 1H, J=7.6), 2.46 (t, 1H, J=7.6). $^{13}$C NMR (125 MHz, DMSO-$d_6$): δ, 173.02, 148.58, 132.47, 125.61, 125.24, 120.61, 116.33, 35.45, 29.41. HRMS (ESI) calculated for $C_9H_8O_3N_3$ ([M–H]$^-$) 206.0571, found 206.0575.

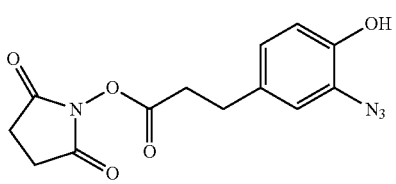

(12)

N-hydroxysuccinimidyl-3-(4-hydroxy-3-azidophenyl) propanoate (12). To a solution of S2 (41.4 mg, 0.2 mmol) in 3 mL of dimethylformamide was added N-hydroxysuccinimide (27.6 mg, 0.24 mmol) and N-(3-dimethylaminopropyl)-N'-ethylcarbodiimide HCl (41.0 mg, 0.21 mmol). The solution was stirred overnight at RT. The reaction mixture was added to 100 mL of 50 mM phosphate buffer at pH 7.2 and extracted with ethyl acetate. The ethyl acetate extract was washed again with a solution of dilute phosphate buffer at pH 7.2 and once with brine. The ethyl acetate was dried over $Na_2SO_4$ and removed under reduced pressure. The residue was redissolved in methylene chloride and purified via flash chromatography using a gradient of 20% to 60% ethyl acetate in hexanes, affording 27 mg of a light brown solid (44%). $^1$H NMR (500 MHz, CDCl$_3$): δ, 6.94 (d, 1H, J=1.7), 6.90 (dd, 1H, J=1.8, 8.3), 6.85 (d, 1H, J=8.3), 5.44 (s, 1H), 3.00 (t, 2H, J=7.5), 2.89 (t, 2H, J=7.5), 2.84 (m, 4H). $^{13}$C NMR (125 MHz, CDCl$_3$): δ, 169.19, 167.89, 146.24, 132.16, 126.13, 125.98, 118.47, 116.28, 33.05, 29.94, 25.72. HRMS (ESI) calculated for $C_{13}H_{11}O_5N_4$ ([M–H]$^-$) 303.0735, found 303.0738.

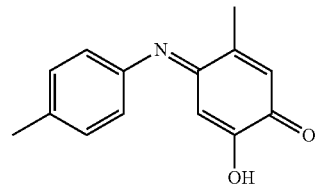

(6a)

(4Z)-4-(p-tolylimino)-2-hydroxy-5-methylcyclohexa-2, 5-dienone (6a). The compound was prepared as described by Behrens et al. The compound was isolated as a purple solid (62%). $^1$H NMR (500 MHz, CDCl$_3$): δ, 7.20 (d, 2H, J=8.0), 6.78 (d, 2H, J=7.9), 6.61 (s, 1H), 6.33 (br s, 1H), 2.37 (s, 3H), 2.35 (d, 3H, J=1.3). A doublet at 2.35 ppm is likely due to allylic coupling, but its coupling partner does not resolve. $^{13}$C NMR (150 MHz, CDCl$_3$): δ, 182.95, 158.70, 153.28, 151.57, 147.93, 135.41, 129.68, 127.46, 120.43, 101.16, 21.12, 18.45. HRMS (ESI) calculated for $C_{14}H_{14}NO_2$ ([M+H]$^+$) 228.1019, found 228.1018.

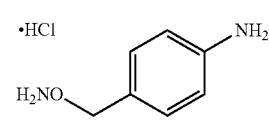

(13)

O-(4-aminobenzyl)-hydroxylamine hydrochloride (13). To 50 mL ethanol was added 110 mg of O-(4-nitrobenzyl)-hydroxylamine hydrochloride (0.63 mmol) and 53 mg of Pt/C (10 wt %, 0.027 mmol). The container was evacuated and filled with hydrogen gas, and the solution was stirred for 5 h under hydrogen at atmospheric pressure. The white solid slowly dissolved over time, yielding a colorless solution with black particulate matter. The material was filtered with a fiberglass filter and ethanol was removed under reduced pressure. During evaporation, the solution changed color from colorless to yellow, leaving 85 mg of a light yellow solid (90%). The solid was dissolved in ethanol and stored at −20° C. before use due to instability. All solutions were used within one month of preparation. IR (thin film): 3329, 3143, 3048, 2939, 2865, 2624, 1614, 1518. $^1$H NMR (500 MHz, DMSO-$d_6$): δ, 7.29 (s, 1H), 7.17 (s, 1H), 7.04 (s, 1H), 6.98 (d, 2H, J=8.2), 6.57 (d, 2H, J=8.2), 4.28 (s, 2H). $^{13}$C NMR (125 MHz, DMSO-$d_6$): δ, 127.93, 114.43, 63.07, 56.07, 18.62.

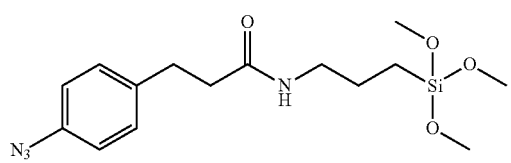

(14)

3-(4-azidophenyl)-N-(3-trimethoxysilylpropyl)propanamide (14). To a solution of 3-(4-azidophenyl) propionic acid (574 mg, 3.0 mmol) in 90 mL of anhydrous THF under positive nitrogen pressure were added DIPEA (0.7 mL, 7.5 mmol, excess) and pentafluorphenyl trifluoroacetate (0.64 mL, 3.75 mmol), which was added slowly over 20 min, resulting in the formation of dense, white fumes. The reaction was stirred for 2 h at RT. To this solution was added 3-aminopropyl trimethoxysilane (0.57 mL, 3.3 mmol), and the resulting solution was stirred under nitrogen at RT for 18 h. The solvent was then removed using a rotary evaporator. After purification by flash chromatography (100% EtOAc), a light yellow oil was obtained (778 mg, 74% yield). $^1$H NMR (400 MHz, DMSO-$d_6$): δ, 7.80 (t, 1H, J=5.7), 7.24 (d, 2H, J=8.7), 7.01 (d, 2H, J=8.5), 3.45 (br s, 9H), 2.98 (q, 2H, J=6.7), 2.79 (t, 2H, J=7.6), 2.34 (t, 2H, J=7.6), 1.39 (m, 2H), 0.50 (t, 2H, J=8.4). $^{13}$C NMR (400 MHz, DMSO-$d_6$): δ, 171.0, 138.5, 136.9, 129.8, 118.9, 50.0, 41.1, 37.0, 30.5, 22.5, 6.0. HRMS (ESI) calculated for $C_{15}H_{24}O_4N_4Si([M+Na]^+)$ 375.1459, found 375.1455.

Synthesis of Azidophenol Derivatives

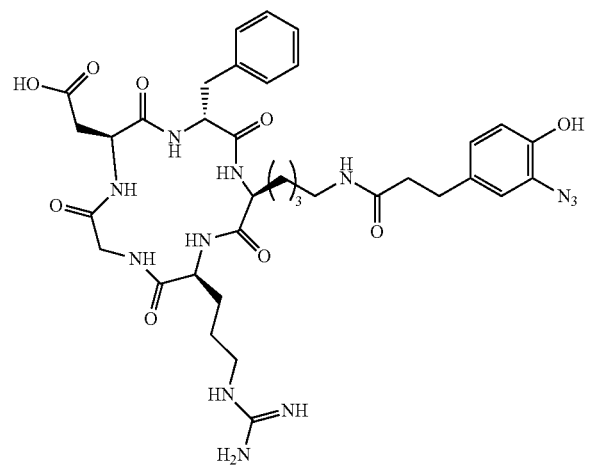

(7b)

Cyclo(RGDfK)-azidophenol (7b). To 184 μL of 50 mM phosphate buffered to pH 8 was added 80 μL of a 50 mM solution of cyclo(RGDfK) peptide (4.0 μmol) in DMSO and 36 μL of a 100 mM solution of 12 dissolved in DMSO. The solution was stirred at RT for 5 h. The reaction mixture was then added to a NAP-10 column equilibrated with unbuffered water and eluted with unbuffered water. Aliquots were taken from eluent fractions and monitored by UV-Vis for the presence of azidophenol. Fractions of interest were then lyophilized, yielding 0.86 mg of a white powder (25%). HRMS (ESI) calculated for $C_{36}H_{49}N_{12}O_9$ ([M+H]$^+$) 793.3740, found 793.3739.

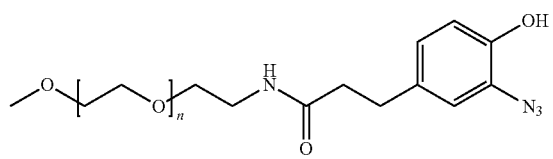

(7c)

2k-PEG-Azidophenol (7c). A 100 mM solution of 12 (120 μL, 0.012 mmol) dissolved in DMSO was added to a solution of 2,000 MW methoxypolyethylene glycol amine (20 mg, 0.01 mmol) in dichloromethane, such that the final volume was 3 mL. The solution was then basified through the addition of a 10% solution of triethylamine in dichloromethane (36 μL, 0.036 mmol triethylamine). The reaction was stirred at RT for 5 h. The solvent was removed under vacuum, and the residue was dissolved in 500 μL of water. This solution was added to a NAP-5 column equilibrated with unbuffered water, eluted with unbuffered water, and directly loaded onto a NAP-10 column. The elution process was then repeated. The eluent was loaded onto a NAP-25 column, and the resulting eluent was lyophilized to yield 16 mg of a white residue (73%). In some instances, the $^1$H NMR spectrum indicated undesired modification that was attributed to formation of phenolic esters. The esters were easily cleaved using sodium hydroxide: To a solution of 7c (20 mM, 182.5 μL, 3.65 μmol) was added sodium hydroxide (3 M, 6 μL) to a final concentration of 0.1 M. The solution stood for 1 h at RT, and then purified using a succession of NAP-5 to NAP-10 to NAP-25 columns equilibrated and eluted with unbuffered water. The resulting eluent was lyophilized to yield 5.8 mg of white solid (73%). The degree of modification was calculated based on absorbance, as listed below (70% azidophenol modification).

(7d)

![structure 7d]

5k-PEG-azidophenol (7d). A 100 mM solution of 12 (120 μL, 0.012 mmol) dissolved in DMSO was added to a solution of 5,000 MW methoxypolyethylene glycol amine (20 mg, 0.01 mmol) in dichloromethane, such that the final volume was 3 mL. The solution was then basified through the addition of a 10% solution of triethylamine in dichloromethane (36 μL, 0.036 mmol triethylamine). The reaction was stirred at RT for 5 h. The polymer product was precipitated with 40 mL of diethyl ether, and the insoluble material was recovered via centrifugation at 14,500 rpm for 30 min. The supernatant was decanted and the precipitate was dried in vacuo and then dissolved in 1 mL of water. This solution was added to a NAP-10 column equilibrated with unbuffered water, eluted with unbuffered water, and lyophilized. The process was repeated twice, yielding 32 mg of a white solid (73%). In some instances, the $^1$H NMR spectrum indicated undesired modification that was attributed to formation of phenolic esters. These could be cleaved using sodium hydroxide (see procedure for 2K PEG, below). The degree of modification was calculated based on absorbance, as listed below (71% azidophenol modification).

Determination of the degree of PEG modification with 12 using UV-Vis spectroscopy. It was determined by NMR that modification of poly(ethylene glycol) with 12 yielded incomplete conversion, and separation of modified macromolecules from starting material using size exclusion techniques was difficult. UV absorption of the azidophenol moiety enabled the generation of a calibration curve based on the absorbance of 7a. Measurements were done in triplicate based on absorbance at 296 nm. The total degree of modification was determined by the calibration curve.

(7e)

![structure 7e]

DNA-azidophenol (7e). Amine-modified A and B (sequences below) were dissolved to 16 mg/mL. Other synthetic oligonucleotides having alternative reactive moieties (e.g., thiol, hydrazide, carboxylate, aldehyde, etc.) can be utilized in addition, or as an alternative to an amine moiety. The reaction conditions for A describe a generalized procedure for the modification of DNA.

```
A:
5' /5AmMC6/ TGT GTG TGT GTG TGT GTG TG -3'
(5AmMC6 = 6-aminohexyl phosphate);
SEQ ID NO: 1)

B:
5' /5AmMC6/ CCC TAG AGT GAG TCG TAT GA -3'
(SEQ ID NO: 2).
```

To a solution of 125 µL of 100 mM pH 8 phosphate buffer was added 125 µL of a 16 mg/mL (2.5 mM) amine DNA solution (0.32 µmol). To this were added 150 µL of DMF and 100 µL of a 0.1 mM solution of 12 (10 µmol) in DMSO. The solution stood for 2 h. This solution was added to a NAP-5 column equilibrated with unbuffered water, and eluted with unbuffered water. The resulting solution was directly loaded onto a NAP-10 column, and the elution process was repeated. The eluent was lyophilized, yielding 1.0 mg of a white solid (50%). The DNA was prepared and analyzed by direct-injection high-resolution LC/MS following the protocol developed by Friedman et al. Integration of the peaks indicated 90% monosubstituted and 6% disubstituted product. MADLI-TOF MS calculated for A ($[M-H-N_2]^-$) 6611.2, observed 6611.4.

Methods for Protein Modification

General method for the modification of proteins for analysis by LC/MS. The reactions were run in a 1.5 mL centrifuge tube. To a solution of protein (5 nmol, final concentration of 50 µM) in buffered water (10 mM buffer of varying pH) was added 7a (from a 100 mM solution in DMSO, 100 nmol, final concentration 1 mM). Water was added to a final volume of 100 µL. The sample was irradiated for 5 min, and a 10 µL aliquot of 200 mM tris(2-carboxyethyl)phosphine (TCEP) (2 µmol, final concentration of 18 mM) was added to the reaction mixture. The resulting solution was vortexed briefly. The quenched mixture was then purified using an Illustra NAP-5 column (GE Healthcare, USA) equilibrated and eluted with de-ionized water. The solution was then spin concentrated with a 100 MWCO Amicon® Ultra-4 Centrifugal Filter spin concentrator (EMD Millipore, USA) and subjected to LC/MS analysis.

Method for testing nonspecific reactivity of azidophenol 7a with cysteine. To a 93 µL solution of 10 µM bacteriophage MS2 mutant N87C in 20 mM pH 7 bis-tris buffer was added 2 µL of a 100 mM solution of N-ethylmaleimide for a final concentration of 2 mM. Protein modification proceeded for 30 min, after which 5 µL of a 200 µM pH 7 TCEP solution was added to the reaction mixture to reduce any disulfides that might have formed. Maleimide formation then continued for 1 h. The solution was then spin concentrated 3 times into 10 mM pH 6 bis-tris with a 100 MWCO Amicon® Ultra-4 Centrifugal Filter spin concentrator (EMD Millipore, USA) and diluted to a final volume of 50 µL. To the solution was added 0.5 µL 7a from a 100 µM stock. The mixture was then irradiated for 5 min, diluted to a volume of 100 µL, and analyzed by ESI-MS as described above.

General method for the reaction of proteins for gel analysis. The reaction was prepared in a 1.5 mL centrifuge tube. To a solution of protein (500 pmol, final concentration of 50 µM) in buffered water (10 mM buffer of varying pH) was added 7c-e (from a 10 mM solution in water, 10 nmol, final concentration 1 mM). Water was added to a final volume of 10 µL. The sample was irradiated for 5 min, and a 1 µL aliquot of 200 mM TCEP (200 nmol, final concentration of 18 mM) was added to the reaction mixture and vortexed briefly. To the reaction mixture was added 3 µL of 6×SDS-PAGE loading buffer. The sample was then boiled and analyzed.

Methods for Non-Protein Biomolecule Modification

Method for testing nonspecific reactivity of azidophenol 7a on peptides. A general description of the reaction follows. The reaction was prepared in a 1.5 mL centrifuge tube. A final solution of 10 µL was made containing 10 mM bis-tris buffered to pH 6. A 0.2 µL aliquot of peptide was taken from a 5 mM solution (1 nmol) and added to the reaction mixture. A 1 µL aliquot from a 100 mM bis-tris solution buffered to pH 6 was added, and a 1 µL aliquot from a 100 mM solution of 7a in DMSO was added, and water was added to a final volume of 10 µL. The sample was then irradiated for 5 min. Reactions were monitored by MALDI-TOF-MS.

Method for testing reactivity of oligonucleotide 7e with aniline. The reaction was prepared in a 1.5 mL centrifuge tube. A final solution of 10 µL was made containing 150 mM NaCl and 10 mM bis-tris buffered to pH 6. A 1 mL aliquot was taken of a 1 mM solution of 7e. A 1 µL aliquot from a 100 mM solution of toluidine in acetonitrile was added, in addition to a 1 µL aliquot from a 100 mM bis-tris solution buffered to pH 6 and 1.5 µL from a 1 M solution of NaCl. The solution was then irradiated for 5 min. Reactions were monitored by MALDI-TOF-MS.

Confirmation of DNA integrity following UV exposure. A series of 5' amine-modified ssDNA-containing solutions was prepared in bis-tris buffer at pH 7, using the parent A and B ssDNA strands at 1 mM (with no azidophenol groups). The samples were irradiated with UV light at either 254 nm or 302 nm for 10 min using a handheld lamp. The complementary ssDNA was then added at the same concentration of the irradiated strands, and the solutions were incubated for 5 min at rt. The solutions were next prepared for analysis by dilution to 1 nM in a 10 mM bis-tris buffer at pH 6 with 150 mM NaCl and 1×SYBR Green I. The key experimental samples, consisting of two complementary strands that would no longer hybridize if damaged, included strands A and B. Controls consisted of analogous combinations of strands that were not irradiated, as well as a mismatched pair (B and A) in which B was irradiated. For each sample, melting temperature analysis was then performed on a iQ5 qPCR (BioRad, USA), with experiments run in triplicate. Fluorescence was monitored at intervals of 0.5° C. over a temperature range of 20-95° C. The binding curves were analyzed using negative first-derivative plots (−F/dT, F=fluorescence, T=temperature), with the melting temperatures identified as maxima of those plots (see Figure S12). No change in melting behavior was observed for the irradiated strands, indicating no damage had occurred during irradiation.

Alternate confirmation of DNA integrity following UV exposure. A series of 5' amine-modified ssDNA stock solutions were made using A, A', B, and B' sequences in pH 7.0 10 mM bis-tris buffered 150 mM saline with a final DNA concentration of 4 µM, verified by absorbance at 260 nm. A 1 mL aliquot of the sequence that used for photo patterning (A' or B) was irradiated for 10 minutes at 302 nm using a UV hand lamp or irradiated for 70 s using the mask aligner UV source through a transparent borosilicate photomask. After irradiation, the ssDNA stocks were mixed 1:1 (v/v) with their complement (A and B' respectively). For comparison, non-irradiated solutions of ssDNA were mixed 1:1 (v/v) with their complement. Absorbance of the samples in quartz cuvettes was measured using a Cary 100Bio UV/Visible spectrophotometer (Agilent, USA) fitted with a 6×6 multi-cell block Peltier series II sample holder. Absorbance at 260 nm was measured at intervals of 1° C. from 25-9° C. A first derivative (dA/dT, A=absorbance) plot was then calculated, with the melting with the melting temperatures identified as maxima of those plots (see Figure S13). No change in melting behavior was observed for the irradiated strands, indicating no damage had occurred during irradiation.

Reaction Characterization Using Small Molecules

NMR Yield Determination. To a test tube was added toluidine dissolved in acetonitrile (16 µL of a 100 mM solution, 1.6 µmol) and 7a dissolved in acetonitrile (50 µL of a 100 mM solution, 5 µmol). The acetonitrile was removed under a stream of nitrogen gas, and the residual oil was redissolved in 895 µL methanol-$d_4$ and 100 µL phosphate-buffered water (100 mM, pH 6). The solution was then added to a borosilicate NMR tube and irradiated for 30 min with UVB lamps in a Luzchem photoreactor (LZC-ORG, Canada). To the solution was added 3-(trimethylsilyl)propane-1-sulfonic acid dissolved in water (DSS, 5 µL of a 100 mM solution, 0.5 µmol) as an internal standard. The yield was determined from the relative integrations of the resonances of product 6a to the trimethylsilyl protons of DSS (~17% yield).

HPLC Calibration Curves. Solutions of all of the products of coupling reactions were made and analyzed via reverse-phase HPLC. Solution concentrations varying from 0.5 mM to 0.025 mM were analyzed by HPLC and their peak areas compared to an internal standard of 1 mM p-toluenesulfonic acid. The peaks in the reaction mixture were compared to these calibration curves to determine concentration.

HPLC Yield Determination. To a 1.5 mL centrifuge tube was added toluidine dissolved in acetonitrile (0.5-1.5 µL of a 100 mM solution, 0.05-0.15 µmol), 7a dissolved in acetonitrile (1.5-0.5 µL of a 100 mM solution, 0.15-0.05 µmol), 18 µL methanol, 10 µL pH bis-tris buffered water (100 mM), and 70 µL Nanopure water. The solution was irradiated for 10 min with shaking after 3 and 6 min. To the solution was added p-toluenesulfonic acid dissolved in water (1 µL of a 100 mM solution, 0.1 µmol) as an internal standard. The samples were then analyzed via reverse-phase HPLC, and the ratio of the area of the product peak in the 260 nm chromatograph to the area of p-toluenesulfonic acid in the 230 nm chromatograph was compared to the standard curve to determine yield. Each condition was run in triplicate.

General method for the reaction of small molecules for LC/MS analysis. The reaction was prepared in a 1.5 mL centrifuge tube. To a solution of p-toluidine (from a 100 mM solution in DMSO, 10 nmol, final concentration 1 mM) in buffered water (10 mM buffer of varying pH) was added 7a (from a 100 mM solution in DMSO, 10 nmol, final concentration 1 mM). Water was added to a final volume of 100 µL. The sample was irradiated for 5 min, and a 10 µL aliquot of 200 mM TCEP (200 nM, final concentration of 18 mM) was added to the reaction mixture and vortexed briefly. The reaction was then filtered using a 0.22µ Ultrafree®-MC Durapore PVDF Centrifugal Filter (EMD Millipore, USA) and analyzed by LC/MS.

Example 1. Surface Modification With DNA

Synthesis of aniline-glass. To a 10 mg/mL solution of 13 (0.025 mmol) in 0.5 mL ethanol was added aniline (47 µL, 0.5 mmol). The solution was mixed with 5 mL of 100 mM pH 4.5 acetate buffer and added to a Petri dish containing a half-slide of aldehyde-glass. The solution was stirred overnight on an orbital shaker. The slide was then removed and rinsed with distilled water, ethanol, and isopropyl alcohol to remove residual reactants. The slide was dried under a stream of nitrogen gas. The aniline-glass was then stored in a desiccator for future use.

Modification of glass slides with 14. Glass slides (Fisherfinest, 25×75×1 mm) were cleaned with either air plasma (Harrick Plasma cleaner, 18 W, 15 min) or in piranha solution (1:3 30% $H_2O_2$:$H_2SO_4$, 2-18 h) then immediately immersed in a solution of 25 mM silane 14 in methanol or ethanol solution containing 1% v/v water and 148 mM acetic acid in a slide staining vessel. The slides were incubated in this solution at RT for 2 h with orbital shaking, after which they were rinsed with a solution of 148 mM acetic acid in methanol or ethanol. The slides were then rinsed with pure ethanol or methanol, and finally dried with a stream of $N_2$. After drying, the slides were cured in an oven at 110° C. for a minimum of 16 h to promote covalent modification of the glass surface. The slides were stored in the dark at RT in a desiccator until the azide groups were reduced to the anilines, as described below. The silanization solution could be reused a minimum of six times with no change in performance if stored at −20° C. between uses.

Reduction of phenylazide glass to aniline glass. Phenylazide slides were submerged in a solution of 50 mM TCEP in 200 mM sodium phosphate buffer at pH 7.5 and incubated at RT with orbital shaking for 30 min. After reduction, the slides were rinsed in Nanopure $H_2O$ and dried with a stream of $N_2$. An increase in the contact angle and the formation of bubbles was indicative of the reduction of the phenylazide to the resulting aniline glass. The aniline glass was stored at RT in a desiccator until use.

Immobilization and patterning of DNA. To a centrifuge tube was added 10 µL of 7e as a 1 mM solution in water. To this were added an additional 10 µL of methanol. The solution was mixed, pipetted on aniline-glass, and spread with a piece of polydimethylsiloxane (PDMS) under a stream of nitrogen gas. An additional 20 µL of methanol was added to the slide, and PDMS was used to distribute the methanol on the surface under a stream of nitrogen gas. The slides were then irradiated through the mask for 60 s (50 mW i-line intensity). The glass slides were then covered in 3×SSC for 15 min to remove additional DNA. The glass was then removed and submerged in a solution of 0.4% (w/v) sodium dodecyl sulfate (SDS) agitated on an orbital shaker for an additional 15 min to further remove DNA. Upon removal, the glass was rinsed with distilled water to remove residual salt and detergent, then dried under a stream of nitrogen gas. The DNA slide was then used immediately for cell patterning.

S. cerevisiae Cell Surface Modification with DNA. Modification of cells with cell walls is described elsewhere by Twite, et al. Briefly, between $1×10^6$ and $1×10^7$ S. cerevisiae cells were suspended in DPBS, pelleted by centrifugation (4000 rpm, Eppendorf Mini Spin Plus) and resuspended in Dulbecco's phosphate buffered saline (DPBS) with 0.5 mM sodium periodate. The cells were oxidized at RT with orbital shaking for 15 min, after which they were pelleted via centrifugation, resuspended in DPBS, pelleted and resuspended two more times, then resuspended in pH 6.0 MOPS buffered 0.5 M saline with 10 mM aniline and 40 µM N-acyl hydrazide DNA (B' sequence with 5' I-linker modification, Integrated DNA Technologies) using a sequence complementary to the B sequence that was photopatterned on the glass surface. The yeast was then agitated for a minimum of 2 h at RT with orbital shaking. The cells were then pelleted by centrifugation and the reaction mixture supernatant was removed and discarded. The yeast was then resuspended in fresh DPBS, pelleted by centrifugation and the supernatant was removed and discarded. The resuspension and pelleting was repeated twice, after which the DNA modified cells were suspended in 1.5 mL DPBS with 1% w/v bovine serum albumin (BSA) before being applied to DNA modified surfaces.

Yeast immobilization on DNA patterned surfaces. Patterning yeast on surfaces displaying complementary DNA has been described elsewhere. Briefly, a square piece of PDMS with the center cut out was reversibly bonded to the glass around the DNA-patterned area using a coat of Gel-Slick™ (Lonza, Basel, Switzerland) on the PDMS. This resulted in the formation of a well on the surface, which was filled with 1% BSA in DPBS for 30 min to block the surface. DNA-modified *S. cerevisiae* in 1% BSA/DPBS were then added to the well and hybridized for at least 30 min. The glass slides were then rinsed via vigorous shaking followed by flowing a stream of DPBS over the surface to remove any nonspecifically-bound cells. The pattern was then imaged, shaken overnight on an orbital shaker, and re-imaged the next day.

Cell Patterning Controls. To ensure that only DNA-modified cells were attaching to complementary DNA that was immobilized via irradiation, a number of controls were run. A solution was made containing 1 µL of 50 mM 7e (either B or A), 1 µL of 100 mM pH 6 bis-tris, 1.5 µL of 1M sodium chloride, and 6.5 µL water. A 5 µL spot of both the A (mismatched DNA) and B (complementary DNA) solution was placed on an aniline-glass slide, and irradiated for 5 min. An additional 5 µL spot was placed on the aniline-glass slide for 5 min in the dark, and the slide was then rinsed with water, stirred for 15 min in 0.4% SDS solution, and rinsed. A solution of *S. cerevisiae* modified with B' DNA was then added to the surface as described above.

Methods for Protein Expression

Production of genome free MS2 capsids. The MS2 capsids with the unnatural amino acid p-aminophenylalanine were prepared and purified as reported. The following purification steps were carried out at 4° C.: First, the cells were resuspended in pH 9.0 taurine buffer, lysed via sonication, and then the cell lysate was centrifuged and the supernatant was loaded on a DEAE-Sephadex column (GE Healthcare). Fractions containing MS2 capsids were combined and concentrated, then precipitated with ammonium sulfate for 30 min. The precipitate was recovered and resuspended, and applied to a Sephacryl-500 column (GE Healthcare). Fractions containing MS2 capsids were combined and concentrated using 100 k MWCO spin concentrators.

Production of *Trichoderma reesei* endocellulase (EGPh). An EGPh-pET24b plasmid encoding endocellulase was obtained from K. Mackenzie. Site-site mutagenesis was performed using the Stratagene Quik-Change® site-directed mutagenesis kit (Agilent, USA) and the following primers, containing the Amber stop codon ("TAG") in the 2 position:

```
N-terminal sense primer (SEQ ID NO: 3):
GATATACATATGGCTTAGACCCTGTTTGGTCAGGTCGTTCCGG C-terminal antisense primer (SEQ ID NO: 4):
CCTGACCAAACAGGGTCTAAGCCATATGTATATCTCCTTC
```

The product was then transformed into XL1-blue super-competent cells via heat shock and the cells were plated on LB agar plates containing 50 µg/L kanamycin. Colonies were grown up overnight and the resulting plasmids were purified using the QIAprep Spin Miniprep kit (Qiagen, Germany) with desired mutations confirmed through sequencing. 50 µg/uL chloramphenicol and 50 µg/L kanamycin. The plasmid was then cotransformed with the pEVOL plasmid containing the p-azidophenylalanine aminoacyl tRNA synthetase into Novagen Tuner (DE3) competent *E. coli* (EMD Millipore, USA).

Cells were grown in LB media containing 50 µg/uL chloramphenicol and 50 µg/L kanamycin for 3.5 h at 37° C., then induced with 0.1 mM IPTG, 0.02% arabinose, and 1 mM p-azidophenylalanine After 20 h of growth, the cells were centrifuged and separated from the media. The following steps were carried out at 4° C.: First, the cells were resuspended in pH 9.0 taurine buffer, lysed via sonication, and then the cell lysate was centrifuged and the supernatant was loaded onto a Ni-NTA column for purification of the His-tagged EGPh (Qiagen, USA). Fractions containing EGPh were combined and concentrated, then buffer exchanged into 10 mM phosphate buffer at pH 7 using 10 k MWCO spin concentrators. Judicious choice of buffer was necessary as the protein had a pI of 5.5. TCEP at 10 mM was incubated with the protein for 1 h to reduce the aryl azide-containing amino acid to aniline. The protein was then buffer exchanged as described above to remove traces of TCEP, which could interfere with the presence of azidophenol.

Example 2. ssDNA Photpatterning

Figure 15:
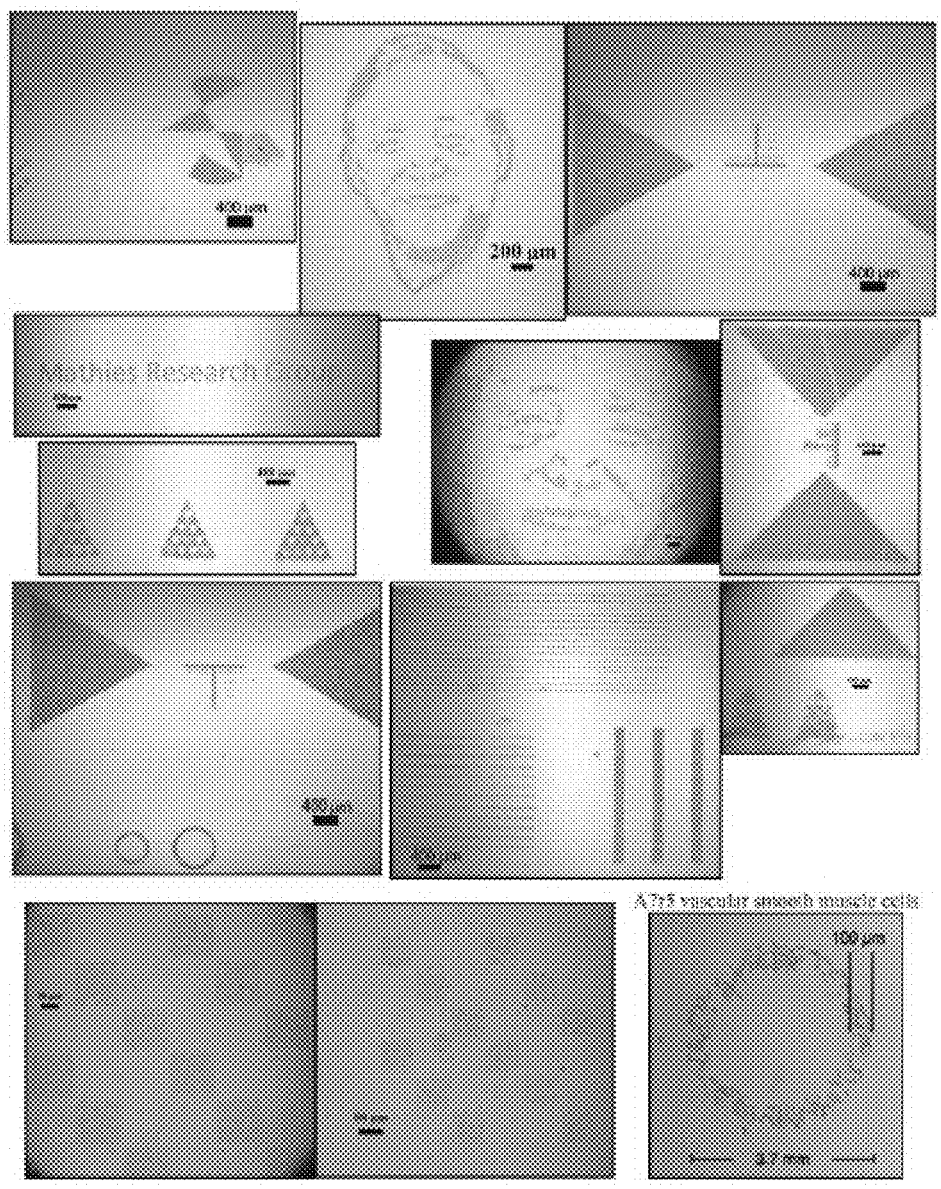
FIG. 15 shows cell immobilization via DNA hybridization on glass slides. UV irradiation of spin cast azidophenol-DNA 7e films on aniline glass synthesized with 14 through a photomask containing a transparent pattern various features, followed by addition of *S. cerevisiae* and gentle rinsing resulted in the pattern shown. The bottom right figure is of vascular smooth muscle cells (Celltracker blue labeled) patterned on aniline silanized glass photopatterned with CTAC-AzPh-ssDNA.
Figure 16A:
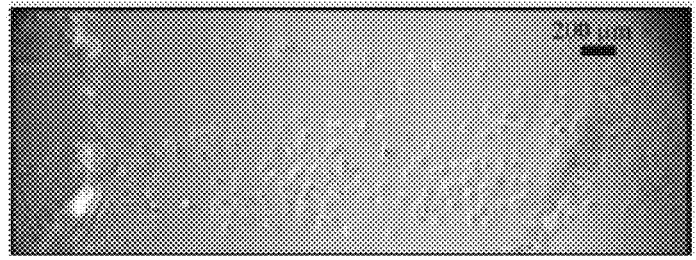
FIGS. 16A, 16B, 16C, 16D, 16E and 16F shows mammalian cell viability and attachment are not perturbed upon DNA-directed immobilization on aniline glass photopatterned with complementary DNA 7e. Phase contrast images of vascular smooth muscle cells (VSMC) in a stripe pattern after 2 h (a) and 3 d (b) static culture in an incubator. Large areas of aniline glass patterned with ssDNA-modified VSMC after 2 h (c) and 3 d (d) static culture in an incubator. Scale bars are 200 μm. (e) Phase contrast image of FITC-labeled VSMC cultured in a 1.5 mm-wide fluidic PDMS channel on fibronectin-coated aniline glass after 4 d. The cells were initially immobilized in the channel using DNA patterning under constant flow conditions. (f) Phase contrast image of vascular endothelial cells (EC) patterned in the same fluidic channel on fibronectin-coated aniline glass after 3 d. Scale bars are 80 μm. In all cases, normal cell attachment and growth was not disrupted by the aniline glass or patterning procedure.
Figure 16B:
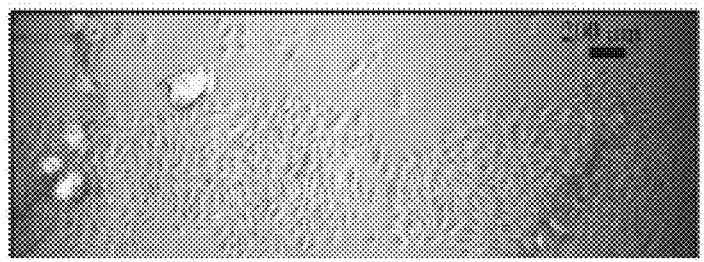
Figure 16C:
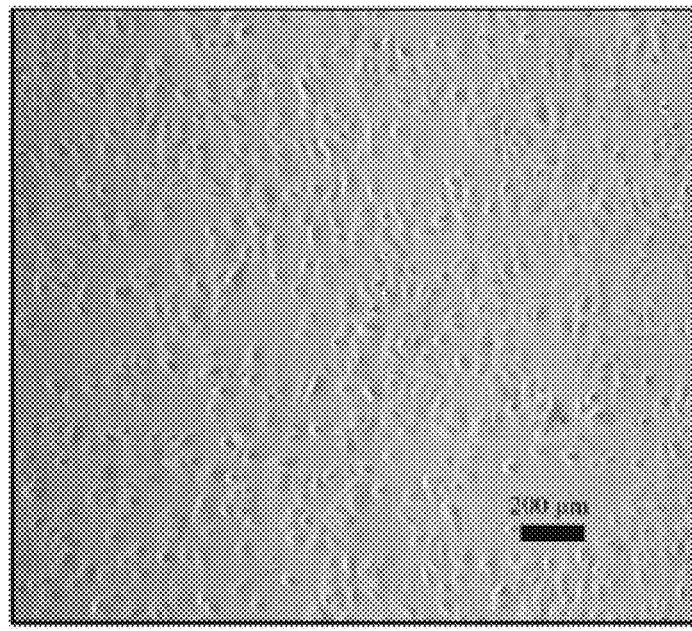
Figure 16D:
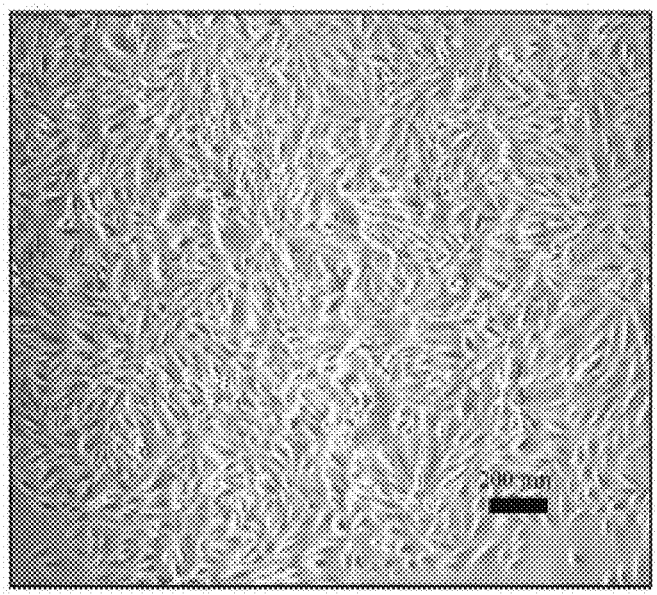
Figure 16E:
Figure 16F:
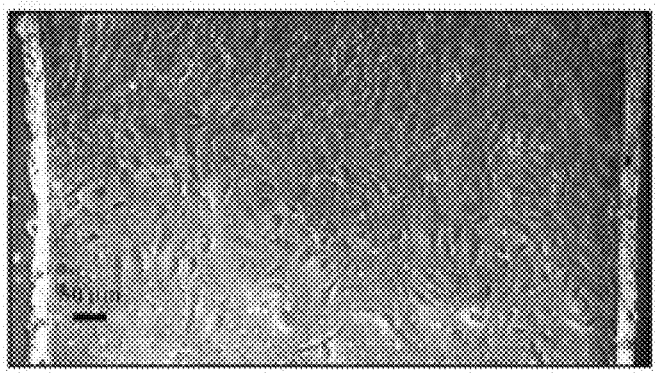
Figure 17A:
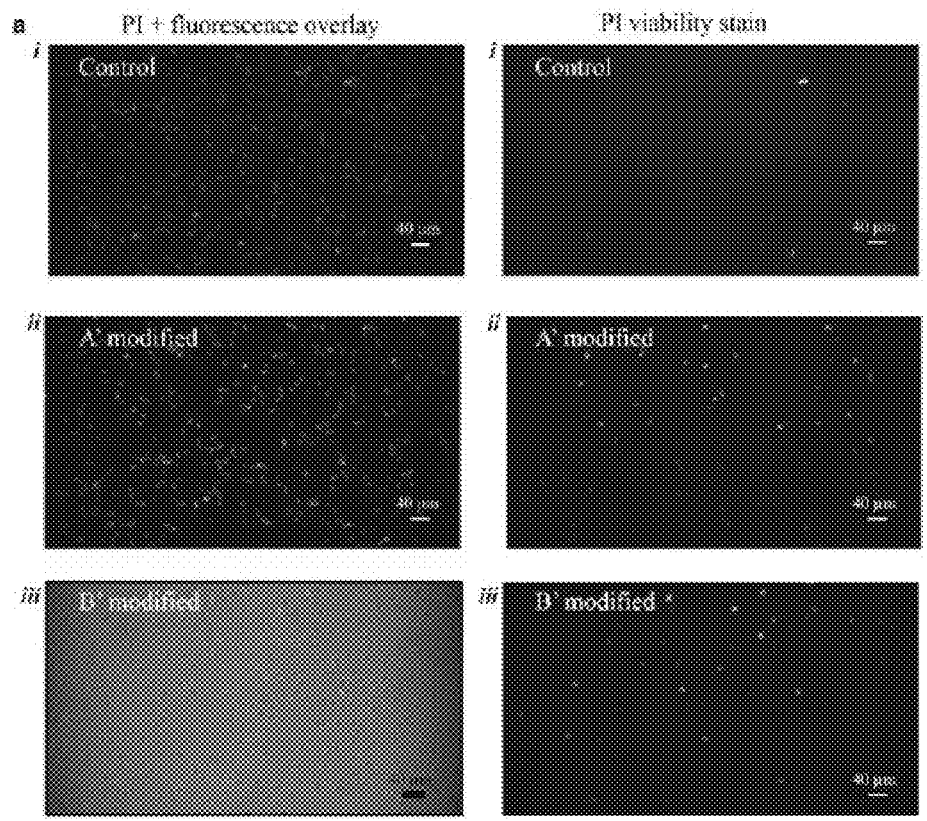
FIGS. 17A and 17B shows viability of S. cerevisiae patterned on photopatterned DNA determined by propidium iodide (PI) staining (a) 20× overlay (false color, left column) or propidium iodide signal (right column) for (i) unmodified S. cerevisiae cells removed from culture (PI and SYTO 24 green labeled), (ii) S. cerevisiae cells modified with A' ssDNA (PI and SYTO 24 green labeled) (iii) S. cerevisiae cells modified with B' ssDNA (PI and Celltracker blue labeled) (b) 10× false color overlay or PI signal of A' (green) and B' (blue) modified S. cerevisiae patterned on photopatterned ssDNA stripes of A and B accordingly. The periodate oxidation step in the cell modification procedure causes a slight decrease in cell viability as seen by the increase in red/PI signal between the unmodified and ssDNA modified cells, indicating damage to/perforation in the cell wall or membrane (a). The act of immobilizing the cells on complementary ssDNA patterns on aniline glass blocked with BSA does not cause a further decrease in viability.
Figure 17B:
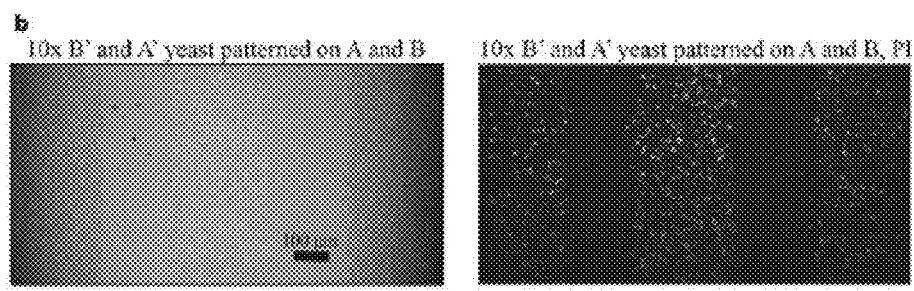
Figure 18A:
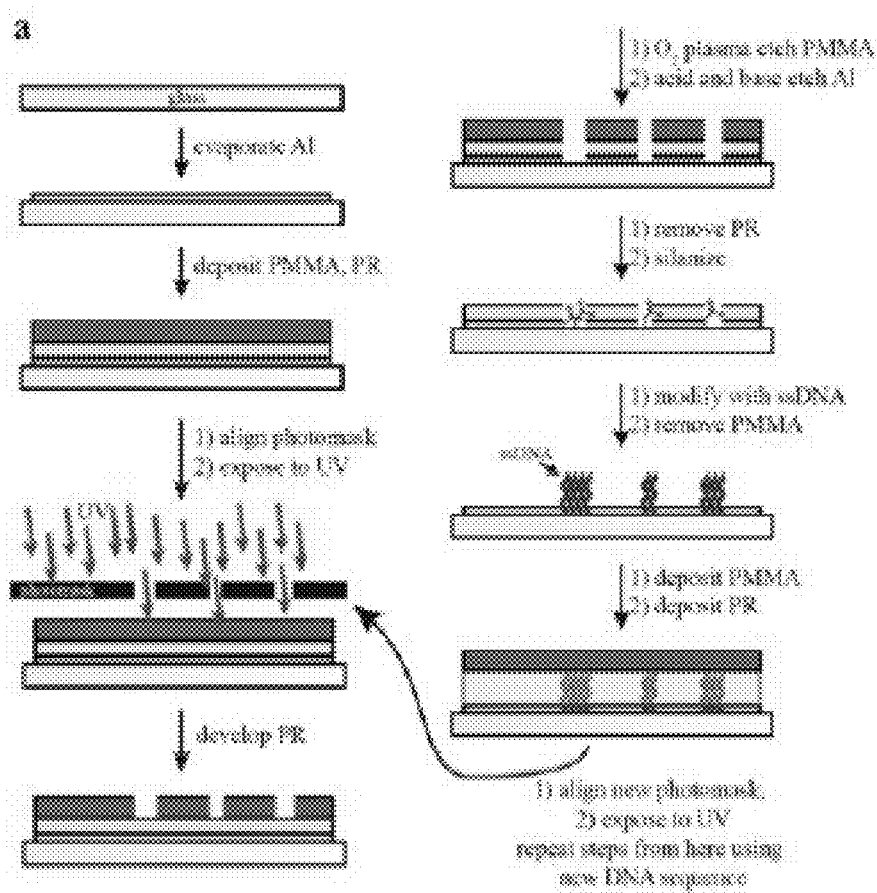
FIGS. 18A, 18B and 18C shows methods for patterning multiple ssDNA sequences on one surface for DNA-directed cell patterning (a) Previously reported method for patterning multiple ssDNA sequences using photolithography. (b) The use of new photo-oxidative coupling to pattern AzPh-ssDNA 7e on surfaces displaying aniline functionality. This new method reduces the time for site-specifically pattering one ssDNA sequence from 7 h to 45 min. Each photomask used to pattern the unique ssDNA sequences is aligned to aluminum features/alignment marks deposited on the glass surface via evaporation prior to silanization. Marks can be deposited through a shadow mask, created by selected removal using a developed photoresist to protect desired features and dissolving the aluminum with an acid or base, or other alternative methods. (c) 4× checkerboard pattern of two sequences created using method (b), distinguished by blue or green fluorophore containing 200 μm×200 μm cell squares. 50 μm wide concentric rings of two different AzPh-ssDNA strands distinguished by blue or green fluorophore labeled yeast. No observable pattern density loss occurs with two parrterning rounds. Finally, a 2× image of the entire pattern made with two different AzPh-ssDNA sequences patterned in succession.
Figure 18B:
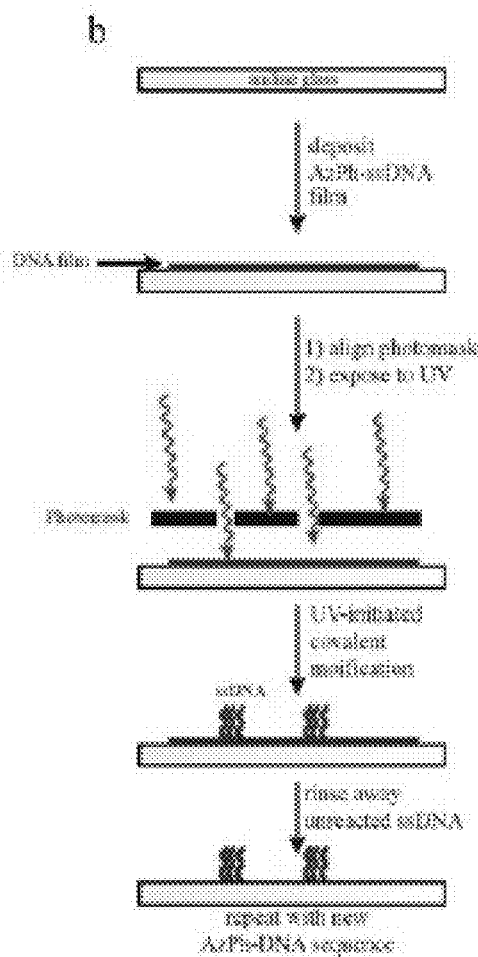
Figure 18C:
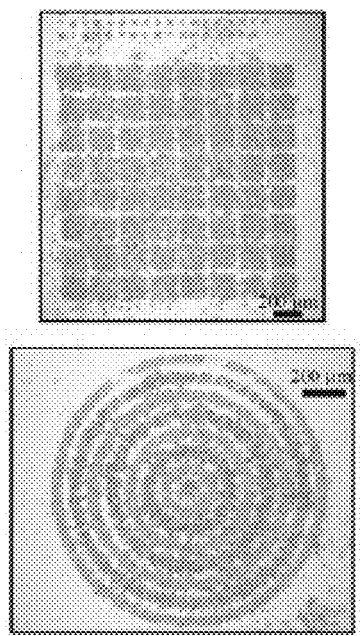
Figure 18C:
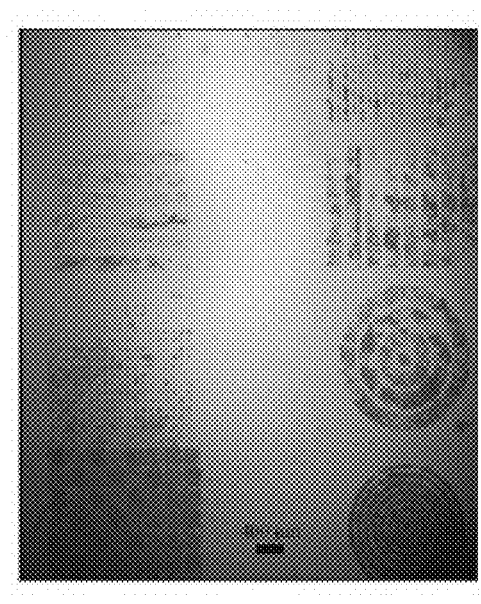
Figure 19:
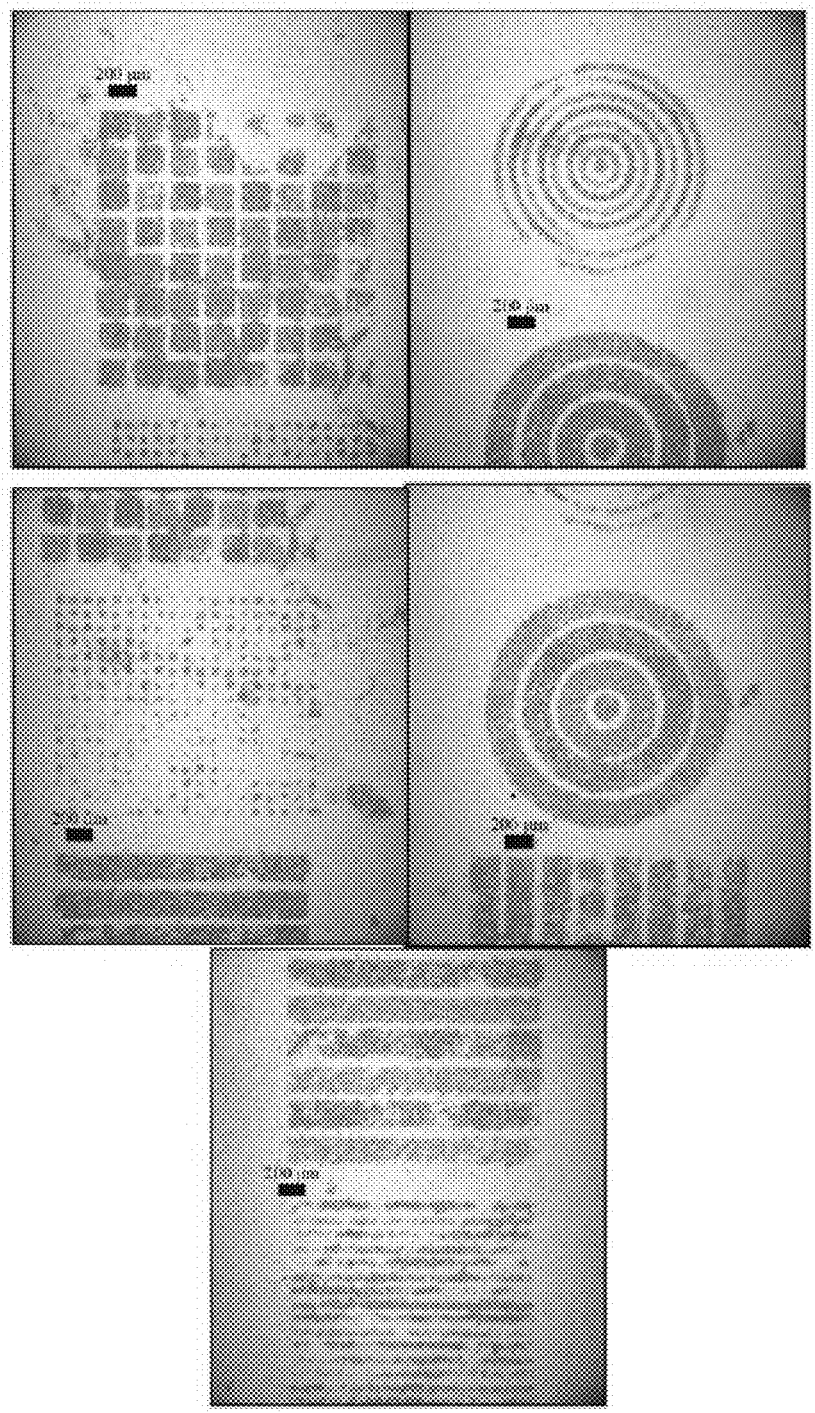
FIG. 19 shows phenylazide glass also appears to specifically photopattern azidophenol ssDNA 7b (a) Phenylazide glass spotted with 5 μM solution of either unmodified B ssDNA, 5'amine B ssDNA or 5'azidophenol B ssDNA 7b and irradiated with a UV handlamp for 5 minutes. After rinsing, the glass was incubated with either B' ssDNA-modified yeast, periodate oxidized yeast, or periodate oxidized yeast that were incubated with 10 mM aniline at pH 6 for 2 hours prior to rinsing and incubation on phenylazide glass. (b) Phenylazide glass photopatterned with 7b sequence poly(A)50 through a photomask. Yeast modified with poly(T)50 sequence and SYTO24 (green) used to visualize the photopatterned ssDNA.

Aniline glass prepared from silane 14 could also be patterned with complex features using a photomask (FIG. 15). By spin casting CTAC-ssDNA films, small and complex features were achieved (<20 µm) with uniform and dense patterning and has the potential to accommodated large area patterning (i.e. 6-inch wafers). Mammalian cells have also been patterned on surfaces photopatterned with AzPh-ss-DNA. The viability of smooth muscle cells (VSMC) has not been perturbed as seen by cell attachment and growth upon incubation and culture of the pattern in medium (FIG. 16). Endothelial and VSMC cell types have also been grown on fibronectin-coated aniline glass in microfluidic devices where DNA-labeled cell localization was directed by photopatterned ssDNA on the surface of the device channel (FIG. 16 e,f). These yeast show no viability reduction upon patterning on aniline glass, as seen by propidium iodide staining. Though membrane permeability is increased slightly after ssDNA modification compared to the unmodified control (FIG. 17), this is a result of the ssDNA modification protocol of yeast and not the immobilization of yeast on aniline glass.

Example 3. Aluminum Liftoff-Based Patterning of Multiple ssDNA Sequences

Prior to the development of direct photopatterning, a modified method of aluminum liftoff was used to create complex ssDNA patterns of multiple sequences on one substrate. This was a laborious process that first involved deposition of 100 nm of aluminum on aldehyde glass slides using thermal evaporation. After metal deposition, the slides were cut into thirds and a thin film of poly(methyl methacrylate) (PMMA) 3.2% w/w in acetone was spin coated on the surface. Following this a 2 µm layer of S1818 positive photoresist was spin coated and soft baked before exposure to 100 mJ/cm$^2$ i-line UV light using a Quintel mask aligner through a photomask (FIG. 18). The photoresist was developed and the underlying PMMA layer was etched using oxygen plasma in a reactive ion etcher. The exposed aluminum was etched using phosphoric, acetic, and nitric acid (PAN) aluminum etchant. Following this, the photoresist was removed and the exposed glass was silanized using chemical vapor deposition (CVD) of neat trimethoxy alkyl aldehyde silane. The aldehyde glass was covalently modified via reductive amination chemistry using amine ssDNA. After a film of the amine ssDNA solution was baked on the aldehyde glass, the resulting imine linkages were reduced in a borohydride solution to form stable secondary amine linkages of the ssDNA on the glass surface.

Before the next round of patterning could begin, the protective PMMA film was removed with acetone. Then the entire process was repeated starting with the deposition of another film of PMMA and S1818. This technique required on average 7 hours of combined lab and cleanroom time, as well as exposure to a variety of potentially hazardous chemicals. Aside from this, the density of ssDNA seemed to decrease by the third sequence of patterning, resulting in lower density of cells captured. The reduced cell patterning density is possibly due to increase in surface debris on the aluminum or glass by the third round of patterning, which resulted in patchy silanization and ssDNA modification.

There is also the issue of inconsistencies in pattern density when modifying large surface area patterns, greater than 20 mm$^2$. These inconsistencies are likely the result of incomplete etching of PMMA and/or aluminum, or flaking of the DNA film off of the surface upon drying, resulting in loss of DNA in the areas where the film flaked off the aldehyde glass. Due to these aforementioned shortcomings upon liftoff-based patterning of multiple sequences on one substrate, there was a substantial need for the development of an improved patterning technique that could allow for consistent and high ssDNA density on any pattern area in substantially less time. There was also a need for UV-activated chemistry technique that provided chemoselectivity and compatibility with photomasking, which was not currently achievable. We believed direct photopatterning via photoinitiated oxidative coupling would overcome these challenges and allow for a new widely applicable tool for creating detailed features consisting of a variety of molecules on the same surface.

Additional embodiments of UV-catalyzed surface patterning of multiple ssDNA sequences. After synthesis, purification and lyophilization, the 5' azidophenol-ssDNA (AzPh-ssDNA) was diluted with water to a concentration of 1 mM AzPh-ssDNA. The AzPh-ssDNA was then transferred to 100% methanol using the phase transfer catalyst hexadecyl trimethylammonium chloride (CTAC). Depending on the ssDNA length, 50 µL of 1 mM AzPh was mixed with 100 µL of 40-200 mM CTAC in water. The concentration of CTAC was equal to that of twice the concentration of phosphate groups in the 1 mM ssDNA solution. After mixing, the CTAC/AzPh-ssDNA precipitate was pelleted via centrifugation. The supernatant was removed and the CTAC-DNA pellet was washed with 1 mL of ice-cold water and pelleted via centrifugation. The supernatant was removed and discarded and the pellet was resuspended in 500 µL methanol for a <100 µM solution of CTAC-AzPh ssDNA. The CTAC precipitation and supernatant removal result in DNA losses and do not provide 100% DNA recovery upon resuspension in methanol, resulting in the solution concentration labeled of "approximately" or "less than." The use of CTAB (the bromide salt of cetyl trimethylammonium) was not explored due to CTAB's limited solubility in water at RT.

In order to pattern multiple sequences on the same glass surface, alignment marks had to be added. These marks would allow for different photomasks could be reproducibly and precisely positioned during multiple rounds of patterning. Alignment marks were created by depositing aluminum through a shadow mask onto microscope slide surfaces. A shadow mask is a thin piece of stainless steel (127 µm thickness) with features cut into it from laser micromachining. The microscope slides were placed on the shadow mask and the assembly was placed in a thermal evaporator. The features that will be deposited on the slides are determined by the shape, size, and location of the holes in the shadow mask. These holes allow aluminum vapor to pass through and deposit on the microscope slides, while protecting the rest of the slide from metal deposition. In hopes of bypassing the metal deposition steps, masks were made that would allow for alignment of multiple masks using the slide edge. Unfortunately this method was not successful for creating features in close proximity with good reproducibility and often resulted in overlapping features.

After alignment mark deposition, the unmodified glass slides were silanized and reduced to create aniline glass. The aniline glass was spin coated with <100 µM CTAC AzPh-DNA in methanol to create a dry, thin film of azidophenol ssDNA. The slide alignments marks were then aligned to alignment mark holes on the first of a series of masks using a mask aligner. After UV exposure, the slide was rinsed with sodium dodecyl sulfate (SDS) to remove unreacted CTAC-ssDNA and dried, which concluded the process of direct photopatterning of AzPh-ssDNA on aniline glass (Figure a4). The entire process was repeated using a new AzPh-DNA sequence and mask. Yeast modified with complementary ssDNA sequences, distinguished using different fluorophore labels, were incubated on the pattern.

After the unbound cells were rinsed away, the pattern formed through photooxidative coupling could be visualized based on the binding patterns of the complementary ssDNA-modified yeast (Figure a4c, a5). The high amount of background binding by the blue yeast in this example is due to non-specific sticking of the CTAC-AzPh-(A')$_5$ ssDNA (100mer of A') after photopatterning and SDS rinsing. Currently, shorter ssDNA sequences and various blocking and rinsing procedures are being tested to reduce background binding such as this. Compared to the photolithography-based patterning method that was used previously, the direct photopatterning method requires far less patterning time and far fewer steps. Direct photopatterning required about 45 minutes per sequence immobilized, compared to 7 hours per sequence for lithography-based methods.

Two different ssDNA sequences have been explored for patterning on one substrate, and these products experienced no loss in pattern density after two rounds of DNA-coating and UV exposure (Figure a4c, a5). With this demonstration, it could easily be envisioned that our photopatterning technique could be repeated as many times as desired, allowing for site-specific immobilization of dozens of different ssDNA sequences on one surface. Furthermore, the oxidative coupling photopatterning method could be expanded to any molecule, enzyme, and small molecule alike, which have been modified to display azidophenol functionality. The aforementioned molecules could be coated on the aniline surface as a dip cast or spin cast films, in a similar method to the AzPh-ssDNA, by solution evaporation on the surface. Films could also be introduced through the creation of a thin liquid layer consisting of a high concentration of the azidophenol-baring moiety. Sandwiching the azidophenol solution between the aniline substrate and a thin piece of borosilicate glass could create a thin liquid layer for photopatterning using contact alignment. Additionally, or alternatively, submerging the glass in a solution of the complementary reactive group, or applying a solution directly over the substrate can allow the reaction to occur in solution. Additionally, or alternatively, pre-irradiating the surface with, e.g., U.V. light and applying a solution of the reactive group can allow for creation of site-specific patters, e.g., without a dry-film formation step. Overall, this new oxidative photopatterning has vast potential to create patterned arrays of small molecules, polymers, and biomolecules (e.g., biopolymers) on the same surface, enabling simultaneous constructions of models consisting of any desired cell type, small molecule, enzyme, polymer, protein, etc. for study on a diverse selection of surfaces.

Additional glass modification protocols are described below.

Phase transfer of AzPh-ssDNA 7e for the creation of spin cast films. After synthesis, purification and lyophilization, the 5' AzPh-ssDNA 7e was diluted with 18.2 MΩ water to a solution concentration of 1 mM 7e. The AzPh-ssDNA was transferred to 100% methanol using the phase transfer catalyst hexadecyl trimethylammonium chloride (CTAC). Depending on the ssDNA length, 50 µL of 1 mM 7e was mixed with 100 µL of 40-200 mM CTAC in water in a 1.7 mL centrifuge tube. The concentration of CTAC was equal to that of twice the concentration of phosphate groups in the 1 mM ssDNA solution. After mixing, the CTAC/7e solution was incubated on ice for 5 minutes and then centrifuged for 3 minutes at 14,500 rpm using an Eppendorf MiniSpin centrifuge. The supernatant was removed and the CTAC-DNA pellet was washed with 1 mL of ice-cold water and centrifuged again for 3 min at 14,500 rpm. The supernatant was removed and discarded and the pellet was resuspended in 500 µL methanol for a <100 µM solution of CTAC-7e. The CTAC precipitation and supernatant removal do not provide 100% DNA recovery upon resuspension in methanol, so this is why the solution concentration is labeled as "approximately" or "less than." It is worth exploring the use of other solvents for spin casting ssDNA films. Methanol was chosen as the casting solvent due to its high rate of evaporation and because the CTAC-ssDNA was not soluble in acetone Alignment mark deposition on microscope slides. Alignment marks were deposited by evaporating aluminum through a custom 127 µm-thick 6 inch diameter shadow mask (Photo Etch Technology) with features cut via laser micromachining. Microscope slides were positioned on top of the mask and held in place with Kapton tape. The assembly was placed in a high vacuum thermal evaporator (NRC, University of California Berkeley Marvell Nanofabrication facility) above a tungsten boat containing 10 g aluminum pellets. After achieving a chamber pressure of $2.0 \times 10^{-6}$ torr, the aluminum was evaporated through the shadow mask using a current of ~180 A to a thickness of 100 nm, measured using a quartz crystal thickness monitor. After alignment mark deposition, the slides were silanized.

Spin coating aniline glass with CTAC-7e solutions. Depending on the size of the area to be patterned, CTAC-7e solutions in methanol were pipetted on aniline glass, spread to make contact with the desired surface area to be patterned. For example, the patterns in Figure a4c and a5 required 20 µL of >100 µM CTAC-7e solution for sufficient film formation. The methanol evaporation was enhanced and the film was cast by spreading for 10 s at 300 rpm and spinning for 50 s at 750 rpm using a Laurell WS-400-6NPPB single-wafer spin coater. After this the slides were photopatterned using a mask aligner.

Photopatterning aniline glass with CTAC-AzPh-ssDNA 7e using a contact aligner. The CTAC-7e coated glass containing alignment marks was aligned to identical alignment features in a Mylar photomask adhered to a borosilicate dummy mask. The holes in the mask were aligned with the aluminum features on the slides using camera/microscope assistance to assure optimal alignment accuracy. After aligning, the mask and substrate were brought together using vacuum contact and exposed to 30-40 mW/cm$^2$ i-line UV for 60 s. After exposure, the glass was immediately rinsed as follows.

Post-photopatterning rinse procedure. After UV exposure, the unreacted CTAC-7e film was removed by rinsing the slide in 40 mM sodium dodecyl sulfate (SDS) for 10 minutes with orbital shaking in a slide staining vessel. After this the slide was rinsed in DPBS for at least 5 minutes, followed by a water rinse and drying under a N$_2$ stream. Once dried, the aniline glass displaying one ssDNA sequence pattern was returned to the spin coater for the addition and photopatterning of a new sequence of CTAC 7e.

Optional blocking method. In hopes of reducing background binding, 100 µM azidophenol-3 kDa polyethylene glycol (PEG), synthesized using commercially available amine-terminated (PEG) and 12, was pipetted as a bulk aqueous solution over the ssDNA-patterned aniline surface. The entire slide and solution was illuminated using a hand-held UV lamp for 5 minutes. Qualitatively, this did not appear to reduce background binding compared to the non-PEG modified surface. Currently, the use of different PEG sizes, solution concentrations, and UV illumination times are being further explored in hopes of reducing background binding.

Figure 20A:
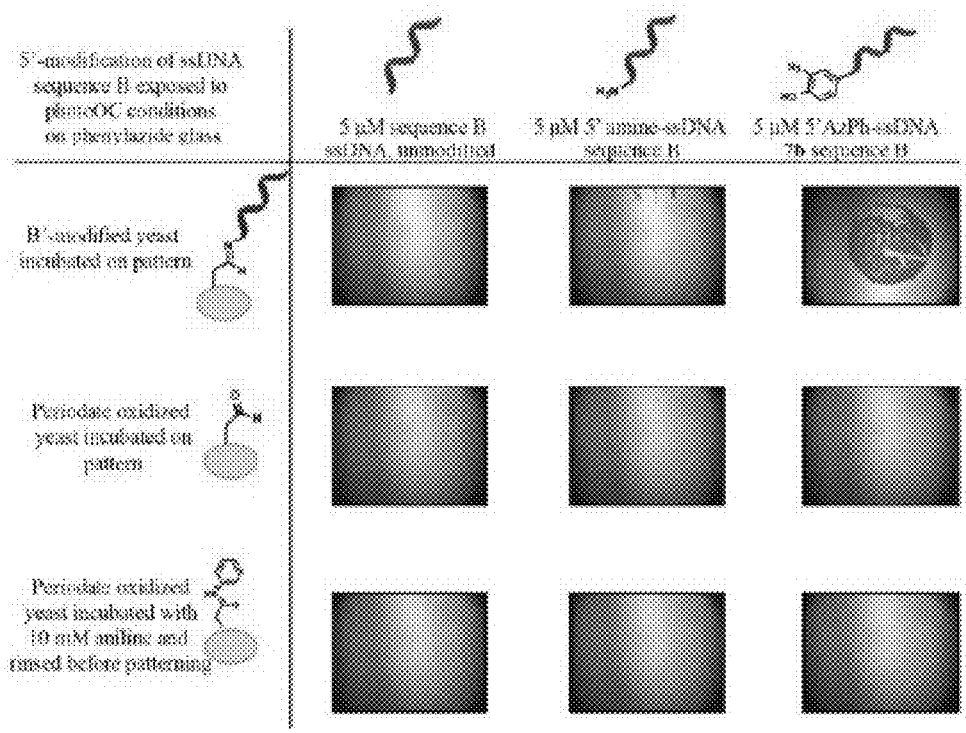
FIGS. 20A and 20B shows more images of S. cerevisiae labeled with two different ssDNA sequences, distinguished by different fluorophore labeling, patterned on 2 sequence photopatterns on aniline glass. Patterns were blocked with 1% BSA for a minimum of 30 minutes. The high background binding due to blue (A)3 60mer-modified yeast is believed to be due to need for longer rinsing to thoroughly remove the CTAC-7b DNA film, which appears to be especially sticky and difficult to remove from the aniline surface when spin casting films of the CTAC-7b (A')5 100mer DNA. Current variations on blocking and washing methods are being explored to reduce the background and increase rinsing efficiency.
Figure 20B:
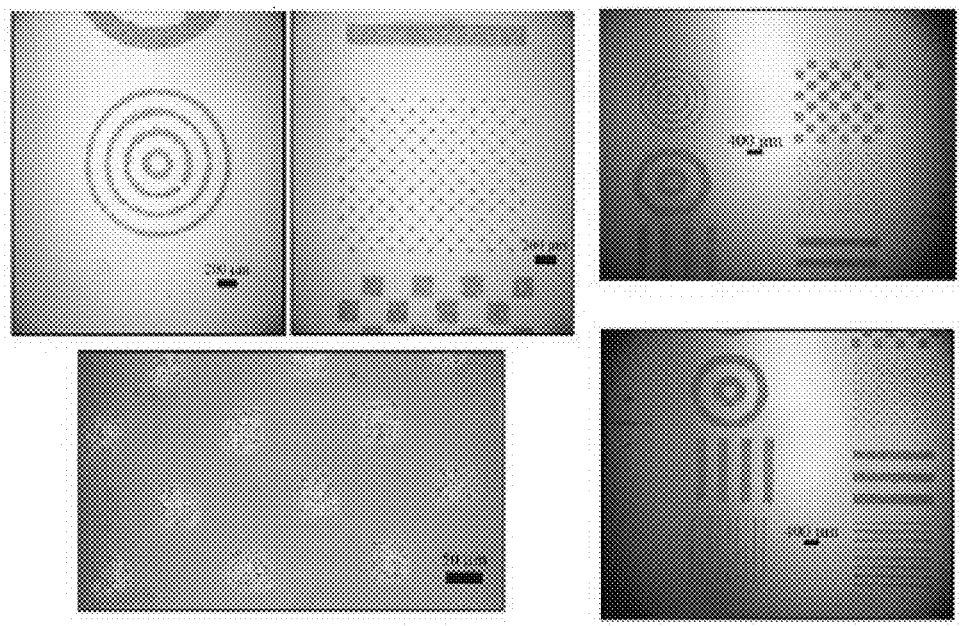
Figure 21:
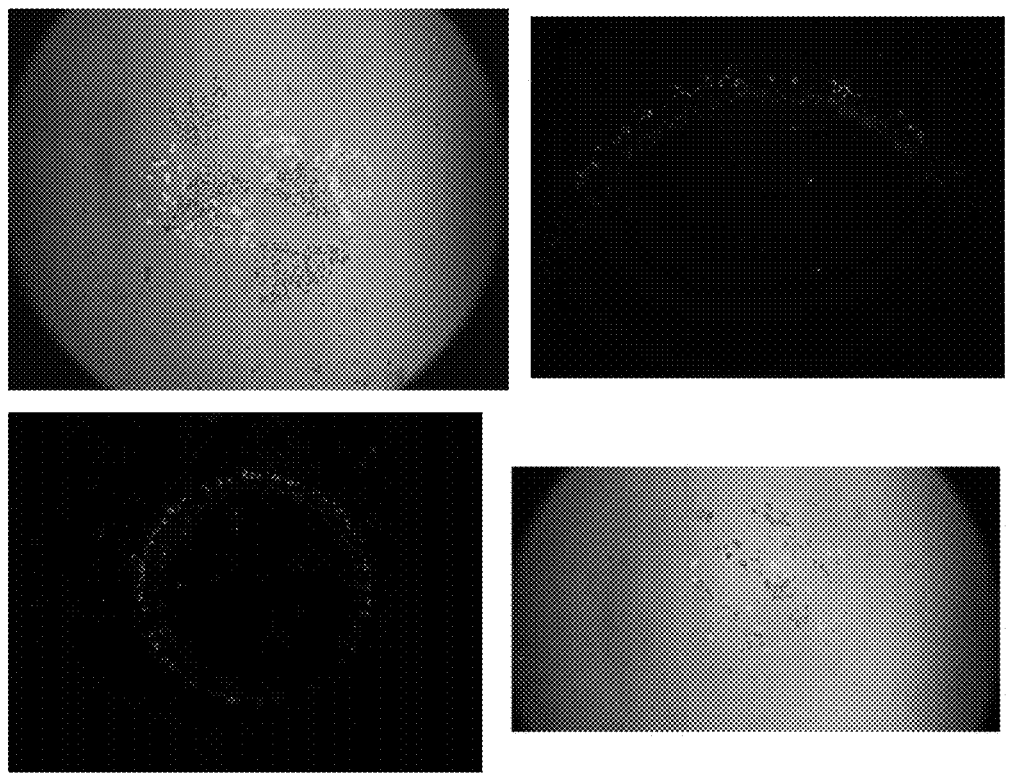
FIG. 21 shows 4× images of 3 unique DNA sequences patterned on phenylazide-coated glass created using UV catalyzed oxidative coupling. These substrates were patterned with A7R5 (green) or HUVEC (blue) cells on the second and third patterned sequences, respectively. These results confirm that the surface remains active for patterning after multiple DNA attachment steps, which is a unique aspect of this approach.

Alternative photopatterning method. It should be noted that prior to TCEP reduction, the phenylazide glass appears to react chemoselectively with 7e only in the presence of UV light, according to the controls in FIG. 20. Further characterization of this reaction is needed but it appears to demonstrate reduced background binding by DNA-modified yeast. This is believed to potentially due to the more hydrophilic surface of phenylazide glass demonstrated by a lower contact angle of ~33-35°.

Although the foregoing invention has been described in some detail by way of illustration and example for purposes of clarity of understanding, one of skill in the art will appreciate that certain changes and modifications may be practiced within the scope of the appended claims. In addition, each reference provided herein is incorporated by reference in its entirety to the same extent as if each reference was individually incorporated by reference. Where a conflict exists between the instant application and a reference provided herein, the instant application shall dominate.

What is claimed is:

1. A method for preparing a covalent linked structure of Formula II:

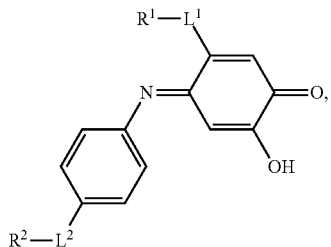

wherein the method comprises:
exposing a reaction mixture to ultraviolet radiation to produce the covalent linked structure of Formula II, wherein the reaction mixture comprises a reactive component and a functionalized surface, wherein the reactive component functionalized surface are each independently selected from the group consisting of:

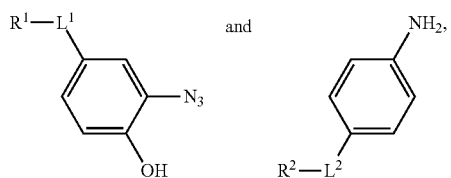

and
wherein
R$^1$ and R$^2$ and each independently selected from the group consisting of a surface, a polypeptide, a protein, and oligonucleotide, and antibody, a capsid, or a combination thereof,
wherein one of R$^1$ and R$^2$ is the surface, and wherein one of R$^1$ and R$^2$ is selected from the group consisting of the polypeptide, the protein, the oligonucleotide, the antibody, the capsid, or a combination thereof, and
L$^1$ and L$^2$ are each independently linking groups.

2. The method of claim 1, comprising:
a) contacting the surface with a functionalizing agent under conditions sufficient to form the functionalized surface;
b) depositing a layer comprising the reactive component on top of the functionalized surface to provide the reaction mixture,
wherein the reactive component comprises the structure of Formula I,

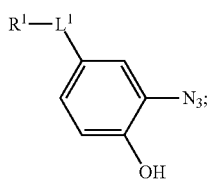

and
c) exposing the reaction mixture to ultraviolet radiation to produce the covalently linked structure of Formula II

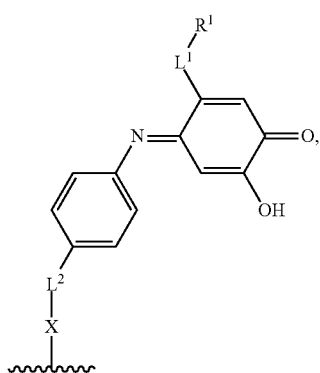

wherein
X is a binding group attached directly to the surface;
R$^1$ comprises the polypeptide, the protein, the oligonucleotide, the antibody, the capsid, or a combination thereof; and
L$^1$ and L$^2$ are each independently linking groups comprising from one to fifteen carbon atoms, and optionally substituted with one to three heteroatoms selected from the group consisting of oxygen, nitrogen, and sulfur.

3. The method of claim 2, wherein the surface is a glass surface.

4. The method of claim 2, wherein the functionalizing agent comprises the structure

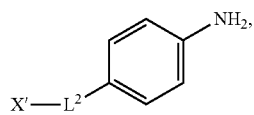

and the functionalized surface comprises the structure:

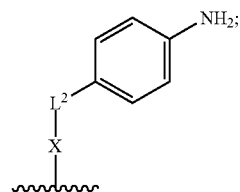

wherein
X' is absent or an activated binding group.

5. The method of claim 4, wherein the functionalizing agent comprises the structure

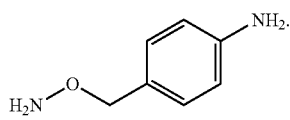

6. The method of claim 4, wherein the functionalizing agent is present in a mixture comprising ethanol and aqueous acetate buffer.

7. The method of claim 2, wherein the functionalizing agent comprises the structure

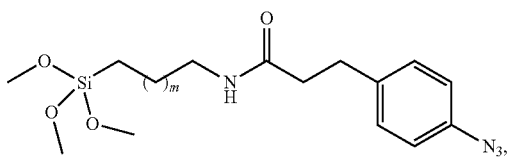

and the functionalized surface comprises the structure

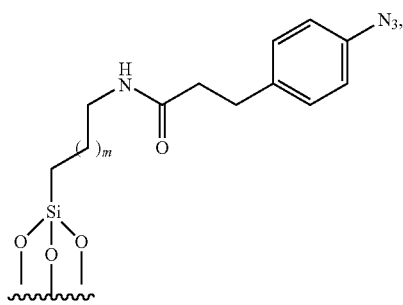

wherein m is an integer from 1 to 3.

8. The method of claim 7, wherein the functionalized surface is further treated with an aqueous solution comprising tris-(2-carboxyethyl)phosphine (TCEP) prior to depositing the layer of the reactive component, to form the functionalized surface:

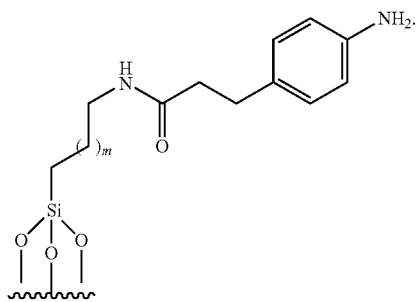

9. The method of claim 2, wherein $L^1$ comprises the structure

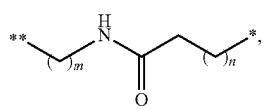

wherein
n is an integer from 1 to 3;
m is an integer from 5 to 8;
wherein * represents the attachment point to

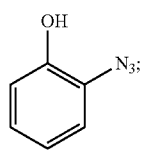

and
wherein ** represents the attachment point of $R^1$.

10. The method of claim 9, wherein $R^1$ comprises an oligonucleotide selected from the group consisting of DNA and RNA.

11. The method of claim 10, wherein $R^1$ comprises ssDNA.

12. The method of claim 2, wherein the reactive component is present in a solution of water and methanol.

13. The method of claim 2, wherein the method further comprises:
    adding methanol to the reaction mixture prior to exposing the reaction mixture to ultraviolet radiation; and
    distributing the methanol on the surface.

14. The method of claim 13, wherein the distributing is performed by spin coating.

15. The method of claim 2, wherein the method further comprises contacting the reaction mixture with a mask containing at least one region that is transparent to ultraviolet radiation.

16. The method of claim 2, wherein the method comprises:
    a) contacting the surface with the functionalizing agent having the structure

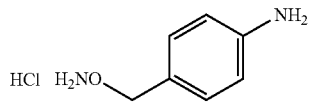

in a solution comprising ethanol and aqueous acetate buffer to provide the functionalized surface comprising the structure:

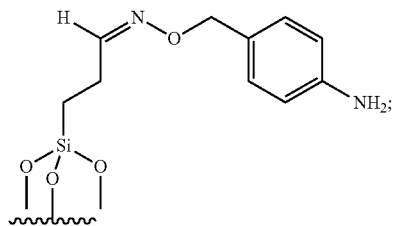 [SMILES: *O[Si](CC/C=N\OCc1ccc(N)cc1)(OC)OC]

b) depositing the reactive component in a solution of water and methanol on top of the functionalized surface to provide a thin film of the reaction mixture,
wherein the reactive component comprises a structure of Formula III, (Formula III)

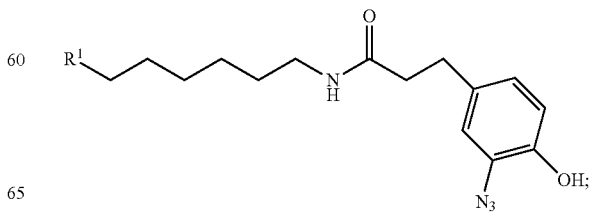

and c) exposing the reaction mixture to ultraviolet radiation to produce a structure of Formula IV:

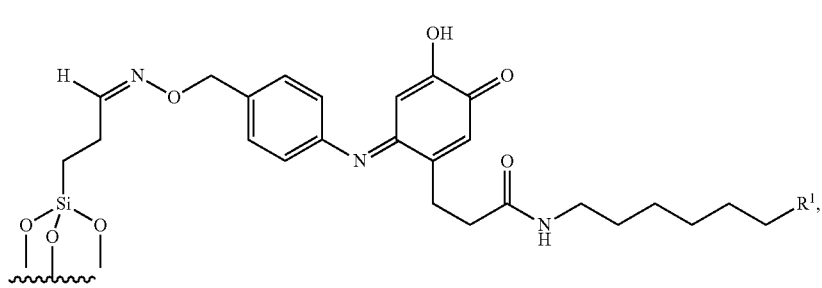
(Formula IV)

wherein R¹ is 5'-TGT GTG TGT GTG TGT GTG TG-3'.

17. The method of claim 2, wherein the method comprises:

a) contacting the surface with a functionalizing agent having the structure

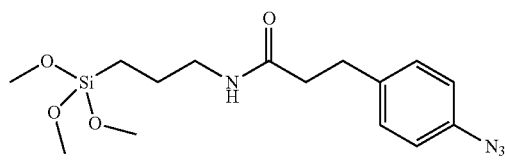 [SMILES: CO[Si](CCCNC(=O)CCc1ccc(N=[N+]=[N-])cc1)(OC)OC]

in a solution comprising ethanol, water, and acetic acid to provide the functionalized surface comprising the structure:

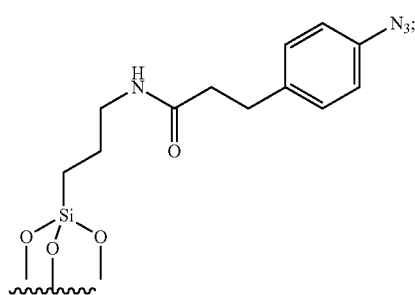 [SMILES: *O[Si](CCCNC(=O)CCc1ccc(N=[N+]=[N-])cc1)(OC)OC]

treating the functionalized surface with an aqueous solution comprising tris-(2-carboxyethyl)phosphine (TCEP) to provide the functionalized surface comprising the structure

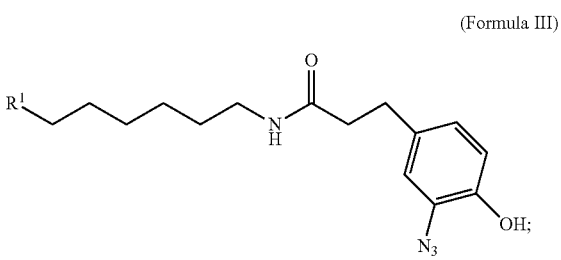

b) depositing the reactive component in a solution of water and methanol on top of the functionalized surface to provide a thin film of the reaction mixture, wherein the reactive component comprises a structure of Formula III, (Formula III)

and c) exposing the reaction mixture to ultraviolet radiation to produce a structure of Formula V (Formula V)

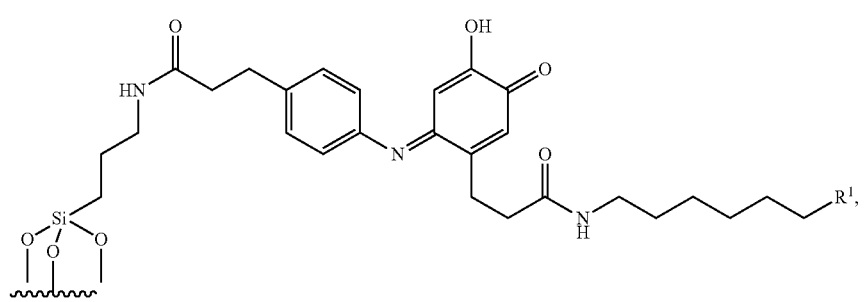

wherein R¹ is 5'-TGT GTG TGT GTG TGT GTG TG-3'.

18. A method of photochemical coupling, comprising:
shining ultraviolet radiation on a mixture comprising a compound of Formula I

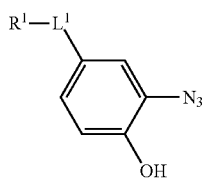 (Formula I)

and at least one compound having the structure

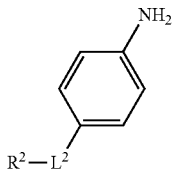

under conditions suitable to produce a compound of Formula II,

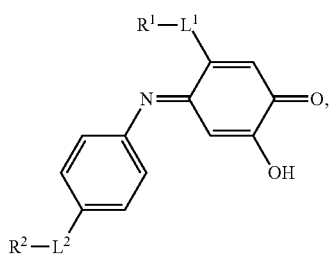 (Formula II)

wherein
$R^1$ and $R^2$ are each independently selected from the group consisting of H, a polypeptide, a protein, an oligonucleotide, an antibody, a capsid, or a combination thereof, wherein at least one of $R^1$ and $R^2$ is selected from the group consisting of a polypeptide, a protein, an oligonucleotide, an antibody and a capsid; and $L^1$ and $L^2$ are each independently absent or a group having from one to fifteen carbon atoms, and optionally substituted with one to three heteroatoms selected from the group consisting of oxygen, nitrogen, and sulfur.

19. The method of claim 18, wherein $L^1$ comprises the structure

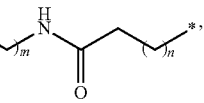

wherein
n is an integer from 1 to 3;
m is an integer from 5 to 8;
wherein * represents the attachment point to

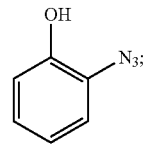

and
wherein ** represents the attachment point of $R^1$.

* * * * *

SEQUENCE LISTING

<160> NUMBER OF SEQ ID NOS: 5

<210> SEQ ID NO 1
<211> LENGTH: 20
<212> TYPE: DNA
<213> ORGANISM: Artificial Sequence
<220> FEATURE:
<223> OTHER INFORMATION: synthetic oligonucleotide
<220> FEATURE:
<221> NAME/KEY: misc_feature
<222> LOCATION: (1)..(1)
<223> OTHER INFORMATION: 5' end linked to a moeity

<400> SEQUENCE: 1
tgtgtgtgtg tgtgtgtgtg                                              20

<210> SEQ ID NO 2
<211> LENGTH: 20
<212> TYPE: DNA
<213> ORGANISM: Artificial Sequence
<220> FEATURE:
<223> OTHER INFORMATION: synthetic oligonucleotide
<220> FEATURE:
<221> NAME/KEY: misc_feature
<222> LOCATION: (1)..(1)
<223> OTHER INFORMATION: 5' end linked to a moeity

<400> SEQUENCE: 2
ccctagagtg agtcgtatga                                              20

<210> SEQ ID NO 3
<211> LENGTH: 43
<212> TYPE: DNA
<213> ORGANISM: Artificial Sequence
<220> FEATURE:
<223> OTHER INFORMATION: synthetic forward sense primer

<400> SEQUENCE: 3
gatatacata tggcttagac cctgtttggt caggtcgttc cgg                    43

<210> SEQ ID NO 4
<211> LENGTH: 40
<212> TYPE: DNA
<213> ORGANISM: Artificial Sequence
<220> FEATURE:
<223> OTHER INFORMATION: synthetic reverse antisense primer

<400> SEQUENCE: 4
cctgaccaaa cagggtctaa gccatatgta tatctccttc                        40

<210> SEQ ID NO 5
<211> LENGTH: 20
<212> TYPE: DNA
<213> ORGANISM: Artificial Sequence
<220> FEATURE:
<223> OTHER INFORMATION: synthetic oligonucleotide
<220> FEATURE:
<221> NAME/KEY: misc_feature
<222> LOCATION: (1)..(1)
<223> OTHER INFORMATION: 5' linked to 5-carboxyfluorescein

<400> SEQUENCE: 5
cacacacaca cacacacaca                                              20